United States Patent
Benkley, III et al.

(10) Patent No.: US 10,776,600 B2
(45) Date of Patent: Sep. 15, 2020

(54) ELECTRONIC SENSOR SUPPORTED ON RIGID SUBSTRATE

(71) Applicant: IDEX ASA, Fornebu (NO)

(72) Inventors: Fred G. Benkley, III, Andover, MA (US); David N. Light, Los Gatos, CA (US); David Rodney Baker, Tewksbury, MA (US); Thomas Gaudette, Chiangmai (TH)

(73) Assignee: IDEX Biometrics ASA, Oslo (NO)

( * ) Notice: Subject to any disclaimer, the term of this patent is extended or adjusted under 35 U.S.C. 154(b) by 344 days.

(21) Appl. No.: 15/946,337

(22) Filed: Apr. 5, 2018

(65) Prior Publication Data
US 2018/0232554 A1    Aug. 16, 2018

Related U.S. Application Data

(63) Continuation of application No. 15/354,426, filed on Nov. 17, 2016, now Pat. No. 10,331,934.
(Continued)

(51) Int. Cl.
*G06K 9/00* (2006.01)
*H01L 23/538* (2006.01)
(Continued)

(52) U.S. Cl.
CPC ........ *G06K 9/0002* (2013.01); *H01L 23/5387* (2013.01); *G06F 3/0416* (2013.01); *G06F 2203/04102* (2013.01); *H01L 23/4985* (2013.01)

(58) Field of Classification Search
CPC .............. G06K 9/0002; H01L 23/5387; H01L 23/4985; G06F 3/0416; G06F 2203/04102
See application file for complete search history.

(56) References Cited

U.S. PATENT DOCUMENTS

| 6,950,541 B1 | 9/2005 | Setlak et al. |
| 7,751,601 B2 | 7/2010 | Benkley, III |
| | (Continued) | |

FOREIGN PATENT DOCUMENTS

| TW | 200620505 A | 6/2006 |
| TW | 201346779 A | 11/2013 |
| | (Continued) | |

OTHER PUBLICATIONS

Office Action dated Apr. 27, 2018 issued in Taiwanese Patent Application No. 105137772 (17 pages).
(Continued)

*Primary Examiner* — Wesley J Tucker
(74) *Attorney, Agent, or Firm* — Rothwell, Figg, Ernst & Manbeck, P.C.

(57) ABSTRACT

A sensor assembly comprises a rigid substrate with a circuit subassembly wrapped therearound. The circuit subassembly includes a flexible substrate with conductive traces and interconnects formed thereon, and when wrapped around the rigid substrate, the conductive traces may overlap one another so as to form capacitive sensor elements. The interconnects connect the conductive traces to one or more components, such as a printed circuit board attached to a portion of the flexible substrate. The sensor assembly maybe installed in an opening formed in a host device panel of a host device, such as a smart phone, with the sensor assembly optionally peripherally surrounded by a spacer frame, and covered by a cover element. The circuit subassembly may include a host connector tab for electrically connecting the sensor assembly to electrical components of a host device.

20 Claims, 32 Drawing Sheets

Related U.S. Application Data

(60) Provisional application No. 62/374,339, filed on Aug. 12, 2016, provisional application No. 62/349,256, filed on Jun. 13, 2016, provisional application No. 62/258,284, filed on Nov. 20, 2015.

(51) Int. Cl.
*H01L 23/498* (2006.01)
*G06F 3/041* (2006.01)

(56) References Cited

U.S. PATENT DOCUMENTS

| | | |
|---|---|---|
| 8,224,044 B2 | 7/2012 | Benkley, III |
| 8,421,890 B2 | 4/2013 | Benkley, III |
| 8,866,347 B2 | 10/2014 | Benkley, III |
| 8,867,799 B2 | 10/2014 | Benkley, III |
| 9,030,440 B2 | 5/2015 | Pope et al. |
| 9,152,838 B2 | 10/2015 | Wickboldt et al. |
| 9,177,191 B2 | 11/2015 | Benkley, III |
| 9,268,989 B2 | 2/2016 | Pope et al. |
| 9,569,654 B2 | 2/2017 | Benkley, III |
| 2006/0083411 A1* | 4/2006 | Benkley, III ....... G06K 9/00053 382/124 |
| 2011/0019373 A1 | 1/2011 | Ryhanen et al. |
| 2012/0242635 A1 | 9/2012 | Erhart et al. |
| 2013/0108124 A1 | 5/2013 | Wickboldt et al. |
| 2013/0259329 A1* | 10/2013 | Wickboldt ............ G06F 1/1626 382/124 |
| 2013/0279769 A1 | 10/2013 | Benkley, III |
| 2014/0103943 A1 | 4/2014 | Dunlap et al. |
| 2015/0091588 A1 | 4/2015 | Wickboldt et al. |
| 2015/0187707 A1 | 7/2015 | Lee et al. |
| 2016/0055365 A1* | 2/2016 | Benkley, III ......... G06K 9/0002 382/124 |
| 2016/0131505 A1 | 5/2016 | Rao et al. |
| 2016/0188951 A1 | 6/2016 | Benkley, III |
| 2016/0267313 A1 | 9/2016 | Pope et al. |
| 2017/0261830 A1 | 9/2017 | Luten et al. |

FOREIGN PATENT DOCUMENTS

| | | |
|---|---|---|
| WO | 2013155224 A1 | 10/2013 |
| WO | 2016060201 A1 | 4/2016 |
| WO | 2016060202 A1 | 4/2016 |

OTHER PUBLICATIONS

Notice of Allowance dated Feb. 15, 2019 issued in related U.S. Appl. No. 15/354,426 (23 pages).

International Search Report and Written Opinion issued in International Patent Application No. PCT/IB2016/056939, 16 pages (dated May 12, 2017).

Invitation to Pay Additional Fees issued in International Patent Application No. PCT/IB2016/056939, 7 pages (dated Mar. 16, 2017).

International Preliminary Report on Patentability dated May 31, 2018 issued in International Application No. PCT/IB2016/056939 (9 pages).

* cited by examiner

ELECTRONIC SENSOR SUPPORTED ON RIGID SUBSTRATE

CROSS REFERENCE OF RELATED APPLICATION

This application claims the benefit under 35 U.S.C. § 120 of the filing date of non-provisional patent application Ser. No. 15/354,426 filed Nov. 17, 2016, which claims the benefit under 35 U.S.C. § 119(e) of the filing date of provisional patent application Ser. Nos. 62/258,284 filed Nov. 20, 2015, 62/349,256 filed Jun. 13, 2016, and 62/374,339 filed Aug. 12, 2016, the respective disclosure(s) of which is(are) incorporated herein by reference.

FIELD OF THE DISCLOSURE

This disclosure describes sensors for sensing objects located near or about the sensor, such as fingerprint sensors, and methods and assemblies for incorporating such sensors into panels of host devices.

BACKGROUND

In the electronic sensing market, there are a wide variety of sensors for sensing objects at a given location. Such sensors are configured to sense detectable and/or measurable characteristics of an object in order to sense presence of an object near or about the sensor and other features and characteristics of the object being sensed. Such "sense characteristics" may include a variety of detectable characteristics, such as electronic, electromagnetic, ultrasonic, thermal, optical, etc. characteristics.

Sensors may be configured to passively detect characteristics of an object, by measuring parameters such as temperature, weight, or various emissions such as photonic, magnetic or atomic emissions of an object in close proximity or contact with the sensor. An example of this is a non-contact infrared thermometer that detects the black body radiation spectra emitted from an object, from which its temperature can be computed.

Other sensors work by directly exciting an object with a stimulus such as voltage or current, then using the resultant signal to determine the physical or electrical characteristics of an object. An example of this is a fluid detector consisting of two terminals, one that excites the medium with a voltage source, while the second measures the current flow to determine the presence of a conductive fluid, such as water.

Other sensors operate by capacitance and include an arrangement of electrodes that form an array of capacitive elements. For example, certain fingerprint sensors comprise a first group of conductors (e.g., conductive traces or lines) arranged in a side-by-side configuration and a second group of conductors (e.g., conductive traces or lines) arranged in a side-by-side configuration, wherein the second group of conductors transversely overlaps the first group of conductors and is separated from the first group of conductors by a dielectric. A capacitive sensing element is formed at each overlap, and the impedance at each overlap is sensitive to the nature of an object contacting or nearby the sensing element.

Recent efforts have been made to incorporate sensors into flat panels of host devices. For example, efforts have been made to incorporate capacitive finger print sensors into devices such as smart phones and tablet computers by incorporating that sensor into a glass panel, such as a display and/or interface panel of the device. Such sensors should be dimensionally stable so that they do not expand or contract differentially with respect to the glass panel, and the panel should have a smooth, continuous outer surface, even in the vicinity of the sensor. In addition, it is a challenge to incorporate the conductive sensing elements and interconnecting conductors in a small portion of a continuous panel, which may be necessary to fabricate a cost-effective sensor.

SUMMARY

The following presents a simplified summary in order to provide a basic understanding of some aspects described herein. This summary is not an extensive overview of the claimed subject matter. It is intended to neither identify key or critical elements of the claimed subject matter nor delineate the scope thereof. Its sole purpose is to present some concepts in a simplified form as a prelude to the more detailed description that is presented later.

Aspects of the disclosure are embodied in a sensor assembly comprising a rigid substrate having opposed first and second surfaces; a flexible substrate; first conductive traces disposed on a first part of the flexible substrate; second conductive traces disposed on a second part of the flexible substrate; first interconnects disposed on the flexible substrate, each first interconnect being connected to an associated one of the first conductive traces; and second interconnects disposed on the flexible substrate, each second interconnect being connected to an associated one of the second conductive traces.

According to further aspects the first conductive traces are generally parallel to one another, the second conductive traces are generally parallel to one another, and the first conductive traces are oriented transversely to the second conductive traces.

According to further aspects the first interconnects and a part of the flexible substrate on which the first interconnects are disposed extend around a first edge of the rigid substrate and overlie a portion of the second surface of the rigid substrate, and the second interconnects and a part of the flexible substrate on which the second interconnects are disposed extend around a second edge of the rigid substrate and overlie a portion of the second surface of the rigid substrate.

According to further aspects the conductive traces and the conductive interconnects comprise conductive material formed, etched, deposited, or printed onto or embedded into the flexible substrate.

According to further aspects the conductive material comprises a material selected from the group of materials consisting of copper, tin, silver, or gold.

According to further aspects the rigid substrate has the shape of a rectangular block, a square block, or a cubic block.

According to further aspects the opposed first and second surfaces of the rigid substrate are flat, and the rigid substrate includes rounded first and second ends.

According to further aspects the flexible substrate is configured to conform in size and shape to the rigid substrate when the flexible substrate is wrapped around the rigid substrate.

According to further aspects the first conductive traces overlying the first surface of the rigid substrate and the second conductive traces overlying the first conductive traces and the first surface of the rigid substrate form a sensor surface, and the sensor surface has a flatness of 5 μm or less.

According to further aspects the opposed first and second surfaces of the rigid substrate are flat and the first and second edges of the rigid substrate are rounded.

According to further aspects the parts of the flexible substrate extending around the first and second edges of the rigid substrate are in contact with the first and second edges of the rigid substrate.

According to alternative aspects the parts of the flexible substrate extending around the first and second edges of the rigid substrate form service loops that are not in contact with the first and second edges of the rigid substrate.

According to further aspects the rigid substrate is made from glass or ceramic.

According to further aspects the rigid substrate comprises two separate pieces bonded together.

According to further aspects the flexible substrate is made from a dielectric material.

According to further aspects the flexible substrate is a polymer-based material.

According to further aspects the flexible substrate has a modulus of elasticity of between 0.2 and 20 GPa.

According to further aspects the flexible substrate has a modulus of elasticity of between 2 and 9 GPa.

According to further aspects the sensor assembly further comprises a circuit element disposed on the flexible substrate between the first and second parts of the flexible substrate. The first interconnects are configured to connect the first conductive traces to the circuit element, the second interconnects are configured to connect the second conductive traces to the circuit element, and the circuit element and the part of the flexible substrate on which the circuit element is disposed overlie the second surface of the rigid substrate.

According to further aspects the sensor assembly further comprises host connector tabs for connecting the sensor assembly to a host device.

According to further aspects the connector tabs comprise conductive connector pads formed on a part of the flexible substrate and conductive host connector interconnects connected to the connector pads.

According to further aspects the flexible substrate is secured to the rigid substrate by an adhesive, and the second part of the flexible substrate is secured to the first part of the flexible substrate by an adhesive.

According to further aspects the adhesive comprises one or more materials selected from the group consisting of: pressure sensitive adhesive, B-staged sheet adhesive, bond ply adhesive, acrylic-based thermoset adhesives, high modulus of elasticity/highly cross-linked, epoxy-type thermoset adhesives, adhesive with particle fillers to increase the modulus of elasticity of the adhesive, and adhesives with filler materials having high dielectric constants.

Additional aspects of the disclosure are embodied in an assembly comprising a host device panel; a sensor assembly comprising a rigid substrate with opposed first and second surfaces and sensor elements disposed at the first surface thereof, wherein the sensor assembly is disposed within a cutout formed in the host device panel; and a cover panel disposed over the cutout and the sensor assembly so as to enclose the sensor assembly within the cutout.

According to further aspects the cutout is formed partially through the host device panel.

According to further aspects the cutout is formed completely through the host device panel.

According to further aspects a top surface of the cover panel is flush with a top surface of the host device panel.

According to further aspects a top surface of the cover panel is recessed with respect to a top surface of the host device panel.

According to further aspects a top surface of the cover panel protrudes above a top surface of the host device panel.

According to further aspects the host device panel and the cover panel are made from glass.

According to further aspects the sensor assembly further comprises a flexible substrate and the sensor elements comprise electrically conductive traces disposed on the flexible substrate, and the sensor assembly further comprises electrically conductive interconnects connected to the conductive traces. The conductive traces and a part of the flexible substrate on which the conductive traces are disposed overlie at least a portion of the first surface of the rigid substrate, and the interconnects and a part of the flexible substrate on which the interconnects are disposed extend around an edge of the rigid substrate and overlie at least a portion of the second surface of the rigid substrate.

According to further aspects the assembly comprises a recessed shelf formed in the host device panel around the perimeter of the cutout, and the cover panel is seated in the shelf, the shape of the shelf corresponds to the shape of the cover panel, and the depth of the shelf corresponds to the thickness of the cover panel.

According to further aspects the cutout has a shape conforming to a shape of the sensor assembly.

According to further aspects the assembly comprises a spacer frame with an outer perimeter having a shape corresponding to a shape of the cutout and an inner perimeter having a shape corresponding to a shape of the sensor assembly, and the spacer frame is disposed within the cutout and the sensor assembly is disposed within the spacer frame.

According to further aspects, the cover panel is disposed within the inner perimeter of the spacer frame According to further aspects the assembly comprises a recessed shelf formed in the spacer frame around the inner perimeter thereof, and the cover panel is seated on the shelf of the spacer frame, the shape of the shelf corresponds to the shape of the cover panel, and the depth of the shelf corresponds to the thickness of the cover panel.

According to further aspects the cover panel is disposed on top of the spacer frame.

According to further aspects the assembly comprises a bevel formed in the spacer frame around the inner perimeter thereof.

According to further aspects the cover panel is beveled about an outer perimeter thereof.

According to further aspects the cover panel is secured to the sensor assembly by an adhesive.

According to further aspects the adhesive comprises one or more materials selected from the group consisting of: pressure sensitive adhesive, B-staged sheet adhesive, bond ply adhesive, acrylic-based thermoset adhesives, high modulus of elasticity/highly cross-linked, epoxy-type thermoset adhesives, adhesive with particle fillers to increase the modulus of elasticity of the adhesive, and adhesives with filler materials having high dielectric constants.

According to further aspects the cutout is formed completely through the host device panel, the spacer frame comprises a lower peripheral shelf extending laterally outwardly from a lower side of the spacer frame, and the lower peripheral shelf abuts a lower surface of the host device panel.

According to further aspects the spacer frame is made from one or more materials selected from the group consisting of: a machinable or moldable plastic, liquid crystal polymers, Polybutylene Terephthalate (PBT), conductive polymers, polymers with carbon or graphite filler, silicone-based materials, polymer foams, silicone foams, conductive thermoplastic or thermosetting molding compounds, conductive foams, and conductive silicones.

According to further aspects the conductive traces of the assembly comprise first conductive traces disposed on a first part of the flexible substrate and second conductive traces disposed on a second part of the flexible substrate.

According to further aspects the first conductive traces of the assembly are generally parallel to one another, the second conductive traces are generally parallel to one another, and the first conductive traces are oriented transversely to the second conductive traces.

According to further aspects the interconnects of the assembly comprise first interconnects associated with the first conductive traces and second interconnects associated with the second conductive traces, the first interconnects and a part of the flexible substrate on which the first interconnects are disposed extend around a first edge of the rigid substrate and overlie a portion of the second surface of the rigid substrate, and the second interconnects and a part of the flexible substrate on which the second interconnects are disposed extend around a second edge of the rigid substrate and overlie a portion of the second surface of the rigid substrate.

According to further aspects the assembly comprises a circuit element disposed on the flexible substrate, the interconnects are configured to connect the conductive traces to the circuit element, and the circuit element and the part of the flexible substrate on which the circuit element is disposed overlie the second surface of the rigid substrate.

According to further aspects the circuit element is located generally in the center of the flexible substrate; the first and second conductive traces are disposed on opposite ends of the flexible substrate with respect to the circuit element; and the first and the second conductive interconnects are disposed on the flexible substrate. The first interconnects connect the first conductive traces to the circuit element and the second interconnects connect the second conductive traces to the circuit element. The flexible substrate is wrapped around the rigid substrate so that the circuit element is disposed on the second surface of the rigid substrate, and the first and second interconnects extend from the second surface of the rigid substrate around opposite edges of the rigid substrate onto the first surface of the rigid substrate where the first and second conductive traces overlap to form a sensing array above the first surface of the rigid substrate.

Additional aspects of the disclosure are embodied in a sensor assembly comprising a rigid substrate having opposed first and second surfaces; a flexible substrate having opposed first and second surfaces; first conductive traces disposed on a first part of the first surface of the flexible substrate; second conductive traces disposed on the second surface of first part of the flexible substrate; and a circuit element disposed on a second part of the flexible substrate. The circuit element is disposed on the first surface of the second part of the flexible substrate, and the first and second conductive traces are electrically connected to the circuit element. The flexible substrate is wrapped around the rigid substrate with the second surface of the first and second parts of the flexible substrate facing the first and second surfaces, respectively, of the rigid substrate, the first part of the flexible substrate and the first and second conductive traces disposed thereon overlie the first surface of the rigid substrate, and the second part of the flexible substrate and the circuit element disposed thereon overlie the second surface of the rigid substrate.

According to further aspects the first conductive traces are generally parallel to one another, the second conductive traces are generally parallel to one another, and the second conductive traces are oriented transversely to the first conductive traces.

According to further aspects the sensor assembly comprises a conductive interconnect associated with each of the first and second conductive traces and connecting each of the first and second conductive traces to the circuit element.

According to further aspects the first part of the flexible substrate and the first and second conductive traces disposed thereon overlying the first surface of the rigid substrate form a sensor surface, and wherein the sensor surface has a flatness of 5 µm or less.

According to further aspects a part of the flexible substrate on which at least a portion of the interconnects is disposed extends around an edge of the rigid substrate between the first and second surfaces in a service loop that is not in contact with the edge.

According to further aspects the sensor assembly comprises vias extending through the flexible substrate between the first and second surfaces thereof, and at least a portion of the conductive interconnects associated with the second conductive traces extend through the vias from the second surface of the flexible substrate to the first surface of the flexible substrate.

According to further aspects the conductive traces and the conductive interconnects comprise conductive material formed, etched, deposited, or printed onto or embedded into the flexible substrate.

According to further aspects the conductive material comprises a material selected from the group of materials consisting of copper, tin, silver, or gold.

According to further aspects the rigid substrate has the shape of a rectangular block, a square block, or a cubic block.

According to further aspects the opposed first and second surfaces of the rigid substrate are flat, and wherein the rigid substrate includes rounded first and second ends.

According to further aspects the flexible substrate is configured to conform in size and shape to the rigid substrate when the flexible substrate is wrapped around the rigid substrate.

According to further aspects the opposed first and second surfaces of the rigid substrate are flat and the first and second edges of the rigid substrate are rounded.

According to further aspects the rigid substrate is made from glass or ceramic.

According to further aspects the rigid substrate comprises two separate pieces bonded together.

According to further aspects the flexible substrate is made from a dielectric material.

According to further aspects the flexible substrate is a polymer-based material.

According to further aspects the flexible substrate has a modulus of elasticity of between 2 and 9 GPa.

According to further aspects the flexible substrate has a modulus of elasticity of between 0.2 and 20 GPa.

According to further aspects the sensor assembly comprises a host connector tab for connecting the sensor assembly to a host device.

According to further aspects the host connector tab comprises: a portion of the flexible substrate extending from the rigid substrate; conductive interconnects disposed on the extending portion of the flexible substrate; and a connector plug disposed on one side of the extending portion of the flexible substrate, and the conductive interconnects extend from the circuit element to the connector plug.

According to further aspects the sensor assembly comprises a stiffener disposed on a surface of the extending portion of the flexible substrate opposite the connector plug.

Additional aspects of the disclosure are embodied in a sensor assembly comprising: a rigid substrate having opposed first and second surfaces; a flexible substrate having opposed first and second surfaces; first conductive traces disposed on a first part of the flexible substrate and formed on the first surface of the first part of the flexible substrate, second conductive traces disposed on the first part of the flexible substrate and formed on the second surface of first part of the flexible substrate, and a circuit element disposed on a second part of the flexible substrate. The first conductive traces are generally parallel to one another, the second conductive traces are generally parallel to one another, and the second conductive traces are oriented transversely to the first conductive traces. The first and second conductive traces are electrically connected to the circuit element. The flexible substrate is at least partially wrapped around the rigid substrate with the second surface of the first part of the flexible substrate facing the first surface of the rigid substrate, the first part of the flexible substrate and the first and second conductive traces disposed thereon overlie the first surface of the rigid substrate, and the second part of the flexible substrate with the circuit element disposed thereon extends from the rigid substrate.

Additional aspects of the disclosure are embodied in an electronic device comprising: a host device panel configured to provide interface and/or display functionality; a fingerprint sensor disposed within a recess or opening formed in the host device panel, and a cover panel disposed over the fingerprint sensor. The fingerprint sensor comprises rigid substrate having opposed first and second surfaces; and flexible circuit subassembly at least partially wrapped around the rigid substrate so as to overlie the first and second surfaces. The flexible circuit subassembly comprises a flexible substrate having opposed first and second surfaces and first and second conductive traces formed on one or both of the first and second surfaces of the flexible substrate. The first and second conductive traces are configured so that when the flexible circuit subassembly is wrapped around the rigid substrate, the first and second conductive traces are oriented transversely to each other and are separated from each other by a layer of the flexible substrate.

According to further aspects the electronic device comprises a mobile phone, a smart phone, a desktop computer, a laptop/notebook computer, a tablet computer, or a thin client device.

Other features and characteristics of the subject matter of this disclosure, as well as the methods of operation, functions of related elements of structure and the combination of parts, and economies of manufacture, will become more apparent upon consideration of the following description and the appended claims with reference to the accompanying drawings, all of which form a part of this specification, wherein like reference numerals designate corresponding parts in the various figures.

BRIEF DESCRIPTION OF THE DRAWINGS

The accompanying drawings, which are incorporated herein and form part of the specification, illustrate various, non-limiting embodiments of the present disclosure. In the drawings, common reference numbers indicate identical or functionally similar elements.

DETAILED DESCRIPTION

Figure 1:
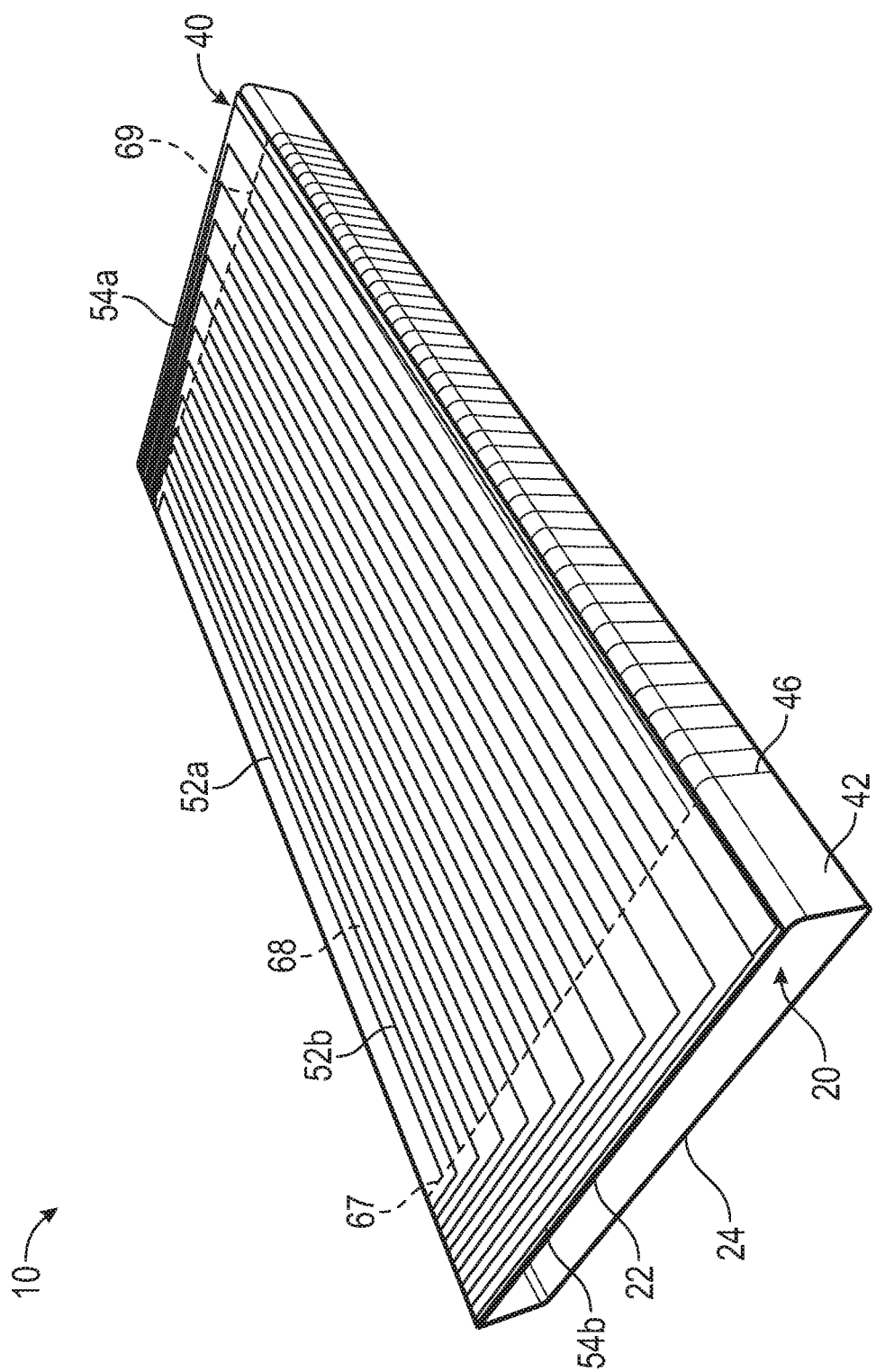
FIG. 1 is a top perspective view of an embodiment of a sensor assembly.

While aspects of the subject matter of the present disclosure may be embodied in a variety of forms, the following description and accompanying drawings are merely intended to disclose some of these forms as specific examples of the subject matter. Accordingly, the subject matter of this disclosure is not intended to be limited to the forms or embodiments so described and illustrated.

Unless defined otherwise, all terms of art, notations and other technical terms or terminology used herein have the same meaning as is commonly understood by one of ordinary skill in the art to which this disclosure belongs. All patents, applications, published applications and other publications referred to herein are incorporated by reference in their entirety. If a definition set forth in this section is contrary to or otherwise inconsistent with a definition set forth in the patents, applications, published applications, and other publications that are herein incorporated by reference, the definition set forth in this section prevails over the definition that is incorporated herein by reference.

Unless otherwise indicated or the context suggests otherwise, as used herein, "a" or "an" means "at least one" or "one or more."

This description may use relative spatial and/or orientation terms in describing the position and/or orientation of a component, apparatus, location, feature, or a portion thereof. Unless specifically stated, or otherwise dictated by the context of the description, such terms, including, without limitation, top, bottom, above, below, under, on top of, upper, lower, left of, right of, in front of, behind, next to, adjacent, between, horizontal, vertical, diagonal, longitudinal, transverse, radial, axial, etc., are used for convenience in referring to such component, apparatus, location, feature, or a portion thereof in the drawings and are not intended to be limiting.

Furthermore, unless otherwise stated, any specific dimensions mentioned in this description are merely representative of an exemplary implementation of a device embodying aspects of the disclosure and are not intended to be limiting.

The use of the term "about" applies to all numeric values, whether or not explicitly indicated. This term generally refers to a range of numbers that one of ordinary skill in the art would consider as a reasonable amount of deviation to the recited numeric values (i.e., having the equivalent function or result) in the context of the present disclosure. For example, and not intended to be limiting, this term can be construed as including a deviation of ±10 percent of the given numeric value provided such a deviation does not alter the end function or result of the value. Therefore, under some circumstances as would be appreciated by one of ordinary skill in the art a value of about 1% can be construed to be a range from 0.9% to 1.1%.

As used herein, the terms "substantially" and "substantial" refer to a considerable degree or extent. When used in conjunction with an event, circumstance, relationship, or characteristic the terms can refer to instances in which the event, circumstance, relationship, or characteristic occurs precisely as well as instances in which the event, circumstance, relationship, or characteristic occurs to a close approximation, such as accounting for typical tolerance levels or variability of the embodiments described herein.

As used herein, the terms "optional" and "optionally" mean that the subsequently described event, circumstance, characteristic, structure, component, etc. may or may not occur and that the description includes instances where the event or circumstance occurs and instances in which it does not.

The present disclosure relates to a sensor assembly for detecting proximally located objects. In an embodiment, the sensor is a fingerprint sensor that detects surface features (e.g., ridges and valleys) of a finger placed on a sensing surface of the sensor assembly. In an embodiment, the sensor assembly operates based on interaction between a group of elements that may include drive element(s) and pickup element(s). In an embodiment, the pickup elements may be coupled to the drive elements to sense a signal from the drive elements that ultimately arrives at the pickup elements. In an embodiment in which the sensor is a fingerprint sensor, the sensor assembly can detect whether a particular location on the sensor surface is directly under a ridge of the fingerprint or is directly under a valley of the fingerprint.

In an embodiment, the sensor assembly is an electronic sensor. In an embodiment, the sensor assembly is a fingerprint sensor that detects surface features (e.g., ridges and valleys) of a finger placed on a sensing surface of the sensor assembly. In an embodiment, the electronic sensor operates based on interaction between a pair of electrodes that include a drive element and a pickup element. In an embodiment, the pickup element may be capacitively coupled to the drive element to sense an electronic signal that passes from the drive element to the pickup element.

Other sensor embodiments may operate on the principle of signal reflectance whereby a transmission signal (e.g., an ultrasonic signal or an infrared signal) is directed at an object, a reflected signal is captured and characterized, and features and characteristics of the object, such as surface features (e.g., fingerprint ridges and valleys) are determined based on characteristics of the captured signal.

Features of a proximally located object can be detected based on whether the sensor detects a change in a signal being received at the pickup element. In an embodiment in which the electronic sensor is a fingerprint sensor, the sensor can detect whether a particular location on the sensor surface is directly under a ridge of the fingerprint or is directly under a valley of the fingerprint. Ridges of a fingerprint generally provide a relatively lower-impedance path to a ground potential through the human body than the corresponding valleys of the fingerprint. Thus, if a fingerprint ridge contacts a pickup element, it may noticeably attenuate a signal being detected at the pickup element. If the pickup element is instead directly under a valley of the fingerprint, the signal being detected at the pickup element generally will have less attenuation. The electronic sensor in the embodiment can thus distinguish between a fingerprint ridge and a fingerprint valley based on the signal detected at the pickup element.

In an embodiment, the electronic sensor forms a grid to detect surface features of a proximally located object at a plurality of locations. The grid includes a plurality of conductive drive traces, or lines, which are each connectable to a drive source capable of producing a single frequency, multitoned frequency or binary sequence of pulses of fixed or variable amplitude, and a plurality of conductive pickup traces, or lines, oriented transversely (preferably substantially perpendicular) to the drive lines. The drive lines are preferably substantially parallel to each other, and the pickup lines are preferably substantially parallel to each other. The drive lines are separated from the pickup lines by an insulating (e.g., dielectric) layer. In various embodiments, the insulating dielectric layer separating the drive lines from the pickup lines comprises an adhesive material, comprises more than one insulating dielectric layer, comprises more than one insulating dielectric layer, wherein one of the insulating dielectric layers is an adhesive layer, or comprises more than one flexible, insulating dielectric layer, wherein one of the layers is an adhesive layer. In an embodiment, the insulating dielectric layer or layers separating the drive lines from the pickup lines are of substantially uniform thickness.

Each drive line may thus be capacitively coupled to a pickup line through a dielectric layer. In the embodiment, the drive lines can form one axis (e.g., X-axis) of the grid, while the pickup lines form another axis (e.g., Y-axis) of the grid. Each location where a drive line and a pickup line overlap may form an impedance-sensitive electrode pair whereby the overlapping portions of the drive and pickup lines form opposed plates of a capacitor separated by a dielectric layer or layers. This impedance-sensitive electrode pair may be treated as a pixel (e.g., an X-Y coordinate) at which a surface feature of the proximally located object is detected. The grid forms a plurality of pixels that can collectively create a map of the surface features of the proximally located object. For instance, the pixels of the grid can map locations where there are ridge and valley features of the finger surface touching the electronic sensor. The map can be used as an identifying pattern to match with ridge/valley patterns stored in a database. Additional details of a fingerprint sensor with overlapping drive lines and pickup lines as well as the drive, sense, and scanning electronics, are discussed in U.S. Pat. No. 8,421,890, entitled "Electronic imager using an impedance sensor grid array and method of making," and U.S. Pat. No. 8,866,347, entitled "Biometric sensing", the respective disclosures of which are incorporated by reference in their entirety. Further improvements and enhancements to the devices, methods, and circuitry used to improve the sensitivity of the measurement principal employing a sensor grid comprised of overlapping drive lines and pickup lines separated by a dielectric including the drive, sense, scanning, and noise reduction electronics, are described in U.S. patent application Ser. No. 14/582,359, entitled "Fingerprint Sensor Employing an Integrated Noise Rejection Structure" the disclosure of which is incorporated by reference in its entirety.

In an embodiment, the sensor grid may comprise pickup lines and conductive drive vias, the vias being arranged on a grid, such as a square grid, with each pickup line overlapping multiple drive vias, the drive vias being separated from the pickup lines by a first insulating dielectric layer, and the pickup lines being in contact with a first surface of a first insulating dielectric layer. In the embodiment, the conductive drive vias form a conductive path from a first surface of a second dielectric layer to a second surface of the second dielectric layer. The first surface of the second dielectric layer is located proximal to the second surface of the first insulating dielectric layer. The drive vias are electrically connected to drive lines or a drive plane located on the second surface of the second dielectric layer.

In one embodiment, the sensor grid may comprise sensor elements (e.g., drive lines and pickup lines, or drive vias and pickup lines) located on one or more substrates, such as for example a flexible substrate that can be folded over on itself to form a grid array with separate sensor lines oriented transversely to each other and a portion of the flexible substrate forming the dielectric between the lines. Crossover locations of different sensor lines create sensing locations for gathering information of the features and/or characteristics of an object, such as the patterns of ridges and valleys of a fingerprint for example.

In one embodiment, the sensor grid may comprise sensor elements located on separate substrates that are electrically interconnected to each other directly or through another distinct substrate (e.g., through interconnection to a semiconductor package substrate containing the appropriate electronic elements for the functioning of the sensor). In the embodiment, the separate substrates may be electrically interconnected with a separable connector, or with a soldering process, or with a conductive adhesive, or by other means commonly known by one skilled in the art.

In one embodiment, the drive lines and pickup lines are not electrically intersecting or connected in a manner in which they would conduct with each other; they form an impedance sensing electrode pair with a separation that allows the drive lines to project an electrical field and the pickup lines to receive an electrical field, eliminating the need for distinct electrode structures. The two lines crossing with interspersed dielectric separating the lines intrinsically creates an impedance sensing electrode pair. Thus, the sensor is configured to activate two one-dimensional sensor lines to obtain one pixel of information that identifies features and/or characteristics of an object.

Thus, a sensor device described herein can utilize the intrinsic impedance sensing electrode pair formed at the crossings between the drive and pickup elements, such as drive lines and pickup lines or drive vias and pickup lines or a combination of drive lines and vias and pickup lines. In operation, an electric field emitted by each drive element (e.g., drive line and/or drive via) may be further focused by grounding drive and pickup elements near or about the area being sensed by the particular crossover location at one time. This limits interference that may occur if other drive and pickup elements were sensing electric fields simultaneously. More than one electrode pair may be sensed simultaneously. However, where resolution is an important factor, it may be preferred to avoid sensing electrode pairs that are too close to each other to avoid interference and maintain accuracy in sensing object features at a particular resolution. For purposes of this description, "intrinsic electrode pair" refers to the use of the impedance sensing electrode pairs that are formed at each of the drive and pickup element crossover locations.

In one example, the sensor lines may include drive lines on one layer and pickup lines on another layer, where the layers are located over each other in a manner that allows the separate sensor lines, the drive and pickup lines, to cross over each other to form impedance sensing electrode pairs at each crossover location. These crossover locations provide individually focused electrical pickup locations or pixels, or electrode pairs where a number of individual data points of features and/or characteristics of an object can be captured. The high degree of field focus is due to the small size of the intrinsic electrode pairs, as well as the high density of the neighboring ground provided by the inactive plates. A flexible substrate may have a second substrate configured with logic or processor circuitry for sending and receiving signals with the sensor lines to electronically capture information related to the object.

In operation, a selected drive line is activated, with a voltage source for example, and a selected pickup line is connected to a receiving circuit, such as an amplifier/buffer circuit, so that the resulting electric field emitted by the active drive line can be captured by the active pickup line. An electric field extends from the drive line to the pickup line through the intermediate dielectric insulating layer. If an object is present, some or all of the electric field may be absorbed by the object, changing the manner in which the electric field is received by the pickup line. This changes the resulting signal that is captured and processed by the pickup line and receiving circuit, and thus is indicative of the presence of an object, and the features and characteristics of the object may be sensed and identified by processing the signal to determine the relative amount the received signal is changed at each crossover location (i.e., pixel). This processing may be done by some form of logic or processing circuitry.

In other embodiments, the signal driving the drive line may be a complex signal, a varying frequency, binary sequence and/or amplitude, or other signal. This would enable a sensor to analyze the features and/or characteristics of an object from different perspectives utilizing a varying or complex signal. The signal may include simultaneous signals of different frequencies and/or amplitudes that would produce resultant signals that vary in different manners after being partially or fully absorbed by the object, indicating different features and characteristics of the object. The signal may include different tones, signals configured as chirp ramps, and other signals. Processing or logic circuitry may then be used to disseminate various information and data points from the resultant signal.

In operation, the varying or complex signal may be applied to the drive line, and the pickup line would receive the resulting electric field to be processed. Logic or processing circuitry may be configured to process the resulting signal, such as separating out different frequencies if simultaneous signals are used, so that features and/or characteristics of the object may be obtained from different perspectives.

Given the grid of pixels that can be activated at individual pairs, each pixel may be captured in a number of ways. In one embodiment, a drive line may be activated, and pickup lines crossing over the active drive lines may be turned on and off in a sequence to capture a line of pixels. This sequencing may operate as a scanning sequence. Here a first drive line is activated by connecting it to a signal source, and then one pickup line at a time is connected to capture circuitry, such as amplifier/buffer circuitry, the information from the pixel formed at the crossing of the two lines is captured, and then the pickup line is disconnected and connected to ground potential. Then, a next pixel is processed in sequence, then another, then another, until the entire array of pickup lines crossing the active drive line is processed. The drive line is then deactivated, and another drive line is activated, and the pickup lines are again scanned with this active drive line by connecting them to the capture circuitry. These may be done one at a time in sequence, several non-adjacent pixels may be processed simultaneously, or other variations are possible for a given application. After the grid of pixels is processed, then a rendering of object information will be possible.

In one embodiment, the substrate may be for example a flexible polymer based substrate. One example is a polyimide film, such as, DuPont Kapton® tape, which is widely used in flexible circuits such as those used in printer cartridges and other devices, or Ube Upilex®. Another example is a polyester film, such as Mylar®, which is widely used in low cost flexible printed circuits. The package may include such a flexible substrate, where the drive lines may be located on one side of the substrate, and the pickup lines may be located on an opposite side of the substrate.

The drive lines may be generally orthogonal in direction with respect to the pickup lines, and may be substantially perpendicular to the pickup lines. According to one embodiment, a device may be configured with drive lines and pickup lines located on or about opposite sides of an insulating dielectric substrate, where the combination of these three components provides capacitive properties. The drive lines may be activated to drive an electric field onto, into or about an object.

In this description, including descriptions of embodiments and examples, there will be references to the terms parallel, perpendicular, orthogonal and related terms and description. It is not intended, nor would it be understood by those skilled in the art, that these descriptions are at all limiting. To the contrary, the embodiments extend to various orientations and configurations of the drive lines, the pickup lines, the substrate or related structure, and also various combinations and permutations of components, their placement, distance from each other, and order in different assemblies of a sensor. Though the embodiment is directed to a sensor configured with plurality of drive and pickup lines that generally cross over each other at a pixel location and are configured to detect presence and other features and characteristics of a nearby object, the embodiment is not limited to any particular configuration or orientation, but is only limited to the appended claims, their equivalents, and also future claims submitted in this and related applications and their equivalents.

Also, reference will be made to pickup traces, drive traces, pickup lines, pickup plates, drive lines, drive plate, and the like, but it will be understood that the various references to traces, lines, or plates may be used interchangeably and do not limit the embodiment to any particular form, geometry, cross-sectional shape, varying diameter or cross-sectional dimensions, length, width, height, depth, or other physical dimension of such components. Also, more sophisticated components may be implemented to improve the performance of a device configured according to the embodiment, such as for example small 65, 45, 32 or 22 nanometer conduction lines or carbon nano-tubes that may make an assembly more easily adapted to applications where small size and shape as well as low power are desired characteristics and features. Those skilled in the art will understand that such dimensions can vary in different applications, and even possibly improve the performance at a lower power consumption in some applications, without departing from the spirit and scope of the embodiment.

Reference will also be made to traces and sensor lines, such as sensor drive lines or traces and sensor pickup lines or traces, and their orientation amongst themselves and each other. For example, there will be described substantially parallel drive lines. These drive lines are intended to be described as parallel conductive lines made up of a conductive material, such as copper, tin, silver, nickel, aluminum, or gold or alloys thereof, formed, etched, deposited, plated, or printed onto a substrate. Those skilled in the art will understand that, with the inherent imperfections in most any manufacturing process, such conductive lines are seldom "perfect" in nature, and are thus not exactly parallel in practice. Therefore, they are described as "substantially parallel." Different applications may configure some of the sensor lines even non-parallel, such that the lines may occur parallel for a portion of the line, and the line may necessarily deviate from parallel in order to connect with other components for the device to operate, or in order to be routed on or about the substrate on which it is formed or traced. Similarly, the separate array of lines may be described as orthogonal or perpendicular, where the drive lines are substantially orthogonal or perpendicular to the pickup lines. Those skilled in the art will understand that the various lines may not be perfectly perpendicular to each other, and they may be configured to be off-perpendicular or otherwise crossed-over in different angles in particular applications. They also may be partially perpendicular, where portions of drive lines may be substantially perpendicular to corresponding portions of pickup lines, and other portions of the different lines may deviate from perpendicular in order to be routed on or about the substrate or to be connected to other components for the device to operate.

The drive lines and pickup lines may be controlled by one or more processors to enable the transmission of the signal to an object via the drive lines, to receive a resultant signal from an object via the pickup lines, and to process the resultant signal to define an object image. One or more processors may be connected in one monolithic component, where the drive lines and pickup lines are incorporated in a package that includes the processor. In another embodiment, the drive lines, pickup lines and substrate may be assembled in a package by itself, where the package can be connected to a system processor that controls general system functions.

In another embodiment, a sensor may be configured to drive signals at different frequencies since the impedance of most objects, especially human tissue and organs, will greatly vary with frequency. In order to measure complex impedance at one or more frequencies of a sensed object, the receiver must be able also to measure phase as well as amplitude. In one embodiment, the resulting signal generated from a given impedance sensing electrode pair may result from varying frequencies, known in the art as frequency hopping, where the receiver is designed to track a random, pseudo-random or non-random sequence of frequencies. A variation of this embodiment could be a linear or non-linear frequency sweep known as a chirp. In such an embodiment one could measure the impedance of a continuous range of frequencies very efficiently.

A sensor assembly as disclosed herein comprises a flexible sensor subassembly wrapped around a substantially rigid substrate. The sensor subassembly includes a flexible substrate on which sensor elements are disposed. In embodiments described herein, the sensor subassembly comprises a circuit subassembly in which the flexible substrate comprises a flexible dielectric substrate, which may be a polymer-based substrate, such as Kapton® or Upilex®, and the sensor elements comprise a plurality of conductive traces made of a suitable conductive material, such as copper, tin, silver, nickel, aluminum, or gold are formed, etched, deposited, plated, printed, or otherwise applied to or embedded into the flexible substrate. In an embodiment, the sensor elements include a plurality of first conductive traces disposed on or embedded in a first part of the flexible substrate and a plurality of second conductive traces disposed on or embedded in a second part of the flexible substrate. The first conductive traces are arranged side-by-side preferably without contacting one another and may be generally parallel with each other. Similarly, the second conductive traces are arranged side-by-side preferably without contacting one another and may be generally parallel to one another. The first conductive traces are oriented transversely to the second conductive traces and may be generally perpendicular thereto.

In other sensor subassemblies contemplated herein, the sensor elements may comprise, ultrasonic, thermal, optical, etc. sensors disposed on a suitable flexible substrate and configured to be wrapped around a rigid or substantially rigid substrate.

The rigid substrate includes first and second opposed, planar surfaces. The circuit subassembly is wrapped around the rigid substrate such that the first conductive traces and a portion of the flexible substrate on which the first conductive traces are located form a first layer overlying the first surface of the rigid substrate and the second conductive traces and a portion of the flexible substrate on which the second conductive traces are located form a second layer that overlies the first layer. The first and second layers overlie one another so that the first conductive traces are oriented transversely to the second conductive traces and may, in various embodiments, be generally perpendicular thereto, and so that the first conductive traces are separated from the second conductive traces by at least one layer of the flexible substrate. Each location where a second conductive trace overlaps an underlying first conductive trace forms an impedance-sensitive electrode pair that may be treated as a pixel.

In various embodiments, a circuit subassembly may further include a circuit element, such as a controller chip (also referred to as a driver chip), which may comprise an integrated circuit, such as an application specific integrated circuit, or ASIC, or a discrete electronic circuit, mounted to the flexible substrate and connected to the first conductive traces by first trace interconnects and connected to the second conductive traces by second trace interconnects. The ASIC may embody a signal source element configured to generate a voltage or current signal source, switch elements for electively connecting the signal source to each trace of the first or second traces, buffer(s) and amplifier(s), and switch elements for selectively connecting each trace of the other of the first or second traces to the buffer(s) and amplifier(s) whereby the buffer(s) and amplifier(s) generate a signal indicative of a characteristic, such as the magnitude, of an electric field captured by a trace selectively connected to the trace.

In one embodiment, the circuit element, the first and second conductive traces, and the first and second trace interconnects are disposed on a first side of the flexible substrate, and the flexible circuit subassembly is wrapped around the rigid substrate so that the first side of the flexible substrate, as well as the circuit element, traces, and interconnects disposed therein face outwardly from the rigid substrate. In an alternate embodiment, the circuit element is disposed on and interconnected to the first side of the flexible substrate subsequent to the wrapping of the flexible substrate around the rigid substrate. In an alternate embodiment, the circuit element, the first and second conductive traces, and the first and second trace interconnects are disposed on a first side of the flexible substrate, and the flexible subassembly is wrapped around the rigid substrate so that the first side of the flexible substrate, as well as the circuit element, traces, and interconnects disposed therein face inwardly toward the rigid substrate. In this alternate embodiment, a pocket or cutout can be formed in one surface of the rigid substrate that receives the circuit element.

In an alternate embodiment, the first and second conductive traces, and the first and second trace interconnects are disposed on a first side of the flexible substrate, and the circuit element is disposed on a second substantially opposing side of the flexible substrate. The flexible substrate is wrapped around the rigid substrate so that the first side of the flexible substrate, as well as the traces and interconnects disposed therein face inwardly toward the rigid substrate. The circuit element on the second side of the flexible substrate is electrically connected to the first and second trace interconnects through openings in the flexible dielectric substrate, such as holes or vias. In various embodiments, the holes or vias formed in the flexible substrate may correspond spatially to interconnection terminals on the circuit element to facilitate interconnection between the circuit element and the trace interconnects through the flexible substrate using solder, conductive adhesive, wire bonding, or other suitable means.

Specific details of exemplary sensor assemblies are shown in FIGS. 1-4.

Figure 6:
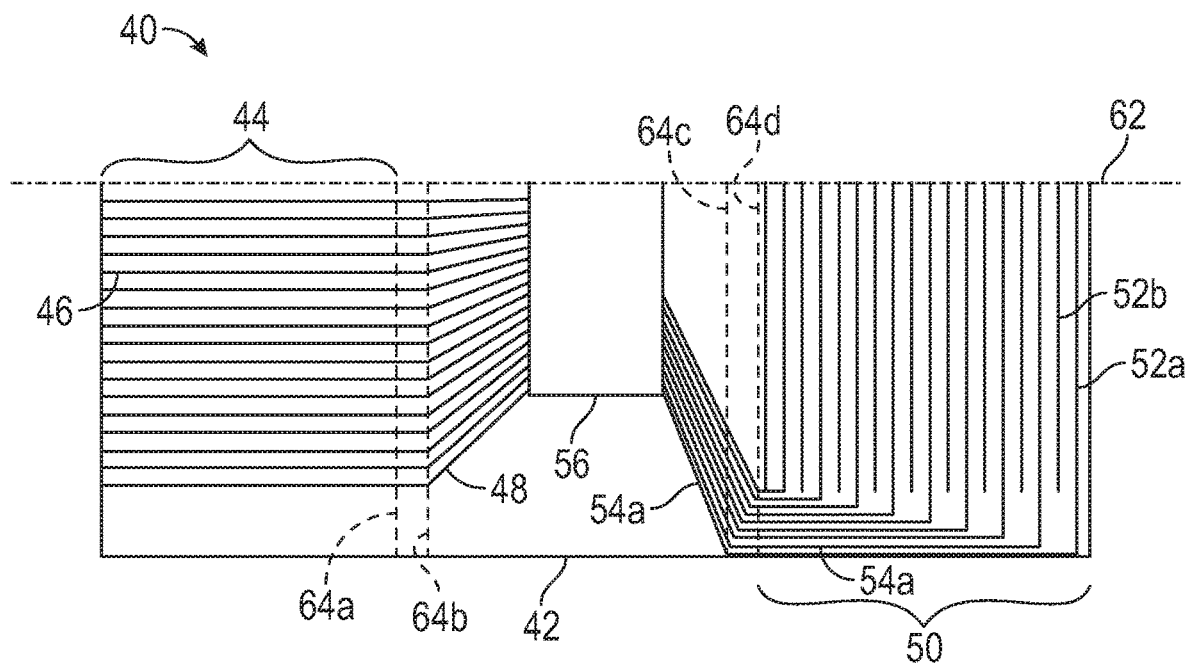
FIG. 6 is a partial top plan view of a flexible circuit subassembly.

FIG. 1 is a top perspective view of an embodiment of a sensor assembly 10. Sensor assembly 10 includes a rigid substrate 20 on which a circuit subassembly 40 is wrapped. As also shown in FIG. 6, circuit subassembly 40 includes a flexible substrate 42, a plurality of first conductive traces 46, and a plurality of second conductive traces 52a, 52b. To avoid cluttering the drawings, only one of the plurality of first traces is labeled with reference number 46, and one each of the plurality second traces is labeled with reference number 52a and 52b. In an embodiment, the second conductive traces 52a, 52b overlie a portion of the first conductive traces 46 on a first (top) surface 22 of the rigid substrate 20—and thus the first conductive traces are visible in FIG. 1 only along one edge of the sensor assembly 10—so as to form a sensor area 68 overlying the top surface 22 (i.e., the area on the upper surface between dashed lines 67 and 69). Accordingly, the first conductive traces 46 and the second conductive traces form sensor elements of the sensor assembly 10 for sensing, e.g., capacitively, an object adjacent to or contact with at least a portion of the sensor area 68.

In an alternate embodiment, the circuit subassembly 40 could be wrapped to that conductive traces 46 overlie conductive traces 52a, 52b.

In another embodiment of the circuit subassembly 40, conductive traces 52a and 52b could be consolidated into one group on one edge of the flexible substrate 42 and not interdigitated In the illustrated embodiment, the rigid substrate has the shape of a rectangular block (or a square or cube), although this should not be considered to be limiting of possible alternative shapes for the rigid substrate.

Figure 2:
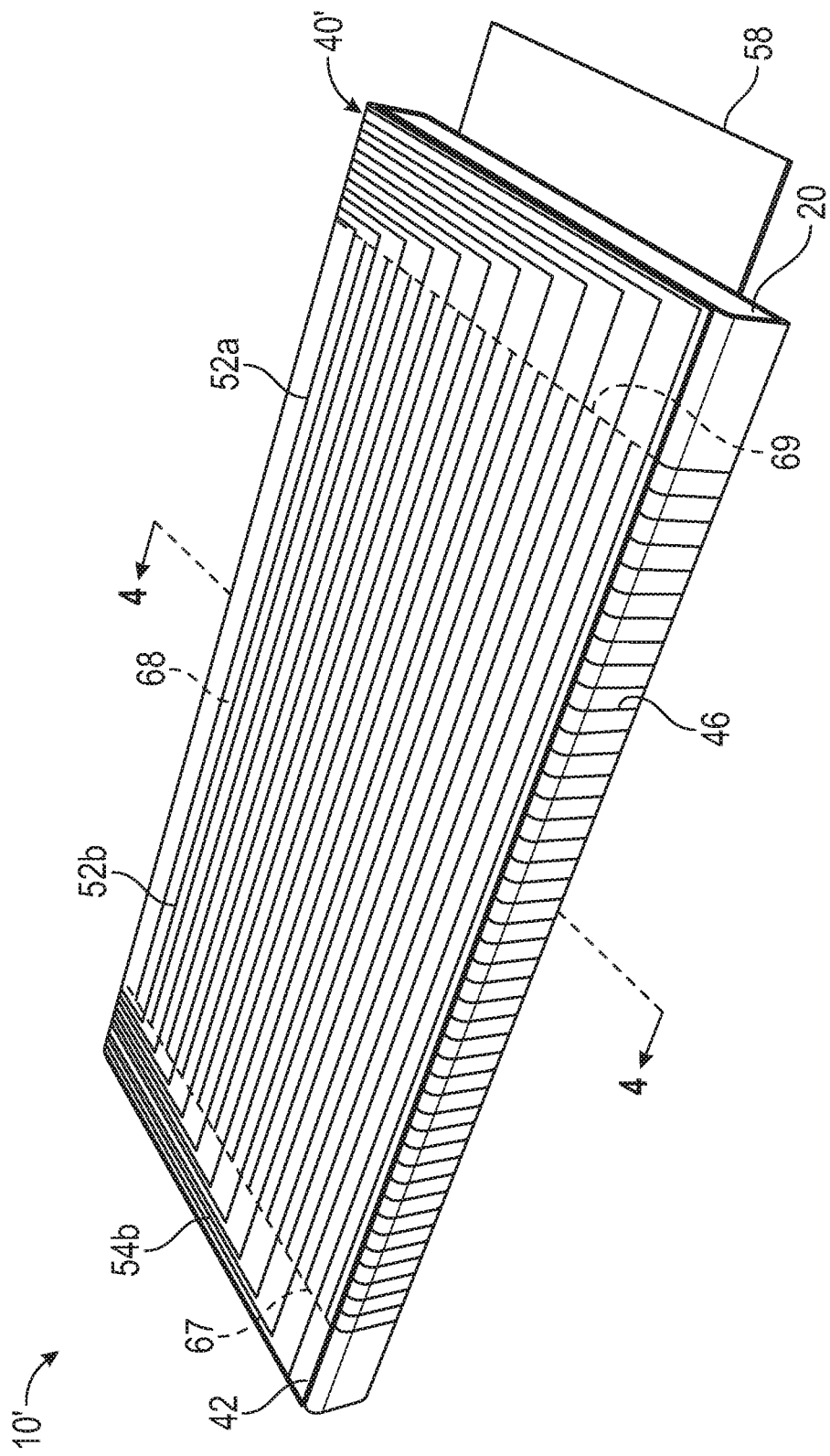
FIG. 2 is a top perspective view of an alternate embodiment of a sensor assembly.

FIG. 2 is a top perspective view of an alternate embodiment of a sensor assembly 10'. Sensor assembly 10' is generally identical to the sensor assembly 10 shown in FIG. 1. One difference between the sensor assembly 10' and the sensor assembly 10 is that the circuit subassembly 40' of sensor assembly 10' additionally includes host connector tabs 58, which extend laterally from an end of the rigid substrate 20 for connecting the sensor assembly 10' to a host device, such as a computer, smart phone, etc. Host connector tab 58 might also be extended with a rigid connector mounted onto it.

In an embodiment host connector tabs 58 may be used to interconnect the sensor assembly to a host using a separable electrical connector. For example, a header of a two-piece, board-to-board connector may be surface mount assembled to the host connector tab 58 and may interconnect to a socket of that two-piece connector mounted on a jumper flex circuit or mounted directly on a printed circuit board, such as the main logic board, of the host device (or, vice versa: the socket of the two-piece connector could be mounted on the host connector tab 58 and the header of the two-piece connector could be mounted on the jumper flex or main logic board). Alternatively, the host connector tabs 58 may comprise gold plated leads which are inserted into and interconnected to a zero insertion force ("ZIF") connector mounted on a flexible or rigid printed circuit in the host device.

For an embodiment of the sensor assembly lacking host connector tabs, the sensor assembly may be electrically connected to the host device by means of connector elements, e.g., connector pads, disposed on the circuit subassembly and outwardly exposed on the sensor assembly.

As shown in FIGS. 1 and 2, in an embodiment of the sensor assembly, the circuit subassembly 40, 40' includes two sets of second trace interconnects, 54*a*, 54*b*. To avoid cluttering the drawings, only one of the second trace interconnects in each set of interconnects is labeled with reference number 54*a* or 54*b*. The second conductive traces 52*a*, 52*b* are alternately connected to one of the second trace interconnects 54*a* or 54*b*, wherein each second conductive trace 52*a* is connected to an associated second trace interconnect 54*a*, and wherein each second conductive trace 52*b* is connected to an associated second trace interconnect 54*b*. Each second conductive trace 52*a* is connected to an associated second trace interconnect 54*a* at a first end thereof, and each second conductive trace 52*b* is connected to an associated second trace interconnect 54*b* at an opposite, second end thereof. By alternating the connections between ends of the second connect conductive traces 52*a*, 52*b*, half of the second trace interconnects 54*a* can be disposed on one end of the sensor assembly 10, 10', and the other half of the second trace interconnects 54*b* can be disposed on an opposite end of the sensor assembly 10, 10'. Splitting the second trace interconnects 54*a*, 54*b* between ends of the sensor assembly allows the sensor area 68 to be generally centered on the sensor assembly 10, 10'. Those skilled in the art will recognize, however, that in alternate embodiments, the second conductive traces 52*a*, 52*b* could be all connected at the same ends to the second trace interconnects.

Figure 3:
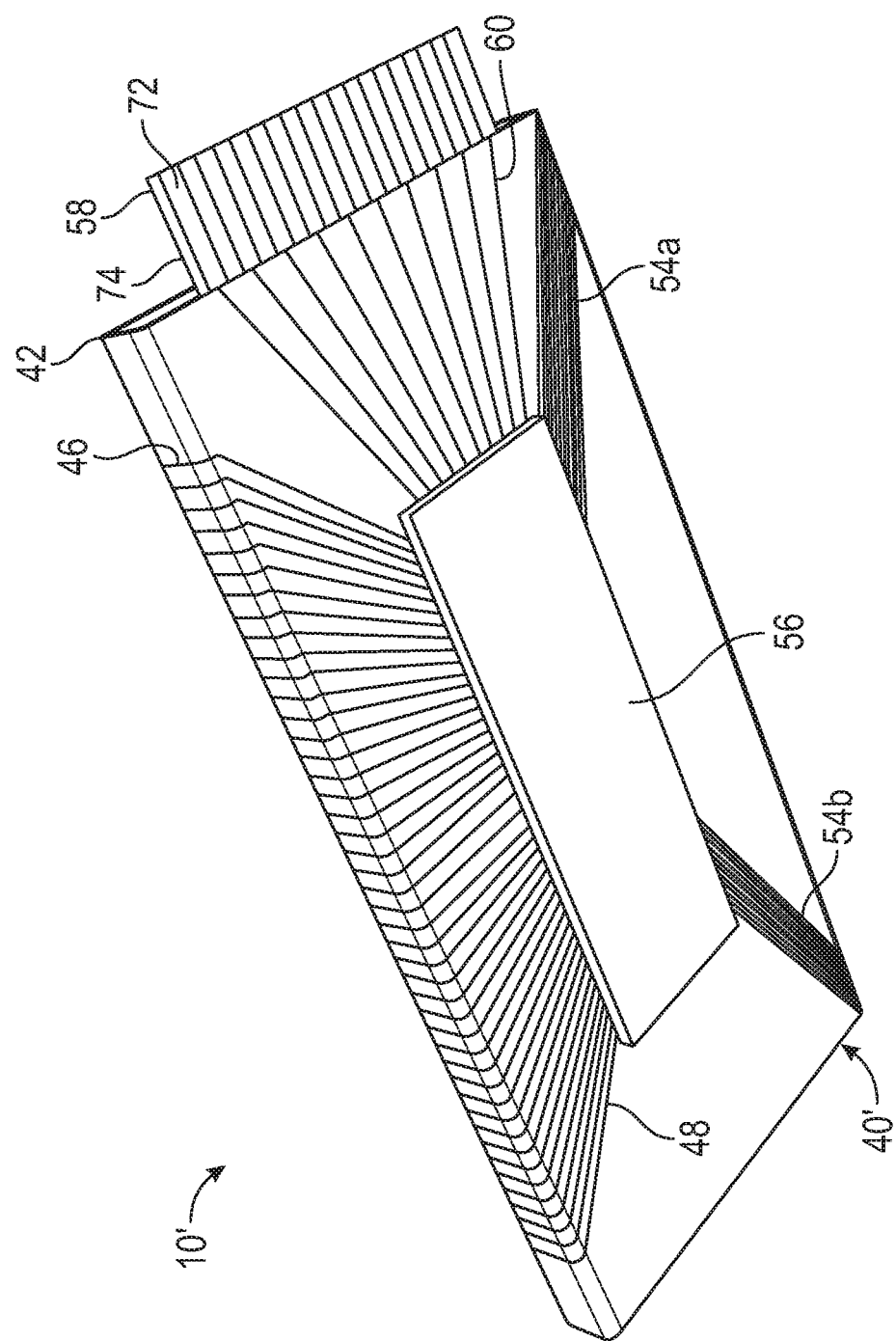
FIG. 3 is a bottom perspective view of the alternate sensor assembly.

FIG. 3 is a bottom perspective view of the sensor assembly 10'. As shown in the figure, the circuit subassembly 40' includes a circuit element 56 disposed on a surface of the rigid substrate 20 opposite the surface on which the first conductive traces 46 and the second conductive traces 52*a*, 52*b* are disposed. Circuit element 56 may be a controller chip (including, e.g., drive electronics, sensing electronics, scanning electronics, noise reduction electronics, as described in U.S. Pat. Nos. 8,421,890, 8,866,347, and U.S. patent application Ser. No. 14/582,359), which may comprise an integrated circuit, such as an application specific integrated circuit, or ASIC, or it may comprise a discrete electronic circuit. Circuit element 56 may be a flip chip mounted onto the flexible substrate 42 by a known chip-on-film ("COF") technique or mounted right side up using traditional chip band wire or TAB bonding techniques. First conductive traces 46 extending around one edge of the rigid substrate 20 are connected to the circuit element 56 by first trace interconnects 48 configured in a converging manner so that the circuit element 56 can be made smaller than the rigid substrate 20. Second trace interconnects 54*a*, 54*b* connect the second conductive traces (not shown in FIG. 3) to the circuit element 56.

The host connector tabs 58 extend from an edge of the flexible substrate 42. Host connector tabs 58 include conductive connector pads 72 connected to the circuit element 56 by connector tab interconnects 60. To avoid cluttering the drawings, only one of connector pads 72 is labeled, and one of the connector tab interconnects 60 is labeled.

In one embodiment, a bottom view of the sensor assembly 10 shown in FIG. 1 would be essentially identical to the view shown in FIG. 3 except that the sensor assembly 10 of FIG. 1 does not include the host connector tabs 58.

In an alternate embodiment, the circuit subassembly 40 does not include a circuit element 56 but instead provides connectors for connecting the traces 46, 52*a*, 52*b* and interconnects 48, 54*a*, 54*b* to remotely-located circuitry, which may comprise a circuit element located in the host device remotely from the sensor assembly.

Figure 5:
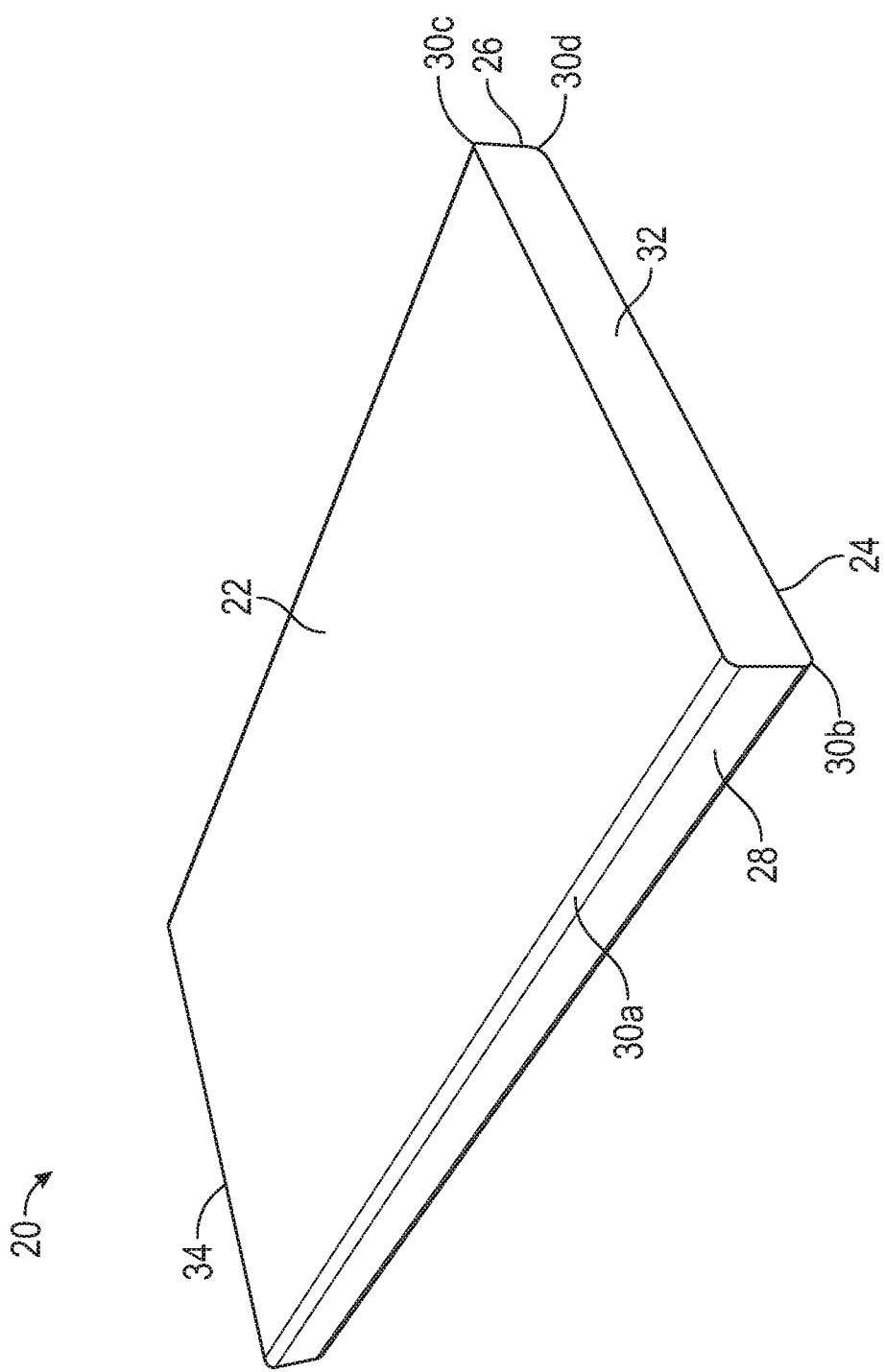
FIG. 5 is a top perspective view of a rigid substrate without the flexible circuit subassembly.

Referring to FIG. 5, which is a top perspective view of an exemplary configuration of a rigid substrate 20, in the illustrated embodiment, the substrate includes a first surface 22 (e.g., a top surface), second surface 24 (e.g., a bottom surface opposite the top surface and optionally parallel thereto), opposed first and second edges, 26, 28, respectively (on the right and left sides, respectively as shown in FIG. 5) a first end 32 and a second end 34. The substrate 20 further includes corners 30*a*, 30*b*, 30*c*, 30*d* at the transition between the first and second surfaces and the first and second edges. Corners 30*a-d* are preferably rounded so as to avoid cutting or tearing the circuit subassembly 40 when it is wrapped around the rigid substrate 20 and to avoid excessive strain on the conductive traces and interconnects that traverse the corners of the rigid substrate 20 when the circuit subassembly 40 is wrapped around the substrate 20.

The thickness of the rigid substrate 20 between the first surface 22 and the second surface 24 and the overall thickness of the sensor assembly 10, 10' are not critical. The rigid substrate and the sensor assembly should be thick enough to be robust and strong—as required for the particular intended application.

The rigid substrate 20 is preferably formed from glass or ceramic material or some other suitable rigid, substantially inflexible, thermally and dimensionally stable material that can be readily machined or otherwise shaped in a desired manner.

In various embodiments, a ground/shield layer may be deposited on a portion of the rigid substrate 20 (e.g., on the first surface 22 and/or the second surface 24). Such a layer may be applied by conductive ink or vacuum deposition or plating, before circuit subassembly 40 is wrapped around the rigid substrate.

Figure 27:
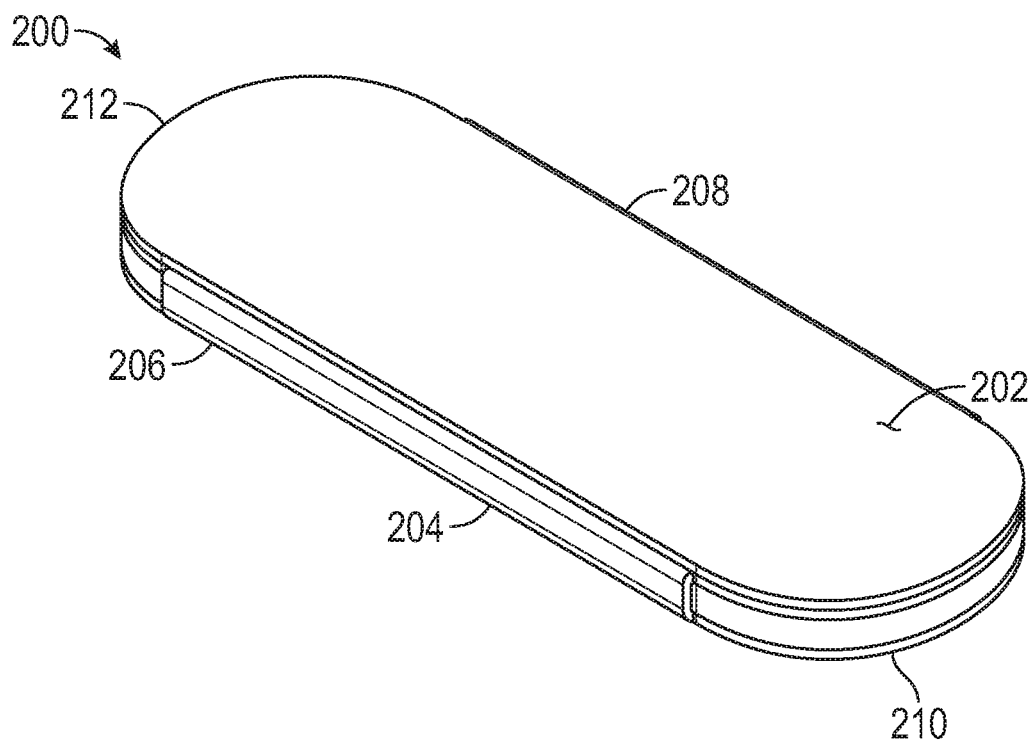
FIG. 27 is a top perspective view of an alternate embodiment of a rigid substrate without the flexible circuit subassembly.

As an alternative to a rectangular block (or a square or cube), a rigid substrate 200 may have a shape such as that shown in FIG. 27 with a first surface 202 (e.g., a top surface), second surface 204 (e.g., a bottom surface opposite the top surface and optionally parallel thereto), opposed first and second edges, 206, 208, respectively, and a rounded first end 210 and a rounded second end 212.

FIG. 6 is a partial top plan view of an un-wrapped circuit subassembly 40. In an embodiment, the circuit subassembly 40 is substantially symmetric about a line of symmetry 62, only half of the circuit subassembly 40 is shown in FIG. 6.

Circuit subassembly 40 includes a flexible substrate 42, which may be a flexible polymer-based dielectric material, such as Kapton® or Upilex® polyimide. In various embodiments, the circuit subassembly 40 includes a circuit element 56 disposed generally centrally on the flexible substrate 42. Flexible substrate 42 may be a polyimide or other suitable flexible material having a thickness of about 12-50 μm with a relatively high modulus of elasticity (i.e., Young's modulus) in the plane of the substrate, such as Ube Upilex® or similar material having a modulus of elasticity in the range of about 8-9 GPa. Alternatively, the flexible substrate 42 may comprise a material such as Kapton® having a typical modulus of elasticity of 2-3 GPa. Thus, the flexible substrate 42 may have a modulus of elasticity of at least a value in the range of about 2-9 GPa, and in some embodiments, may have a modulus of elasticity of at least a value in the range of about 8-9 GPa. A flexible substrate having a modulus of elasticity of about 2±1, 3±1, 4±1, 5±1, 6±1, 7±1, 8±1, or 9±1 GPa is contemplated. In various embodiments, the flexible substrate has a modulus of elasticity of 0.2-20 GPa.

In an embodiment, a plurality of first conductive traces 46 are disposed on one part of the flexible substrate 42 on one side of the circuit element 56, which is located generally in the center of the flexible substrate 42, and a plurality of second conductive traces 52a, 52b are formed on a second part of the flexible substrate 42 on an opposite side of the circuit element 56. The first conductive traces 46 are arranged in a side-by-side configuration so as to not contact each other and may be arranged substantially parallel to each other. Similarly, the second conductive traces 52a, 52b are also arranged in a side-by-side configuration so as to not contact one another and may be substantially parallel to one another. The first conductive traces 46 are arranged transversely to the second conductive traces 52a, 52b and may be generally perpendicular thereto.

First conductive traces 46 are each connected to the circuit element 56 by an associated first trace interconnect 48. To avoid cluttering the drawings, only one of the first trace interconnects 48 is labeled. The second conductive traces 52a are each connected to the circuit element 56 by an associated second trace interconnect 54a. In the illustrated embodiment, an associated second trace interconnect 54a is connected to an end of every other second conductive trace 52a. Every other alternating second trace 52b is connected to the circuit element 56 by an associated second trace interconnect 54b (not shown in FIG. 6). The first and second conductive traces 46, 52a, 52b as well as the first trace interconnects 48 and the second trace interconnects 54a, 54b may be made of a suitable conductive material, such as copper, tin, silver, nickel, aluminum, or gold and formed, etched, deposited, plated, or printed (e.g., by known lithographic techniques) onto or embedded into the flexible substrate 42. A portion of the circuit subassembly 40 including the first conductive traces 46 and a portion of the flexible substrate 42 on which the first conductive traces 46 are disposed defines a first layer 44. Similarly, a portion of the circuit subassembly 40 including the second conductive traces 52a, 52b and a portion of the flexible substrate 42 on which the second conductive traces 52a, 52b are disposed defines a second layer 50.

It should be noted that in various embodiments, there may be no substantial physical distinction between the first and second conductive traces 46, 52a, 52b and the associated interconnects 48, 54a, 54b other than their unique locations and orientations. In other words, each interconnect 48 may simply be a continuation of the conductive material forming the associated conductive trace 46, and each interconnect 54a, 54b may simply be a continuation of the conductive material forming the associated conductive trace 52a, 52b. In the context of this disclosure, the term "sensor element" or "conductive trace" (or line or plate) refers to a portion of the conductive material formed, etched, deposited, or printed onto or embedded into the flexible substrate 42 that is positioned so as to form all or part of a sensor element in the sensor assembly 10, and term "interconnect" refers to a portion of the conductive material formed, etched, deposited, or printed onto or embedded into the flexible substrate 42 that does not form any part of a sensor element but instead provides an electrical connection between an associated sensor element or conductive trace and another electrical component, such as a circuit element.

Figure 7:
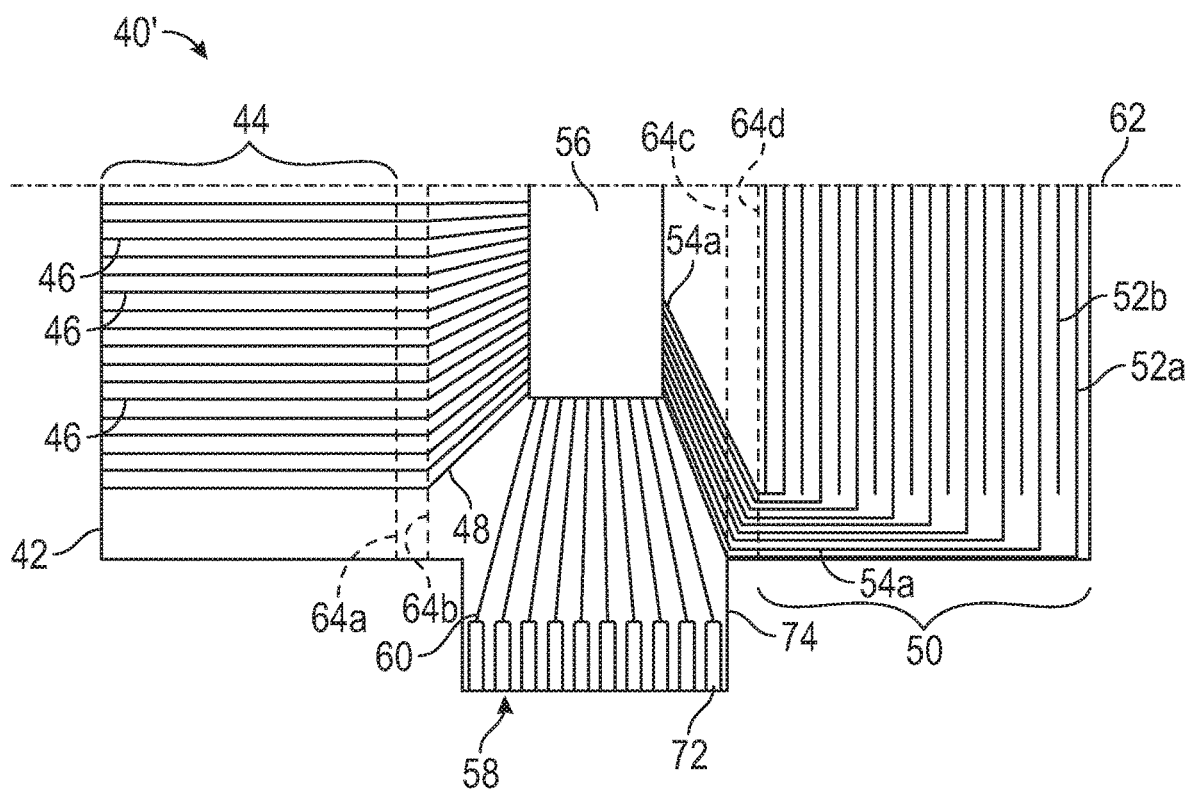
FIG. 7 is a partial top plan view of an alternate flexible circuit subassembly.

FIG. 7 shows an alternate embodiment of a circuit subassembly 40'. Circuit subassembly 40' is substantially identical to circuit subassembly 40 shown in FIG. 6. Circuit subassembly 40' differs from circuit subassembly 40 in that it includes host connector tabs 58. The host connector tabs 58, in an embodiment, comprise conductive connector pads 72 made of a suitable conductive material, such as copper, tin, silver, or gold, or alloys, that are formed, etched, deposited, plated, printed, or otherwise applied to or embedded into an extension 74 of the flexible substrate 42. Tab interconnects 60 connect each connector pad 72 to the circuit element 56. As with the circuit subassembly 40 shown in FIG. 6, the circuit subassembly 40' is substantially symmetric about the line of symmetry 62, although the circuit subassembly 40' may or may not include additional host connector tabs extending from both sides of the flexible substrate 42.

Figure 28:
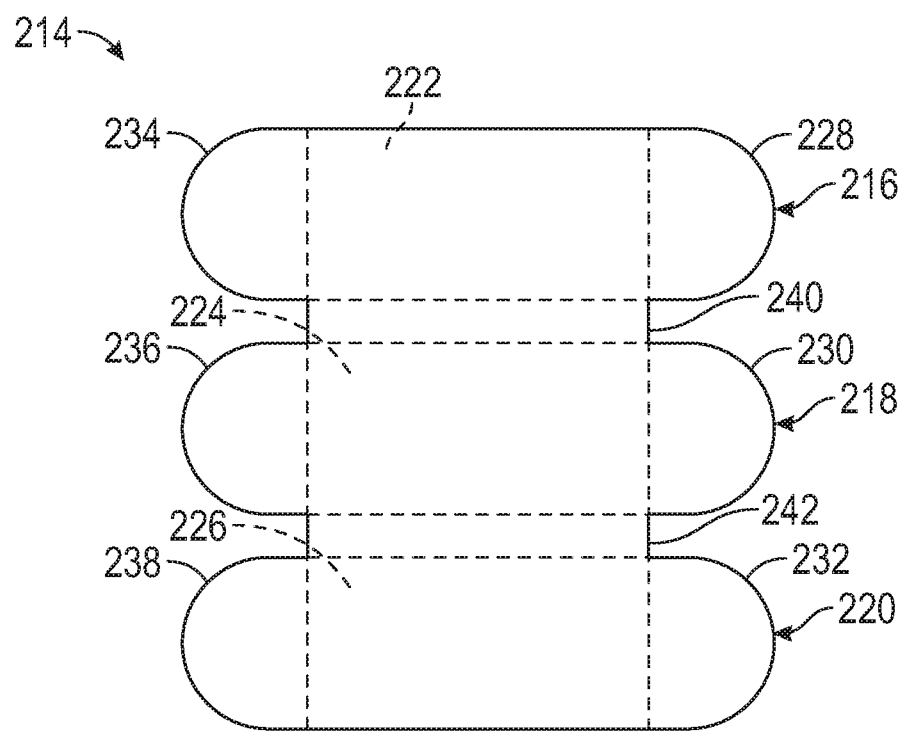
FIG. 28 is a top plan view of a flexible substrate of a flexible circuit subassembly.
Figure 29A:
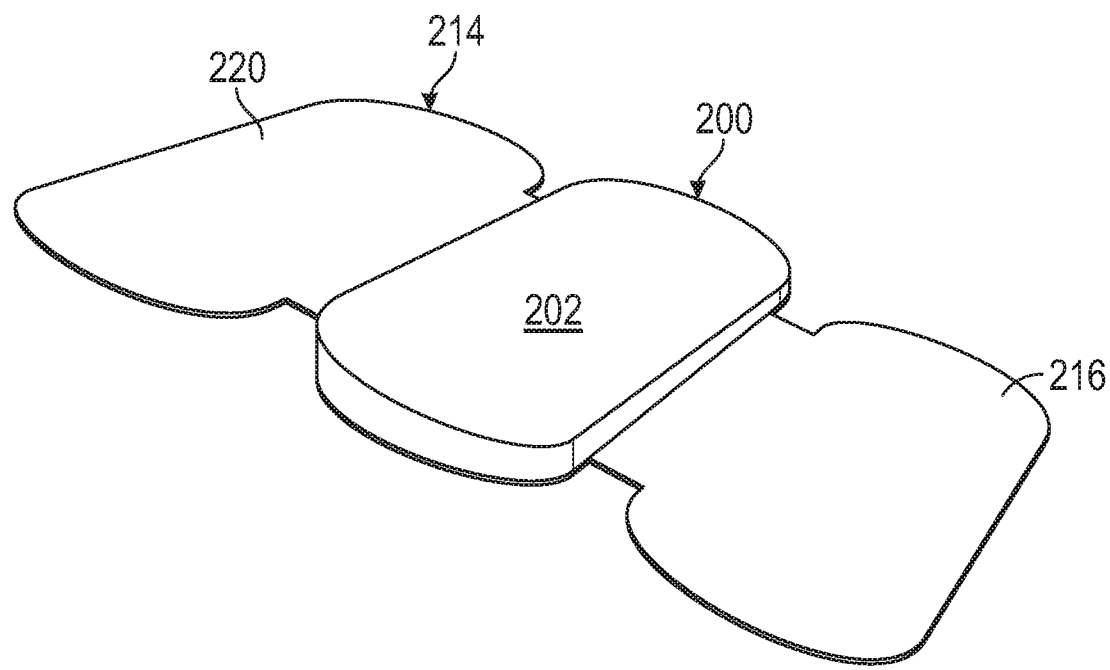
FIGS. 29A-29E show a sequence of assembly steps as the circuit subassembly of FIG. 28 is wrapped around the rigid substrate of FIG. 27.
Figure 29B:
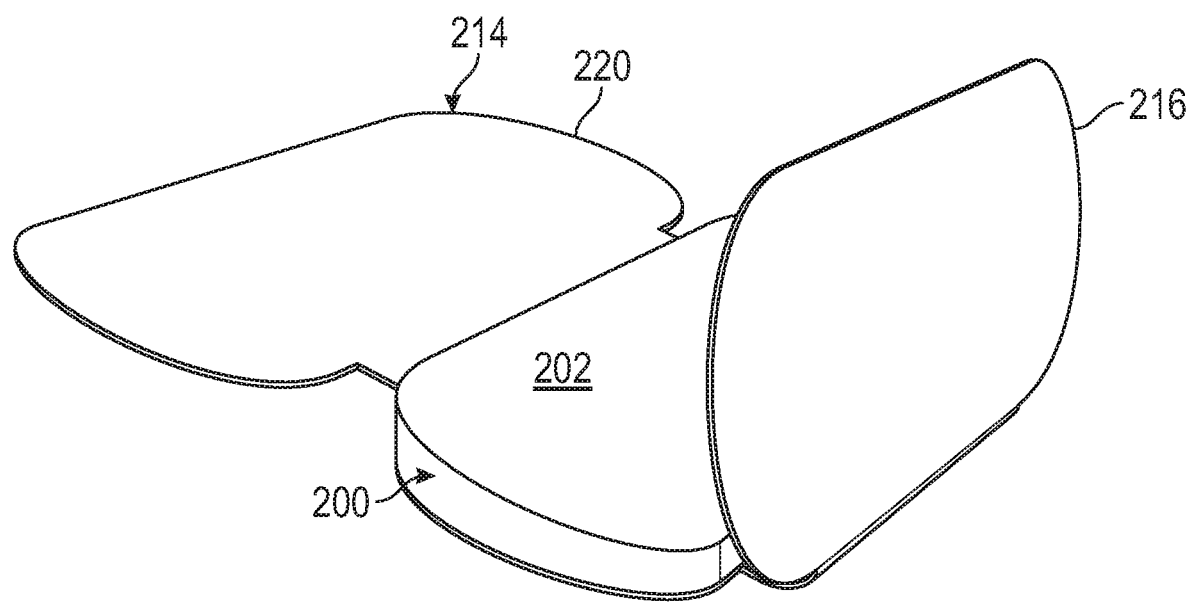
Figure 29C:
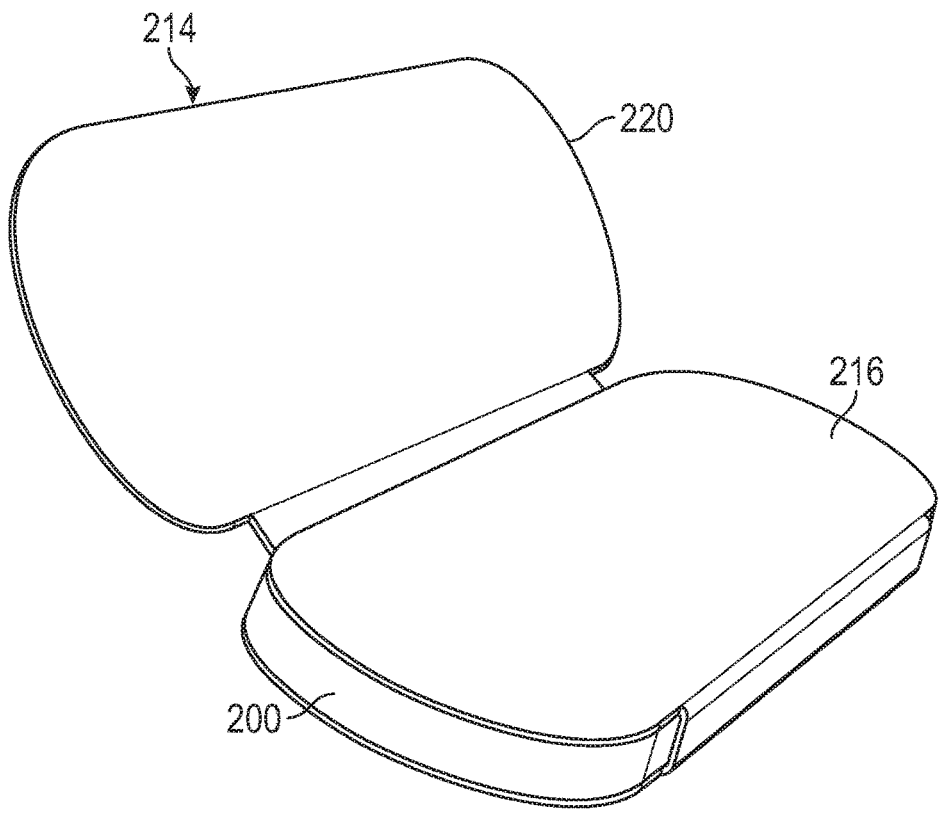
Figure 29D:
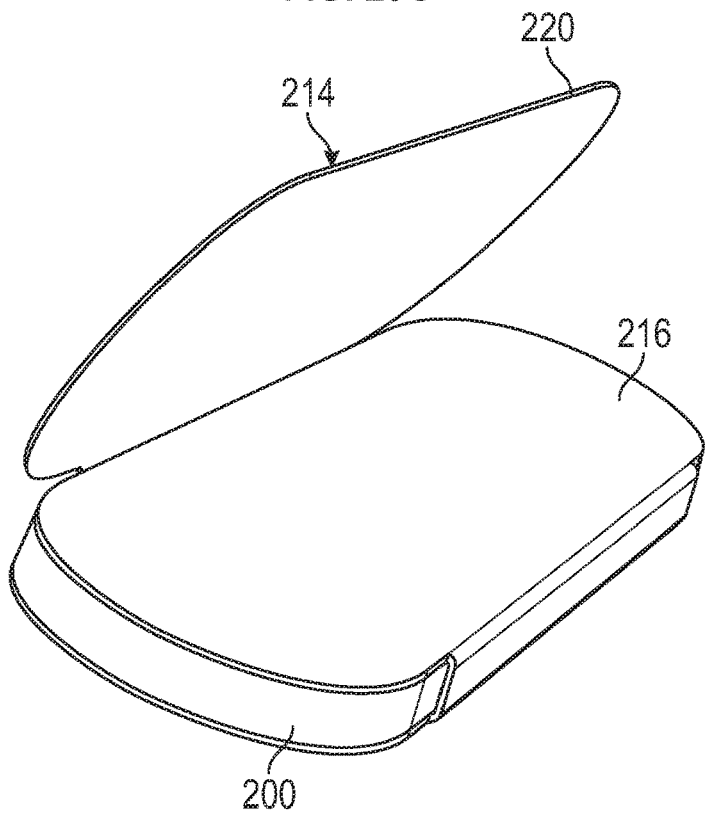
Figure 29E:
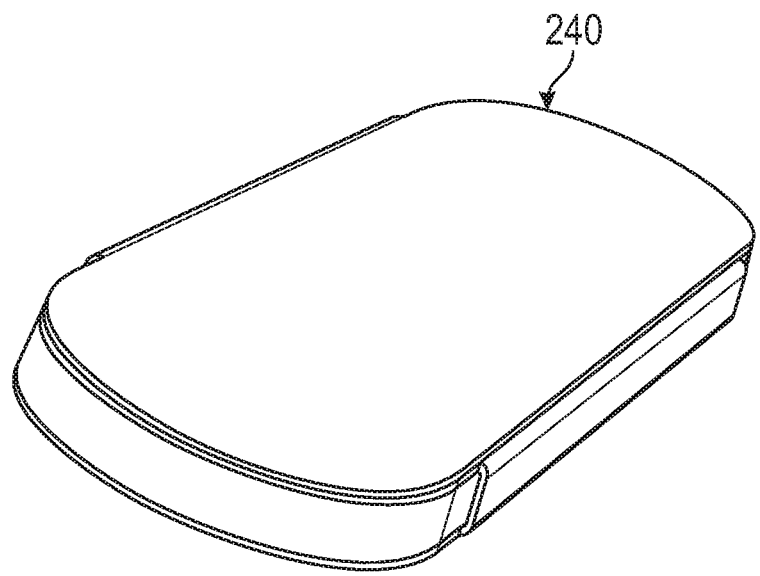

The circuit subassemblies 40 and 40' shown in FIGS. 6 and 7 have generally rectangular shapes conforming to the rectangular rigid substrate 20. In an alternate embodiment in which the rigid substrate has a non-rectangular shape, such as rigid substrate 200 shown in FIG. 27, a circuit subassembly 214 may have a conforming shape, such as shown in FIG. 28. Circuit subassembly 214 has first, second, and third panels 216, 218, 220. In one embodiment, second panel 218 (the center panel) will overlie the second (e.g., lower) surface 204 of the rigid substrate 200, first panel 216 will overlie the first (upper) surface 202 of the rigid substrate 200, and third panel 220 will wrap around the rigid substrate 200 and overlie the first panel 216 and the upper surface 202 of the rigid substrate 200. Each panel may have a generally rectangular portion as indicated by dashed rectangles 222, 224, 226, and rounded ends 228, 230, 232, 234, 236, 238 conforming to the rounded ends 210, 212 of the rigid substrate 200. Connecting portions 240 between panel 216 and panel 218 and 242 between panel 218 and panel 220 overlie the edges 206, 208 of the rigid substrate 200. FIGS. 29A-E illustrate an exemplary sequence for wrapping the circuit subassembly 214 around the rigid substrate 200 to form a sensor assembly 240.

A variant of circuit subassembly 214 may include a host connector tab, similar to host connector tab 58 of circuit subassembly 40' shown in FIG. 7.

In an embodiment, circuit subassembly 214 includes a plurality of first conductive traces (not shown in FIG. 28, but may be substantially similar to conductive traces 46 shown in FIG. 6) disposed on first panel 216, a circuit element (not shown in FIG. 28, but may be substantially similar to circuit element 56 shown in FIG. 6) disposed on the center panel 218, and a plurality of second conductive traces (not shown in FIG. 28, but may be substantially similar to conductive traces 52a, 52b shown in FIG. 6) formed on third panel 220. The first conductive traces may be connected to the circuit element by first trace interconnects (not shown in FIG. 28, but may be substantially similar to first trace interconnects 48 shown in FIG. 6), and the second conductive traces may be connected to the circuit element by second trace interconnects (not shown in FIG. 28, but may be substantially similar to second trace interconnects 54a, 54b shown in FIG. 6).

Figure 30A:
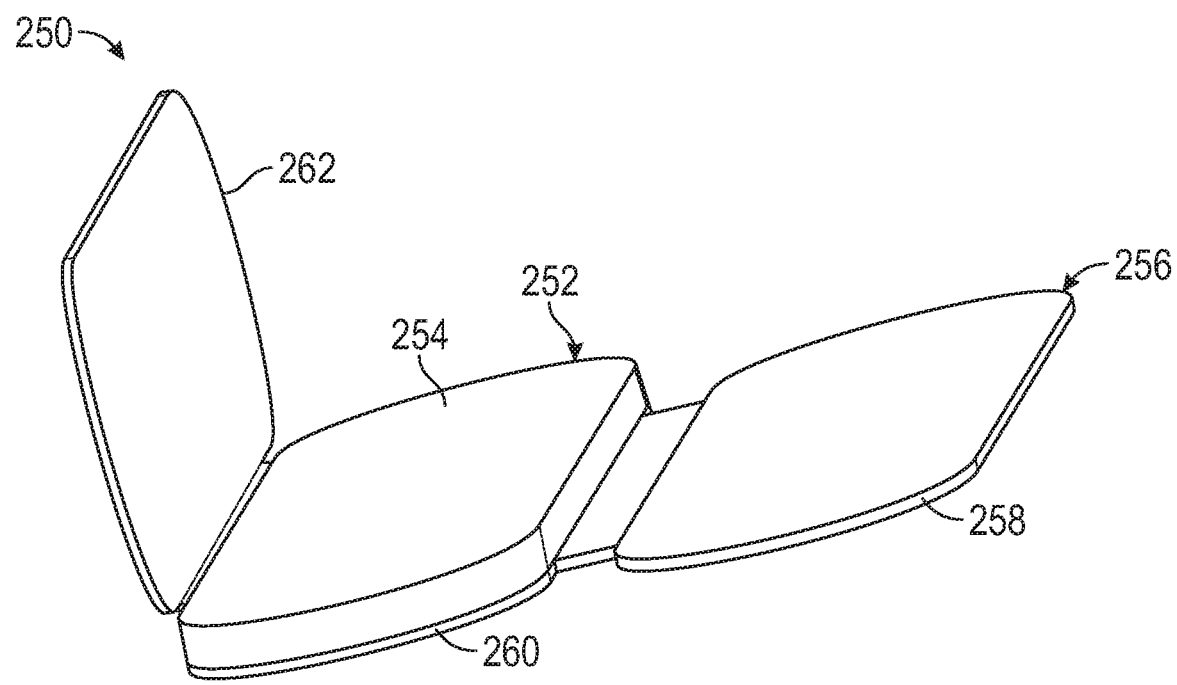
FIGS. 30A-30C show a sequence of assembly steps as a circuit subassembly is wrapped around a rigid substrate for an alternate embodiment.
Figure 30B:
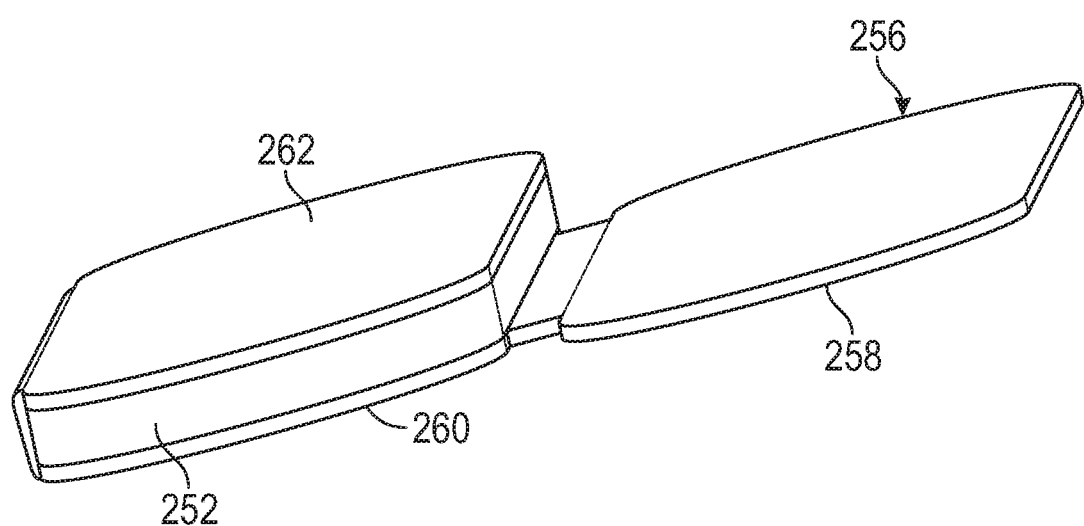
Figure 30C:
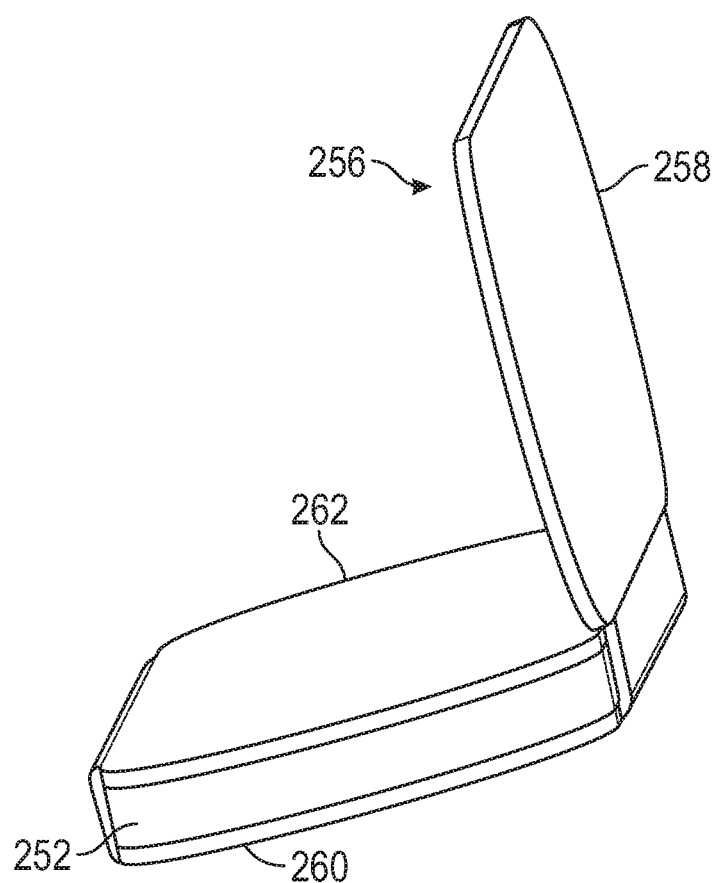

In an embodiment 250 having yet a different shape, as shown in FIGS. 30A-30C, a second panel 260 (a center panel) of a flexible circuit subassembly 256 overlies a second (e.g., lower) surface of a rigid substrate 252, a first panel 262 of circuit subassembly 256 overlies the first (upper) surface 254 of the rigid substrate 252, and a third panel 258 overlies the first panel 262 and the upper surface 254 of the rigid substrate 252.

It should be noted that it is not a requirement that the flexible substrate of the circuit subassembly has a shape and size that conform to the shape and size of the rigid substrate around which it is wrapped. In various embodiments, the flexible substrate of the circuit subassembly may be smaller than the rigid substrate, thereby leaving portions of the rigid substrate uncovered by the circuit subassembly in the final, wrapped sensor assembly.

Figure 8:
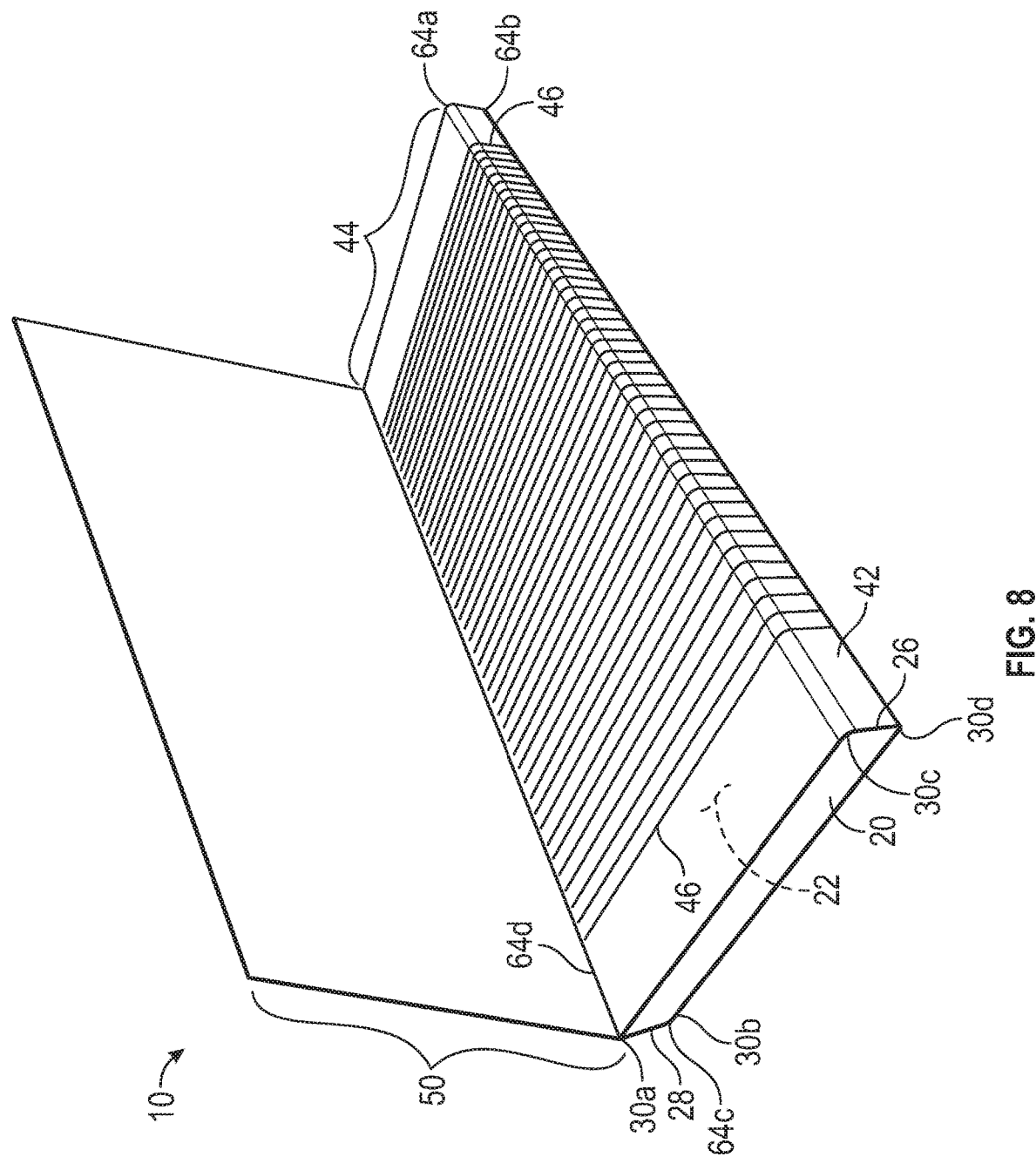
FIG. 8 is a top perspective view of an intermediate assembly of the sensor assembly as circuit subassembly is wrapped around the rigid substrate.

FIG. 8 is a top perspective view of an intermediate assembly of the sensor assembly 10. As shown in FIG. 8, to assemble the sensor assembly 10, the circuit subassembly 40 is wrapped around the rigid substrate 20 so that the first layer 44 of the circuit subassembly 40 overlies the first surface 22 of the rigid substrate 20 and the first conductive traces 46 extend across the first surface 22 of the rigid substrate 20 between the first and second edges 26, 28 of the rigid substrate 20.

The circuit subassembly 40 is folded about first and second fold lines 64a, 64b (see FIGS. 6 and 7) around the corners 30c and 30d of the substrate 20 and wrapped beneath the rigid substrate 20 over the second surface 24 so that the circuit element 56 and the first trace interconnects 48 and the second trace interconnects 54a, 54b overlie the second surface 24 of the rigid substrate 20, opposite the surface on which the first conductive traces 46 are disposed. (See FIG. 3). The circuit subassembly 40 is then folded about fold lines 64c, 64d (See FIGS. 6 and 7) around the corners 30a and 30b so that the second layer 50 of the circuit subassembly 40 extends above the first surface 22 of the rigid substrate 20, as shown in FIG. 8. The circuit subassembly 40 is finally wrapped around the substrate 20 so that the second layer 50 of the circuit subassembly overlies the first layer 44.

The circuit subassembly 40 may be secured to the rigid substrate 20 by means of a suitable adhesive, such as a pressure sensitive adhesive ("PSA") available in sheet form or applied via mask deposition potentially less than 10 µm thick and UV curable), applied to the flexible substrate 42 (the side of the flexible substrate that contacts the rigid substrate 20). PSA may be pre-attached to the flexible substrate 42 during circuit subassembly fabrication. The PSA may be a screen printed, UV curable PSA deposited on the flexible substrate 42 during fabrication to attach circuit subassembly 40 to the rigid substrate 20 and to itself during wrapping. PSA can be attached to the non-circuit side of the flexible substrate 42 in a "circuits out" wrapping configuration. The circuit subassembly 40 may be secured to the rigid substrate 20 by use of B-staged sheet adhesive or bond ply adhesive, 'tack laminated' onto the circuit subassembly during fabrication, to adhere the circuit subassembly to the rigid substrate and to itself during wrapping, using pressure and temperature. Other suitable adhesives include acrylic-based thermoset adhesives, such as DuPont Pyralux LF or Pyralux FR sheet adhesive or bond ply adhesive.

In various embodiments, the adhesive securing the circuit subassembly 40 to the rigid substrate 20 may comprise high modulus of elasticity/highly cross-linked, epoxy-type thermoset adhesives and/or adhesive with particle fillers, nano-fillers, or other fillers to further increase the modulus of elasticity of the adhesive. In various embodiments, such adhesive fillers can also be used to tailor other properties of the adhesives. For example, a given thickness of adhesive may have a negative effect on the signal to noise ratio of the sensor. Rigid filler materials with high dielectric constants can reduce such negative impact of the given thickness of adhesive on the signal to noise ratio. Exemplary materials and their dielectric constants include Zirconia (Dk 26) and barium strontium titanate (Dk 72 to 200).

Figure 4:
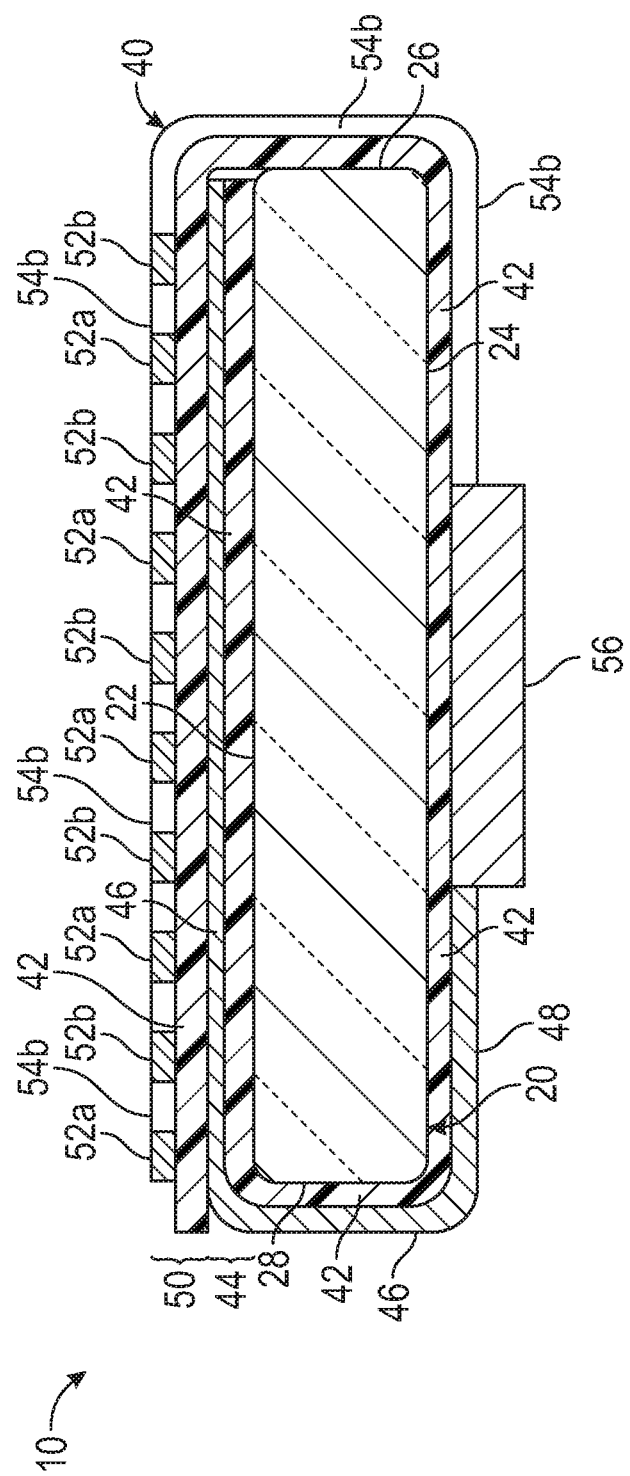
FIG. 4 is a transverse cross-section of the sensor assembly through the line 4-4 in FIG. 2.

FIG. 4 is a transverse cross-section of the sensor assembly 10 or 10' through the line 4-4 shown in FIG. 2. The scale of FIG. 4 is for illustration purposes and does not necessarily represent the scale of an actual sensor assembly.

As shown, the circuit element 56 secured to a portion of the flexible substrate 42 overlies a second surface 24 of the rigid substrate 20. The first layer 44 comprising the first conductive traces 46 (a single conductive trace shown in cross-section is shown in FIG. 4) overlies and is secured to the first surface 22 of the rigid substrate 20, for example, with an adhesive having one or more properties such as those described above. The flexible substrate 42 and the first conductive traces 46 extend around an edge, e.g. edge 28, of the rigid substrate 20 toward the second surface 24 and a first trace interconnect 48 connects the first trace 46 to the circuit element 56. The second layer 50 comprising a portion of the flexible substrate 42 and the second conductive traces 52a, 52b overlie the first layer 44 and the first surface 22 of the rigid substrate 20. The second layer 50 may be secured to the first layer 44, for example, with an adhesive having one or more properties such as those described above. The flexible substrate 42 extends around the opposite edge 26 of the rigid substrate 20 toward the lower surface 24 and the second trace interconnects (e.g., 54b) extend from the first surface 22 around the edge 26 to the lower surface 24 where they connect to the circuit element 56.

Thus, the sensor assembly constructed by wrapping the flexible circuit subassembly 40 around the rigid substrate 20 comprises a grid structure on a top surface 22 of the rigid substrate 20 with overlapping first traces 46, which may function as drive lines and second traces 52a, 52b, which may function as pickup lines separated by the flexible substrate 42 and a circuit element 56 located on a bottom surface 24 of the rigid substrate 20, with the traces 46 connected to the circuit element 56 by first interconnects 48 and the second traces 52a, 52b connected to the circuit element 56 by second interconnects 54a, 54b. In an operation, a selected first trace 46 functioning as a drive line is activated by a switching element within the circuit element 56 connecting the active drive line to a signal source within the circuit element 56, while at least the first traces adjacent to the active first trace are unconnected to the signal source and may be grounded. A selected second trace 52a or 52b functioning as a pickup line is connected by a switching element in the circuit element 56 to a receiving circuit within the circuit element 56, such as an amplifier/buffer circuit, so that the resulting electric field emitted by the active drive line can be captured by the active pickup line. An electric field extends from the drive line 46 to the pickup line 52a or 52b through the intermediate dielectric insulating layer of the flexible substrate 42.

As will be described below, the sensor assembly will be covered by a flat cover panel, such a glass plate cover. An often desirable property of a sensor assembly described herein, such as sensor assembly 10, is to achieve a tight wrap between the rigid substrate and the layers of the flexible circuit subassembly—such as, between second layer 50, first layer 44, and first surface 22 of the rigid substrate 20—and a flat top surface of the sensor assembly that will be covered by the cover panel. The "flatness" of the surface, i.e., the absence of geometric deviations or irregularities or warpage in the surface, may sometimes be characterized by its "smoothness" or its corollary, "roughness." A benefit of a very flat top surface of the sensor assembly is that the surface of cover panel is itself very flat. If the supporting (top) surface of the sensor assembly is not as flat as the cover panel, the cover panel might otherwise be resting on the top of "peaks" (i.e., surface non-uniformities in the surface of the sensor assembly) while bridging valleys (which are by definition unsupported areas), lumps (or "bridges"), or air bubbles. If the cover panel is not fully supported by the sensor assembly due to voids between the top of the sensor assembly and the bottom of the cover panel, the cover panel may deflect when point pressure or a sustained pressure is applied from a finger or other source of impact on the cover panel.

The requirement for flatness from a mechanical robustness perspective depends in part on how the cover panel is attached to the sensor assembly. For example, a liquid or paste adhesive, such as an epoxy, may fill and planarize any non-flat regions, thereby preventing voids between the cover panel and sensor assembly such that effectively the cover panel is well-supported everywhere.

On the other hand, even if the adhesive can effectively planarize the sensor assembly surface, this would still result in variability in the distance from the top of the cover panel to the top of the sensor surface, and thus variability in the distance between the fingerprint to the sensor grid. Ideally, the overall distance between the finger surface and the sensing elements is minimized. Thus, while a thicker, flowable adhesive layer will more effectively planarize the surface of the sensor assembly under the cover panel, such a thick adhesive layer may cause degradation in signal quality, such as a degradation in the signal to noise ratio. In various embodiments, the adhesive thickness between the sensor assembly and the cover panel is less than 10 µm and in some embodiments may be less than 25 µm.

In one embodiment, a liquid/paste type epoxy adhesive is employed to secure the flexible circuit subassembly to itself and to the rigid substrate, and a suitable tooling/fixturing is used during adhesive cure to maximize flatness of the resulting sensor assembly surface. In various embodiments, a tight wrap of the circuit subassembly (e.g., circuit subassembly 40) around the rigid substrate (e.g., rigid substrate 20) and flat top surface of the sensor assembly (e.g., sensor assembly 10) may be achieved using flatbed lamination or isostatic lamination. Flatbed lamination refers to a process whereby pressure is applied directionally to a component from top and bottom utilizing two heavy plates with opposing surfaces pressed together and with the component in between. Isostatic lamination refers to a process whereby pressure is applied to the component from all directions equally, such as in an autoclave (air pressure) or in a hydrostatic press (water pressure).

In flatbed lamination or isostatic lamination processes, the top surface (i.e., the sensor surface) of the sensor assembly is placed against a very flat, smooth plate (e.g., glass, polished steel, etc.), and pressure is applied between the sensor surface and the smooth plate, so that the sensor surface is "forced" into a flat configuration conforming to the smooth plate. Flatbed lamination or isostatic lamination may be combined with the use of a flowable adhesive, such as a liquid or paste adhesive such as epoxy, which can flow during attachment and early in the cure cycle to planarize. Pressure applied between the sensor surface and the flat plate may also force out air pockets between the layers of the circuit subassembly and/or between the circuit subassembly and the rigid substrate. A flatbed lamination process may incorporate a vacuum press, whereby vacuum is pulled to evacuate the bond line (i.e., the layer of adhesive between the two objects being bonded) before pressure is applied. Likewise, in an isostatic lamination press, such as an autoclave press, the part is put into a vacuum bag which is evacuated before applying pressure. Placing the component to be laminated into a vacuum bag helps to evacuate air from between the components being bonded and to remove bubbles (i.e., trapped air) from the adhesive bond line. The vacuum bag collapsed around the component also tends to contain the adhesive to help prevent it from squeezing out during application of pressure, as it conforms to the parts due to the vacuum. The vacuum bag also prevents water from contacting the parts if the isostatic press is a hydrostatic type.

In some embodiments, the flatness is 2 µm (maximum distance between low and high points in the surface) and in some embodiments, flatness may be less than 5 µm.

Figure 20:
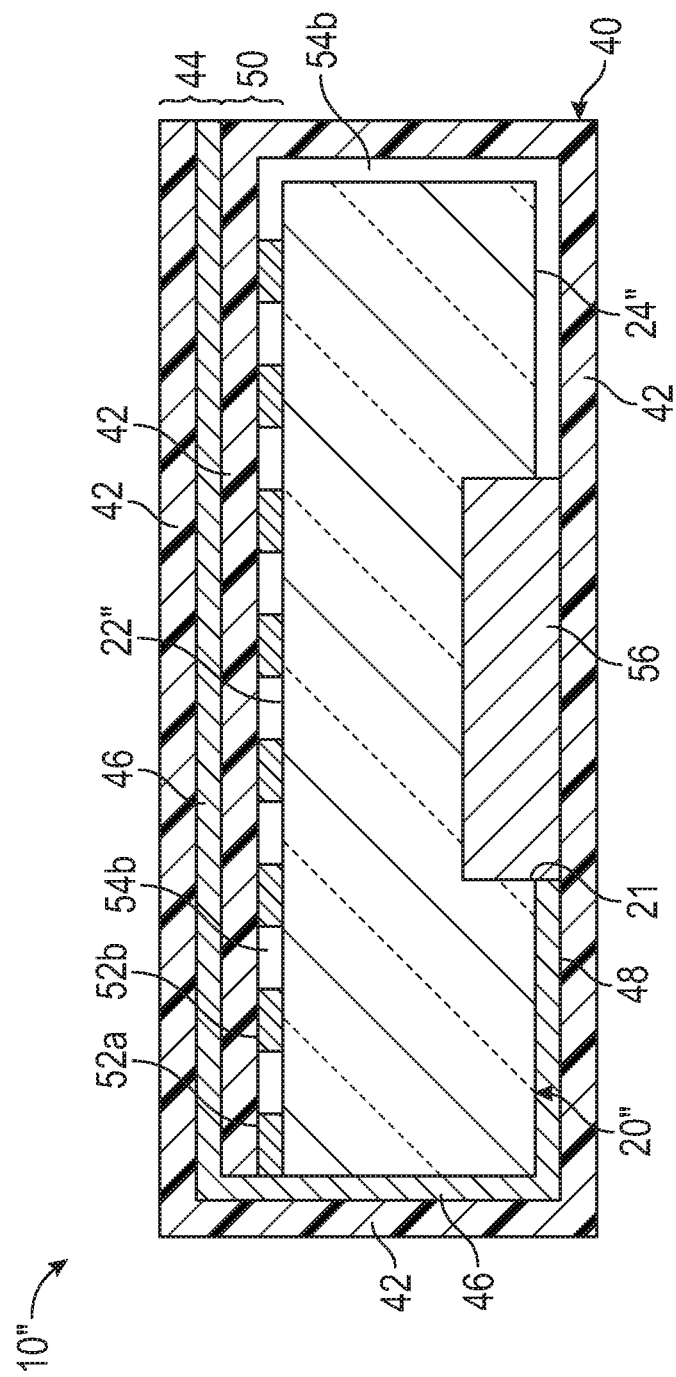
FIG. 20 is a transverse cross-section of an alternate embodiment of a sensor assembly.

In an alternate configuration shown in FIG. 20, which is a transverse cross section of an alternate sensor assembly 10", the circuit subassembly 40 is inverted before being wrapped around a rigid substrate 20". That is, the circuit subassembly 40 is wrapped around the rigid substrate 20" so that the circuit element 56, the first traces 46, the second traces 52a, 52b, the first interconnects 48, and the second interconnects 54b face the rigid substrate 20". A cutout 21 may be formed in the rigid substrate 20", the interconnects 48 and 54b face a second surface 24" of the rigid substrate 20", and the first traces 46 and second traces 52a, 52b face a first surface 22" of the rigid substrate 20". FIG. 20 also shows another variation in that the first layer 44, comprising first conductive traces 46 and the part of the flexible substrate 42 on which the first conductive traces 46 are disposed, overlies the second layer 50, comprising second conductive traces 52a, 52b and the part of the flexible substrate 42 on which the second conductive traces are disposed. That is traces extending in a first direction, e.g., lengthwise of the rigid substrate, and form a first or second layer of trace, while traces extending in another direction, e.g., widthwise of the rigid substrate, can form the other layer.

Figure 21:
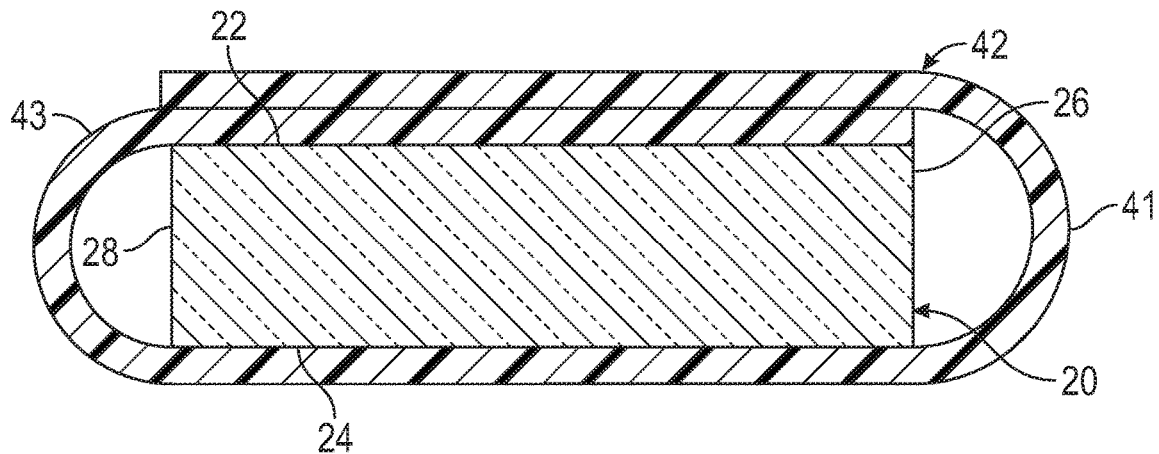
FIG. 21 is a transverse cross section of an alternate embodiment of a sensor assembly.
Figure 22:
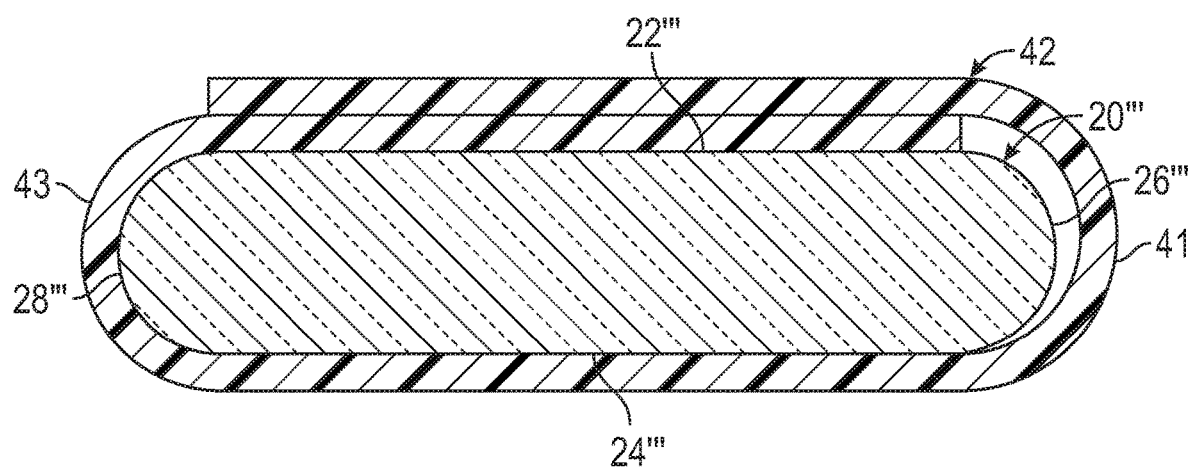
FIG. 22 is a transverse cross section of an alternate embodiment of a sensor assembly.

FIGS. 21 and 22 show alternate configurations for wrapping a flexible circuit subassembly (e.g., 40 or 40') around a rigid substrate. FIGS. 21 and 22 are transverse cross sections of a sensor assembly. For simplicity, conductive components typically disposed on the circuit subassembly, such as conductive traces and conductive interconnects, and the circuit element are not shown in the FIGS. 21 and 22; only the flexible substrate wrapped around a rigid substrate are shown.

In FIG. 21, the flexible substrate 42 is wrapped about the rigid rectangular substrate 20 in such a manner that the flexible substrate 42 is not in contact with the opposed first and second edges 26, 28 of the substrate, as opposed to the embodiments shown, for example, in FIGS. 4 and 20, in which the flexible circuit subassembly 40 (or 40') is wrapped tightly around the rigid substrate 20, so that the circuit subassembly is generally in contact with the opposed edges 26, 28 of the rigid substrate. Instead, in the embodiment of FIG. 21, the flexible substrate 42 (i.e., the circuit subassembly) is wrapped around the rigid substrate 20 more loosely so that it forms a service loop 41 adjacent the edge 26 and a service loop 43 adjacent the 28. Portions of the flexible substrate 42 overlie and are in contact with the first surface 22 and the second surface 24 of the substrate 20. Wrapping the flexible circuit subassembly more loosely so as to form the service loops 41, 43 may be advantageous in that it reduces the bending radii and associated stresses in the flexible substrate 42 and the conductive traces and interconnects as compared to when the circuit subassembly is wrapped tightly around a rectangular rigid substrate with straight edges and relatively sharp corners.

In FIG. 22, a rigid substrate 20''' has a flat first surface 22''' and an opposed, flat second surface 24'''. Instead of straight edges between the first surface 22''' and the 24'', the rigid substrate 20''' has rounded edges 26''' and 28'''. The flexible substrate 42 (i.e., the circuit subassembly) is wrapped around the rigid substrate 20''' as shown in FIG. 22 with portions of the flexible substrate 41, 43 in full or partial contact with the rounded edges 26''' and 28'''.

Figure 23:
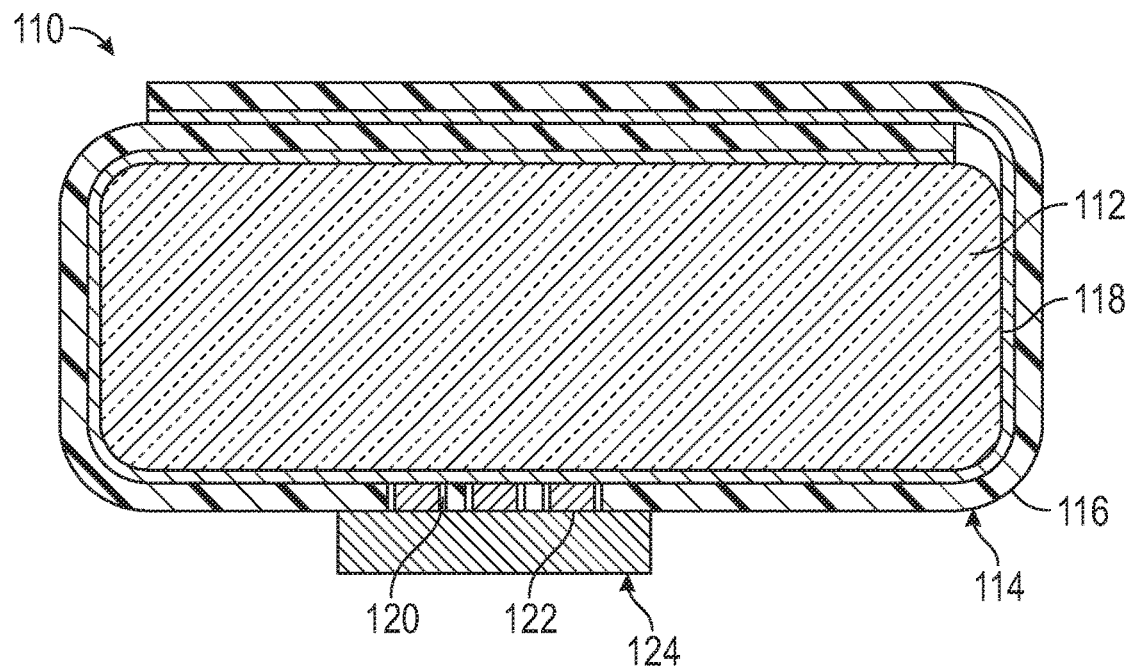
FIG. 23 is a transverse cross section of an alternate embodiment of a sensor assembly.

FIG. 23 is a transverse cross section of an alternate embodiment of a sensor assembly 110. Sensor assembly 110 includes a flexible circuit subassembly 114 wrapped around a rigid substrate 112. Rigid substrate 112 may comprise a rectangular, square, or cubic block made of glass or ceramic, or it may comprise a block with opposed first and second surfaces with rounded edges, as shown in FIG. 22 and described above. The flexible circuit subassembly 114 includes first and second conductive traces and the first and second trace interconnects, represented in FIG. 23 by conductive layer 118, that are disposed on a first side of a flexible substrate 116 and a circuit element 124 disposed on a second, opposing side of the flexible substrate 116. The first and second conductive traces and the first and second trace interconnects may be constructed and arranged substantially as described above and shown, for example, in FIG. 6.

The flexible substrate 116, with the conductive layer 118, is wrapped around the rigid substrate 112 so that the first side of the flexible substrate on which the conductive layer 118 is disposed faces inwardly toward the rigid substrate 112. The flexible circuit subassembly 114 may be secured to the rigid substrate 112 by an adhesive technique described above. The circuit element 124 on the second side of the flexible substrate 116 is electrically connected to conductive layer 118 (i.e., to the first and second trace interconnects) through openings 120 in the flexible substrate 116, such as holes or vias. In various embodiments, the openings 120 formed in the flexible substrate 116 may correspond spatially to interconnection terminals (not shown) on the circuit element 124 to facilitate interconnection between the circuit element and the trace interconnects through the flexible substrate using solder, conductive adhesive, wire bonding, or other suitable means (generally indicated at 122). The openings 120 enable interconnection to the appropriate trace interconnects on the first surface of the flexible substrate 116.

In addition, the surface of the trace interconnects exposed by the openings 120 in the flexible substrate 116 may be adapted to accept the interconnection means 122 between the circuit element 124 and the interconnects within conductive layer 118. For example, a copper trace may be treated with an organic solderability preservative or be plated with nickel and gold to enable a reliable, low resistance interconnection to the circuit element 124 using solder or conductive adhesive. The openings 120 may be unplated holes providing access to a back side of the interconnect traces where these traces had been attached to the flexible substrate 116. The unplated openings in this embodiment can serve the purpose of access holes allowing interconnection to the interconnect traces and can also serve as a solder resist, preventing solder bridging in the event a reflow soldering process is used to attach the circuit element 124 to the interconnect traces.

Figure 24:
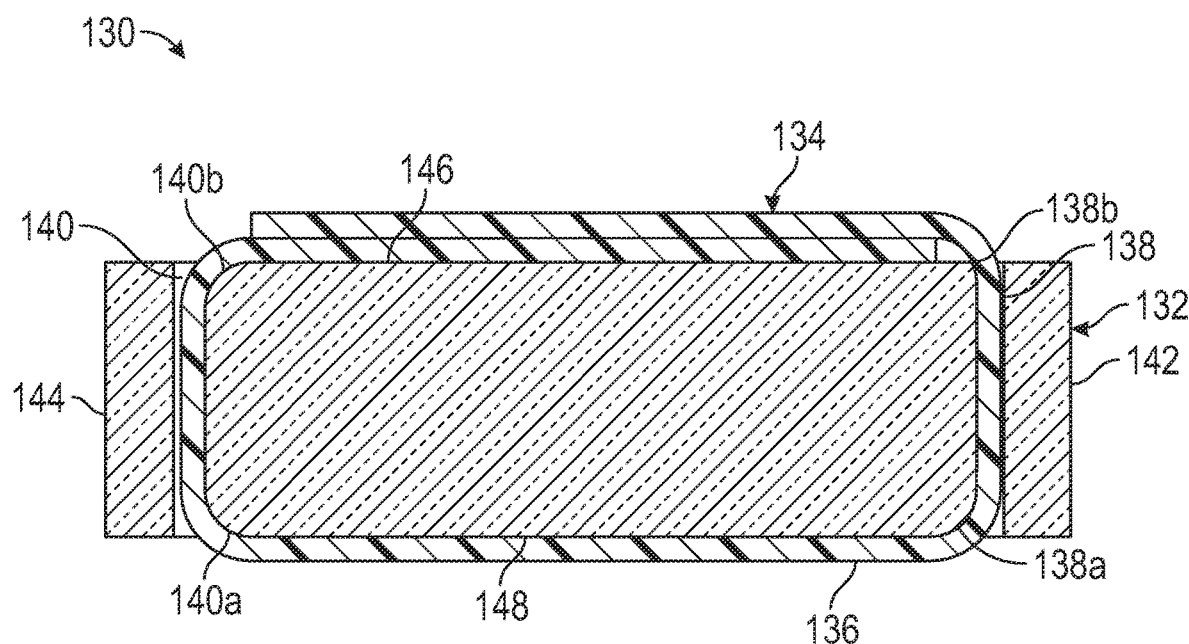
FIG. 24 is a transverse cross section of an alternate embodiment of a sensor assembly.

FIG. 24 is a transverse cross section of an alternate embodiment of a sensor assembly 130. Sensor assembly 110 includes a flexible circuit subassembly 134 wrapped partially through and around a rigid substrate 132. Rigid substrate 132 may comprise a rectangular, square, or cubic block made of glass or ceramic, or it may comprise a block with opposed first and second surfaces with rounded edges, as shown in FIG. 22 and described above. In various embodiments, the flexible circuit subassembly 134 may comprise a flexible circuit subassembly 40, 40', or 114 described above. For simplicity, conductive components typically disposed on the circuit subassembly 134, such as conductive traces and conductive interconnects, and the circuit element are not shown in the FIG. 24; only the flexible substrate 136 and the rigid substrate 132 are shown.

The rigid substrate 132 includes slots 138, 140 extending between first and second surfaces 146, 148 internal to the edges 142, 144. The flexible substrate 136 (i.e., the flexible circuit subassembly) is wrapped from the second surface 148, through the slots 138, 140 and over the first surface 146. The lower and upper ends of the slots 138, 140 may be rounded at 138a, 138b, 140a, 140b to as to avoid cutting or tearing the flexible substrate 136 when it is wrapped through the slots 138, 140 and to avoid excessive strain on the conductive traces and interconnects that traverse the upper and lower corners of the slots 138, 140.

The flexible circuit subassembly 134 may be secured to the rigid substrate 132 by an adhesive technique described above.

The embodiment of FIG. 24 avoids the need for edge corners of the rigid substrate to be radiused, thereby allowing a tight tolerance glass edge on the sensor assembly 130.

Figure 25:
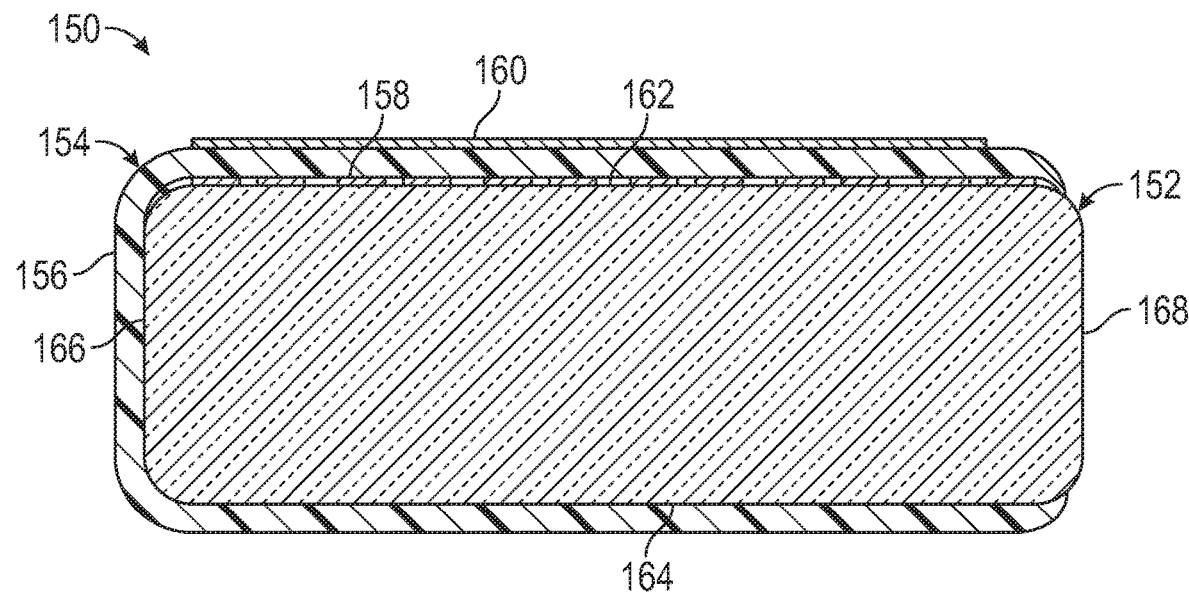
FIG. 25 is a transverse cross section of an alternate embodiment of a sensor assembly.

FIG. 25 is a transverse cross section of an alternate embodiment of a sensor assembly 150. Sensor assembly 150 includes a flexible circuit subassembly 154 wrapped partially around a rigid substrate 152. As opposed to the previously-described sensor assemblies having flexible circuit subassemblies with at least three panels—one covering a first surface of the rigid substrate and two overlapping each other and covering a second surface of the rigid substrate—the flexible circuit subassembly 154 of the sensor assembly 150 has two panels, one covering each of the top and bottom surfaces of the rigid substrate 152.

A circuit element, such as an integrated circuit chip, is not shown in FIG. 25, although sensor assembly 150 may include such a circuit element. Rigid substrate 152 may comprise a rectangular, square, or cubic block made of glass or ceramic, or it may comprise a block with opposed first and second surfaces with rounded edges, as shown in FIG. 22 and described above. The circuit subassembly 154 comprises a flexible substrate 156 with first conductive traces 158 and second conductive traces 160 disposed on opposed sides of a common part of the flexible substrate 156. The first conductive traces may include a plurality of conductive lines made of a suitable conductive material, such as copper, tin, silver, nickel, aluminum, or gold and formed, etched, deposited, plated, or printed (e.g., by known lithographic techniques) onto or embedded into the flexible substrate 156 and are arranged side-by-side preferably without contacting one another and may be generally parallel with each other. Similarly, the second conductive traces may include a plurality of conductive lines made of a suitable conductive material and are arranged side-by-side preferably without contacting one another and may be generally parallel to one another. The first conductive traces are oriented transversely to the second conductive traces and may be generally perpendicular thereto.

The circuit subassembly 154 is wrapped partially around the rigid substrate 152 so that the first and second traces 158, 160 disposed on opposite surfaces of a first end of the flexible substrate 156 overlie a first surface 162 of the rigid substrate 152, a middle portion of the flexible substrate 156 wraps around only one edge 166 of the rigid substrate 152, and a second end of the flexible substrate 156 (a portion on which, for example, a circuit element might be mounted) overlies a second surface 164 of the rigid substrate 152. Thus, rather than having first and second conductive traces, conductive interconnects, and a circuit element (ASIC) disposed on the same side of the a flexible substrate, as in the flexible circuit subassemblies described above, flexible circuit subassembly 154 includes first and second traces 158, 160 disposed on opposite surfaces of the flexible substrate 156.

The flexible circuit subassembly 154 may be secured to the rigid substrate 152 by an adhesive technique described above. Moreover, although not shown in FIG. 25, when installed in a host device panel, the sensor assembly 150 may be covered with a cover panel, such as any cover panel described herein, and may be mounted within a spacer frame, such as any spacer frame described herein.

As with other embodiments, sensor assembly 150 may have a flatness of 2 μm (maximum distance between low and high points in the surface) and in some embodiments, flatness may be less than 5 μm on the top surface, also known as the sensor surface (i.e., the first surface 162 of the rigid substrate 152 and the first and second traces 158, 160 disposed on opposite surfaces of the a first end of the flexible substrate 156 overlying the first surface 162).

Figure 26:
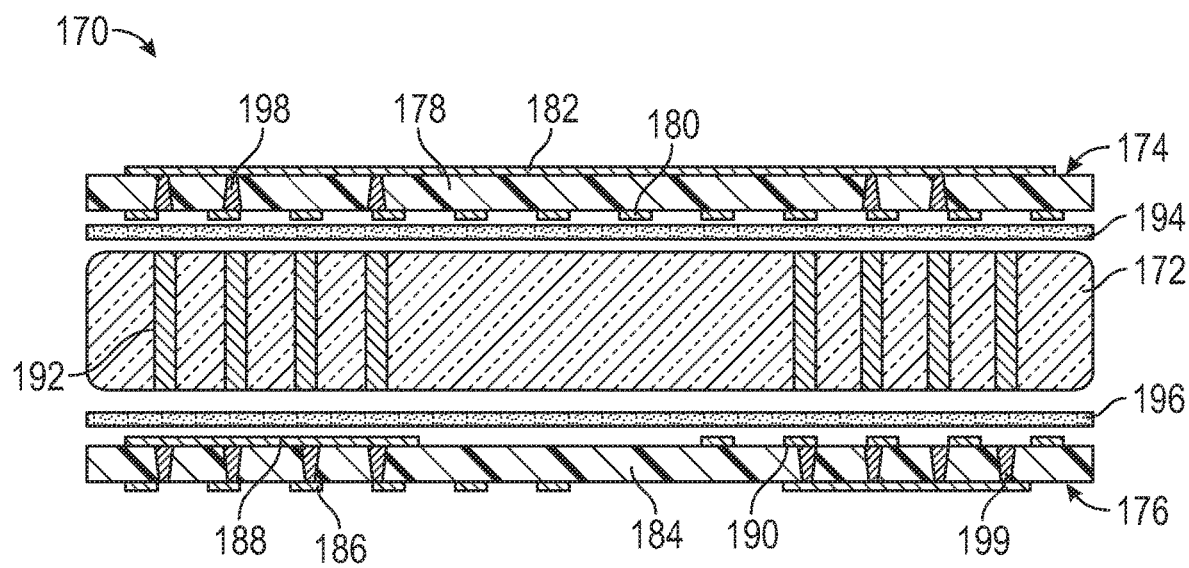
FIG. 26 is a transverse cross section of an alternate embodiment of a sensor assembly.

FIG. 26 is a transverse cross section of an alternate embodiment of a sensor assembly 170. Sensor assembly 170 includes first and second flexible circuit subassemblies 174 and 176 secured to a first surface 171 and a second surface 173, respectively, of a rigid substrate 172. A circuit element, such as an integrated circuit chip, is not shown in FIG. 26, although sensor assembly 170 may include such a circuit element. Rigid substrate 172 may comprise a rectangular, square, or cubic block made of glass or ceramic, or it may comprise a block with opposed first and second surfaces with rounded edges, as shown in FIG. 22 and described above. The first circuit subassembly 174 comprises a flexible substrate 178 with first conductive traces 180 and second conductive traces 182 disposed on opposed sides of the flexible substrate 178. The first conductive traces 180 may include a plurality of conductive lines made of a suitable conductive material, such as copper, tin, silver, nickel, aluminum, or gold and formed, etched, deposited, plated, or printed (e.g., by known lithographic techniques) onto or embedded into the flexible substrate 178 and are arranged side-by-side preferably without contacting one another and may be generally parallel with each other. Similarly, the second conductive traces 182 may include a plurality of conductive lines made of a suitable conductive material and are arranged side-by-side preferably without contacting one another and may be generally parallel to one another. The first conductive traces 180 are oriented transversely to the second conductive traces 182 and may be generally perpendicular thereto.

The second flexible circuit assembly 174 may comprise various conductors 186, 188, and 190 deposited on a flexible substrate 184. In an embodiment, conductors 186 may comprise connecting pads for connecting the sensor assembly to one or more external components, conductors 188 may comprise grounding conductors, and conductors 190 may comprise interconnects connecting to the vias 192.

The first flexible circuit subassembly 174 may include vias 198 (e.g., blind vias) extending through the flexible substrate 178 for connecting first conductive traces 180 located on the upper surface of the flexible substrate 178 to pads located on the lower surface of the flexible substrate 178, which pads are electrically joined to the vias 192 extending through the rigid substrate 172.

The second flexible circuit subassembly 176 may include vias 199 (e.g., blind vias) extending through the flexible substrate 184 for connecting conductors located on the upper surface of the flexible substrate 184 (e.g., conductors 188 and/or 190) to conductors located on the lower surface of the flexible substrate 184 (e.g., conductors 186).

The first and second flexible circuit subassemblies 174 and 176 may be secured to the rigid substrate 172 by first and second adhesive layers 194, 196, respectively, incorporating an adhesive technique described above.

Copper or sintered copper-glass conductive vias 192 (high temperature stability) connect the first and second traces 180, 182 to conductive elements (e.g., terminals 186 and interconnects 188 and 190) of the second flexible circuit subassembly 176. Although only eight (8) vias 192 are shown in FIG. 26, in various embodiments, one via is associated with each conductive trace 180, 182. The conductive elements of the second flexible circuit subassembly 176 are interconnected to the vias 192 using electrically conductive adhesive, anisotropically conductive film, or solder, e.g., hot bar soldering.

Figure 9:
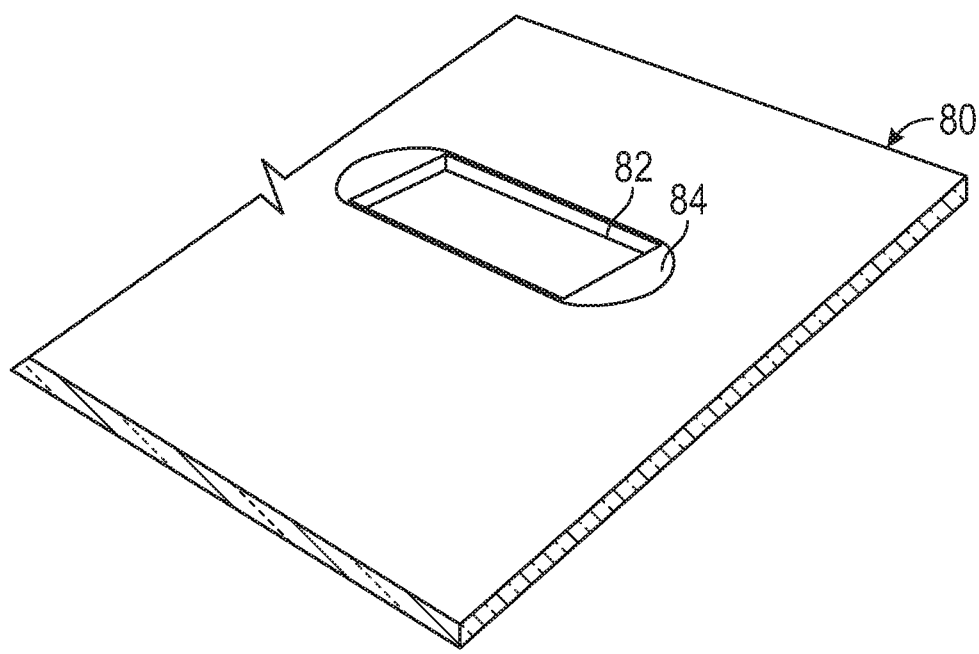
FIG. 9 is a partial top perspective view of a host device panel with a cutout formed therein for receiving a sensor assembly.
Figure 10:
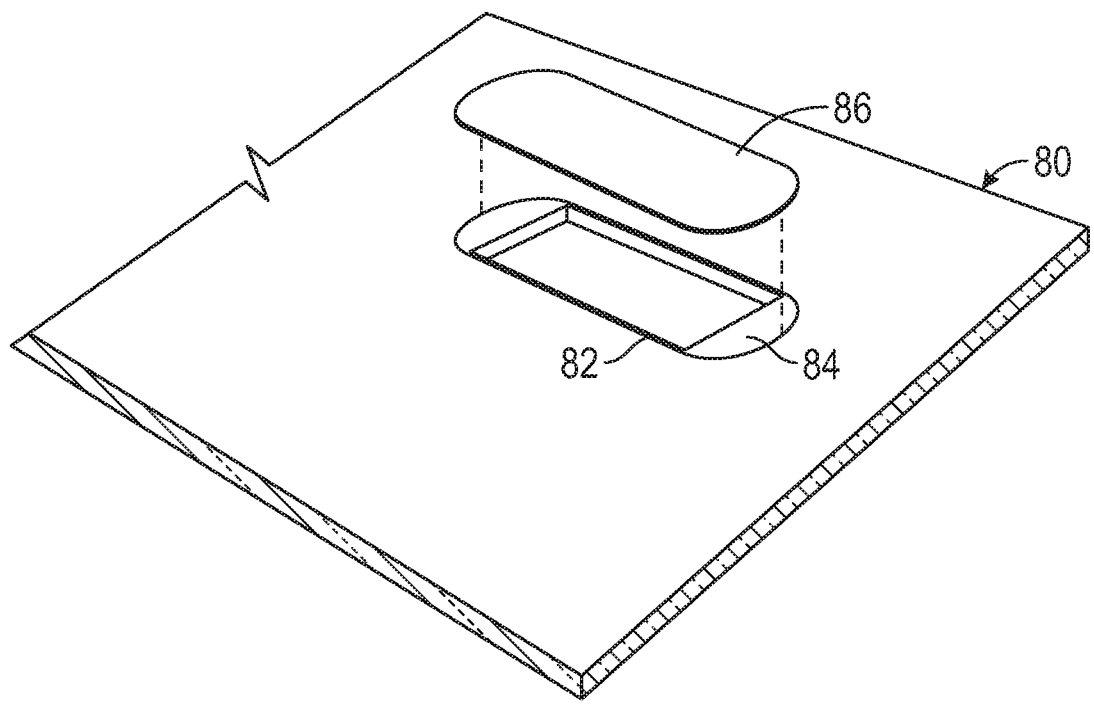
FIG. 10 is an exploded, partial top perspective view of the host device panel with a sensor assembly placed in the cutout and a cover panel disposed above the sensor assembly and the hole.
Figure 16:
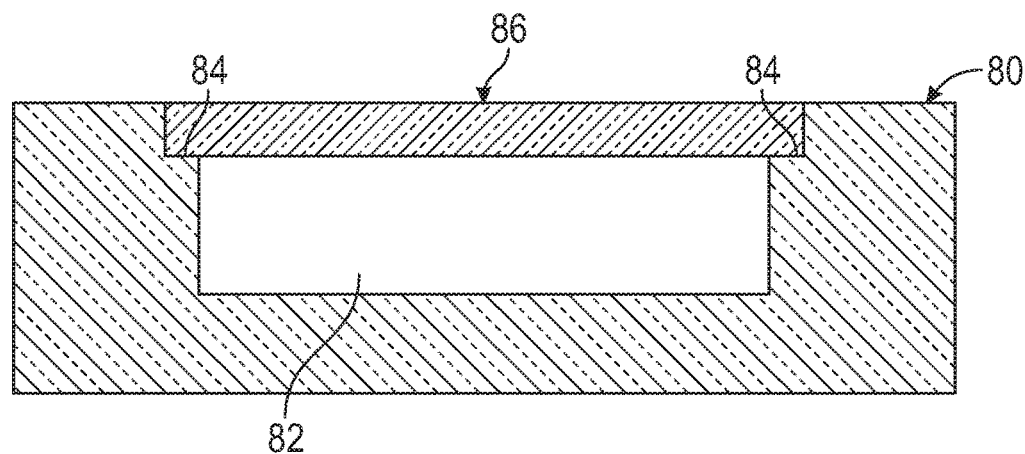
FIG. 16 is a partial transverse cross section of the host device panel with the cover panel mounted to the host device panel above sensor cutout.

A manner of installing a sensor assembly 10 (or 10') into a host device is illustrated in FIGS. 9, 10, and 16. FIG. 9 is a partial top perspective view of a host device panel 80 of a host device with a cutout 82 formed therein for receiving a sensor assembly. Cutout 82 may extend partially or completely through the host device panel 80. FIG. 10 is an exploded, partial top perspective view of the host device panel 80 with a sensor assembly 10 placed in the cutout 82 and a cover panel 86 disposed above the sensor assembly 10 and the cutout 82. FIG. 16 is a partial transverse cross section of the host device panel 80 with the cover panel 86 mounted to the host device panel 80 above sensor cutout 82 and with the sensor assembly omitted from the figure.

The sensor assembly 10 (or 10') when installed in the cutout 82 may be in contact with or positioned above the bottom of a blind cutout extending partially through the host device panel 80. If the cutout is formed completely through the host device panel 80, the bottom of the sensor assembly 10 (or 10') may be flush with, recessed above, or extending below a bottom surface of the host device panel 80. Accordingly, the sensor assembly and cover panel could be flush with the top of the host device panel while the sensor assembly protrudes beyond the bottom of the host device panel. The sensor assembly and cover panel could be flush with the top surface and the sensor assembly could be flush with the bottom surface of the host device panel. The sensor assembly and cover panel could be recessed from the top and bottom surfaces of the host device panel, or any combination of these, depending on what industrial design desires the customer has, and what is needed to have a sufficiently robust sensor assembly.

Where the bottom of the sensor assembly 10 (or 10') is flush with or recessed above the bottom surface of the host device panel 80, an additional closure panel may be provided to enclose the bottom opening of the cutout.

Host device panel 80 may comprise a glass panel that forms a display screen or interface screen (e.g., a touch screen) or some other surface of the host device. The sensor cutout 82 is formed in the device panel 80 and is preferably formed so as to conform in size and shape to the sensor assembly 10. Electrical connections can be provided in the sensor cutout 82 for connecting the sensor assembly 10 (or 10') to the host device. A recessed shelf 84 may be formed around the perimeter of the cutout 82. The depth of the cutout 82 below the shelf 84 may conform to the thickness of the sensor assembly 10, 10'. The cover panel 86 may have a shape corresponding to that of the shelf 84 and is placed on the shelf and is held there, e.g., by an adhesive, such as adhesives described herein, securing the cover panel 86 to the shelf 84 as well as to a sensor assembly disposed within the cutout 82, so as to enclose and secure the sensor assembly 10 within the cutout 82. Cover panel 86 may be made from the same material as the host device panel 80, such as glass. The thickness of the cover panel 86 may correspond to the depth of the shelf 84 so that the top surface of the cover panel 86 is preferably flush with a top surface of the host device panel 80. Alternatively, the thickness of the cover panel 86 may be less than the depth of the shelf 84 so that the top surface of the cover panel 86 is recessed with respect to the top surface of the host device panel 80, or the thickness of the cover panel 86 may be greater than the depth of the shelf 84 so that the top surface of the cover panel 86 protrudes above the top surface of the host device panel 80.

Cover panel 86 and host device panel 80 may be transparent or translucent.

Figure 31:
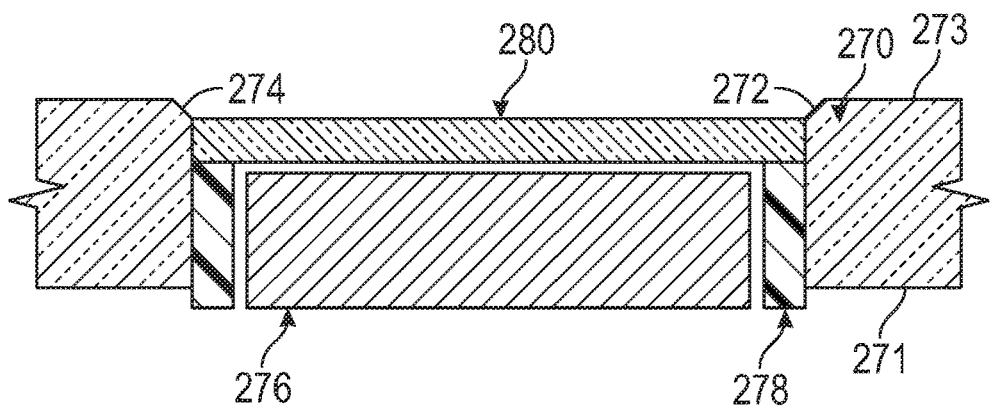
FIG. 31 is a partial transverse cross section of the host device panel with the spacer frame and sensor assembly disposed within the cutout and the cover panel mounted to the spacer frame and recessed with respect to a top surface of the host device panel.

An example of a recess mounted configuration is shown in FIG. 31. In FIG. 31, the sensor assembly 276 is disposed in a through-formed cutout 272 formed in the host device panel 270 with a bottom end of the sensor assembly 276 protruding below the lower surface 271 of the host device panel 270. The illustrated configuration is exemplary; sensor assembly could be disposed in a blind cutout formed partially through the host device panel. A cover panel 280 is positioned above the sensor assembly 276 in a position recessed below a top surface 273 of the host device panel 270. Such a recessed configuration may be advantageous in that it helps guide the user's finger to a correct position on the sensor surface and it may protect the sensor assembly and the cover panel from potentially damaging impact by preventing objects that are larger than the width or length of the cutout from making contact with the cover panel. Edges of the cutout may be beveled as shown at 274 or may be rounded to avoid sharp edges that may cause discomfort to the user's finger and to further assist in guiding the user's finger to a proper position with respect to the sensor surface. Beveling the cutout edges may also remove chip outs and micro-cracks formed at the cutout edges during the machining process.

In various embodiments, the adhesive securing the cover panel to the top (sensor) surface of the sensor assembly is the same adhesive that is used, or may be used, to secure the circuit subassembly to the rigid substrate. As described above, suitable adhesives include a pressure sensitive adhesive ("PSA") (available in sheet form, screen printed, or applied via mask deposition potentially less than 10 μm thick and UV curable), B-staged sheet adhesive, or bond ply adhesive. Exemplary suitable adhesives include acrylic-based thermoset adhesives, such as DuPont Pyralux LF or Pyralux FR sheet adhesive or bond ply adhesive. The adhesive securing the cover panel to the sensor surface may comprise high modulus of elasticity/highly cross-linked, epoxy-type thermoset adhesives and/or adhesive with particle fillers, nano-fillers, or other fillers to further increase the modulus of elasticity of the adhesive. Again, in various embodiments, such adhesive fillers can also be used to tailor other properties of the adhesives, such as rigid filler materials with high dielectric constants to reduce negative impact of the adhesive thickness on the signal to noise ratio.

Figure 11:
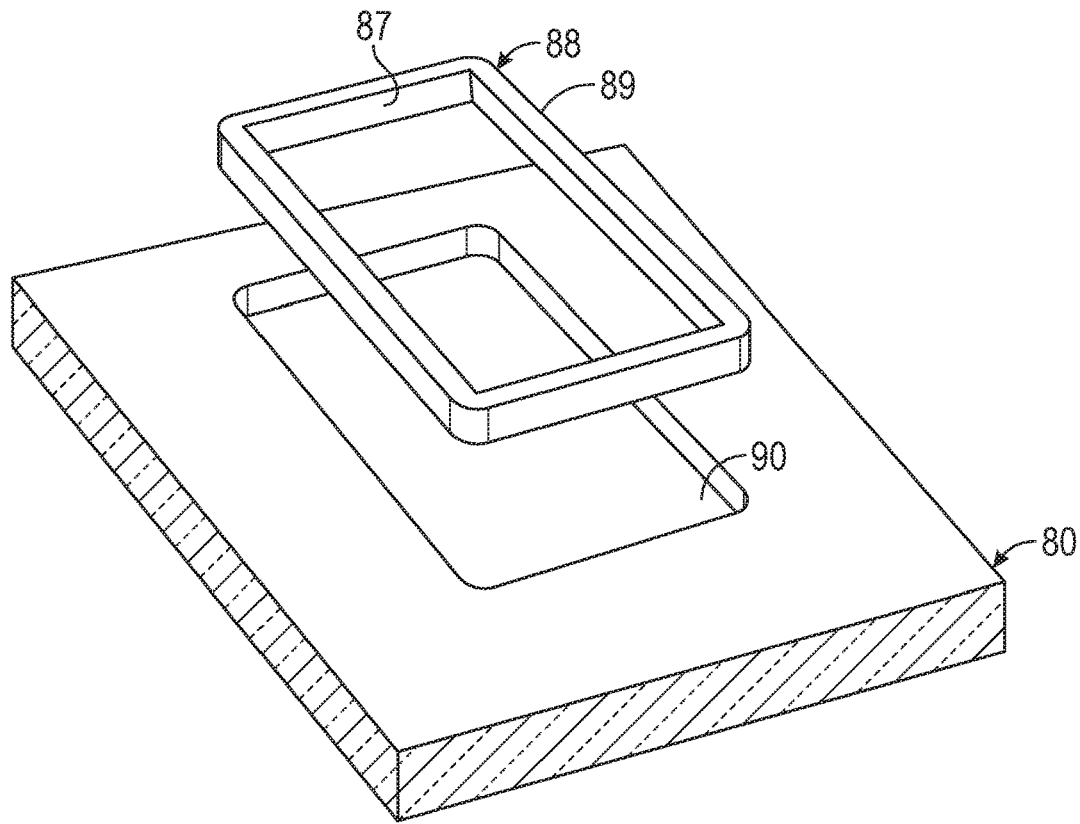
FIG. 11 is an exploded, partial top perspective view of an alternate embodiment of the host device panel with a cutout formed in the host device panel and a spacer frame for mounting a sensor assembly within the cutout.
Figure 12:
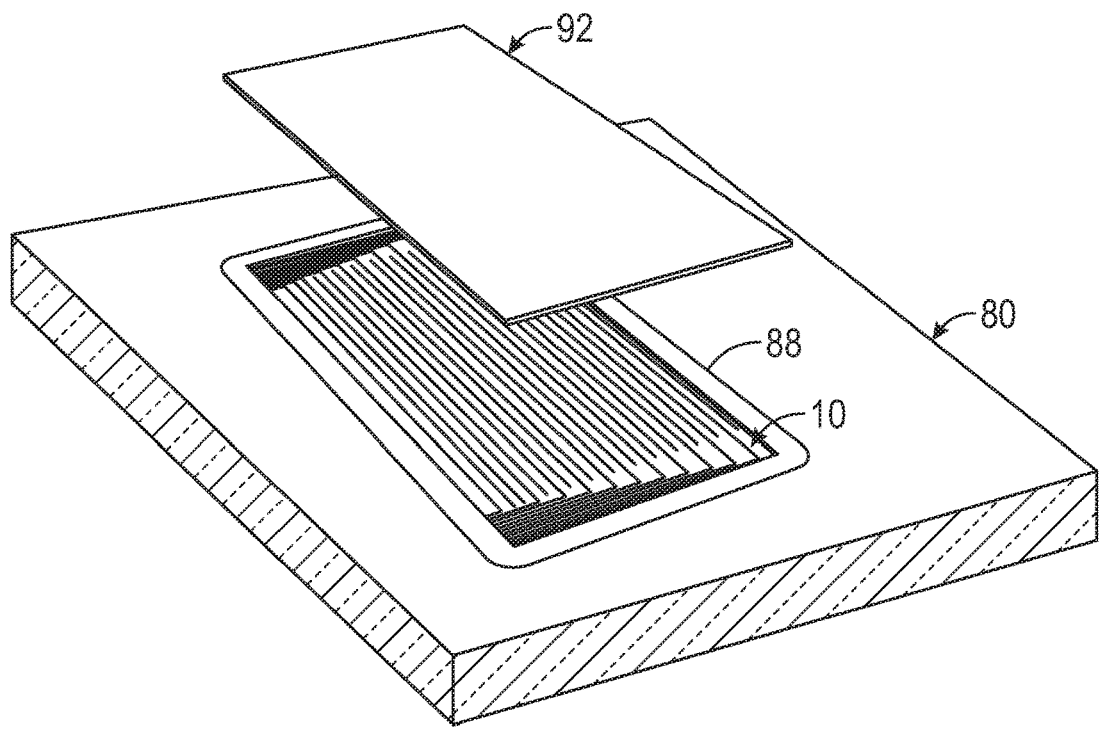
FIG. 12 is an exploded, partial top perspective view of the host device panel with the spacer frame of FIG. 11 disposed within the cutout, a sensor assembly disposed within the spacer frame and a cover panel disposed above the spacer frame and the sensor assembly.
Figure 17:
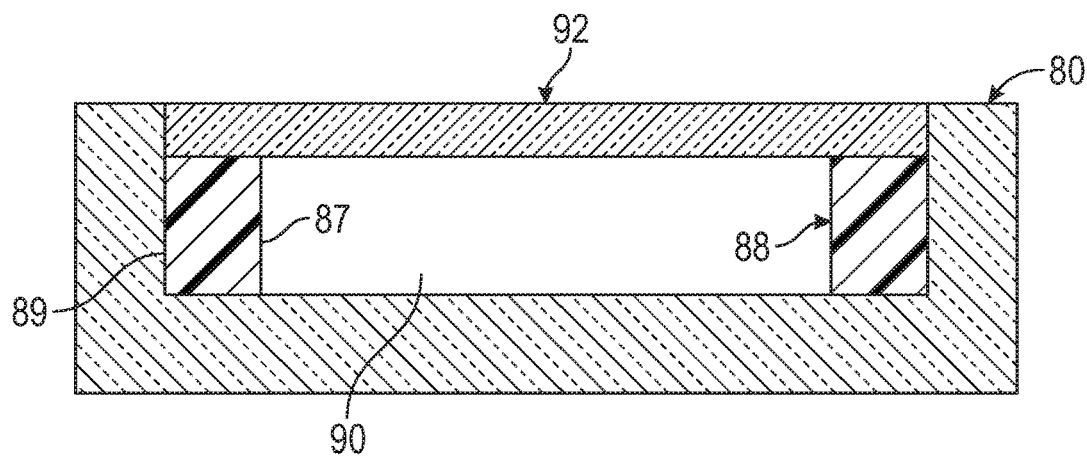
FIG. 17 is a partial transverse cross section of the host device panel with the spacer frame disposed within the cutout and the cover panel mounted to the spacer frame.

An alternate manner of installing a sensor assembly 10 (or 10') into a host device is illustrated in FIGS. 11, 12, and 17. FIG. 11 is an exploded, partial top perspective view of the host device panel 80 with a cutout 90 formed in the host device panel 80 and a spacer frame or formed gasket 88 for mounting a sensor assembly within the cutout 90. FIG. 12 is an exploded, partial top perspective view of the host device panel 80 with the spacer frame 88 disposed within the cutout 90, a sensor assembly 10 disposed within the spacer frame 88, and a cover panel 92 disposed above the spacer frame 88 and the sensor assembly 10. FIG. 17 is a partial transverse cross section of the host device panel 80 with the spacer frame 88 disposed within the cutout 90 and the cover panel 92 mounted to the spacer frame 88 above the cutout 90 (the sensor assembly is omitted from FIG. 17).

In an embodiment, the spacer frame 88 has a generally rectangular shape (or alternately square shape) with an inner perimeter 87 that conforms in size and shape to the sensor assembly 10 and an outer perimeter 89 that conforms in size and shape to the cutout 90. The spacer frame 88 may be made of a dimensionally stable material that is readily formed into the desired shape, such as a machinable or moldable plastic, such as Delrin®), liquid crystal polymers, Polybutylene Terephthalate (PBT), or other commonly molded or machined engineered polymers. Conductive polymers can be used for the spacer frame in order to provide electrostatic discharge ("ESD") bleed-off to protect the sensor from ESD damage. While the materials listed above are not intrinsically conducting polymers, they can be made conductive with the appropriate fillers, such as, carbon or graphite, etc. Exemplary formulations and manufacturers include RTP Company (RTP ESD C-1000), Westlake Plastics Company (Propylux CN-P conductive polypropylene), Westlake Plastics Company (Pomalux CN-P conductive copolymer acetal), and PolyOne Corporation (StatTech NN-20CF). Spacer 88 may also be a gasket formed in place using over-molding processes that are formed in place and designed to fill tolerance gaps.

The sensor assembly 10 is disposed within the spacer frame 88 and the combination of the sensor assembly 10 and the spacer frame 88 is disposed within the cutout 90. The cover panel 92 has a shape corresponding to the shape of the cutout 90 and is disposed on a top surface of the spacer frame 88 over the spacer frame 88 and the sensor assembly 10. The depth of the cutout 90 may correspond to the combined thicknesses of the spacer frame 88 and the cover panel 92 so that the top surface of the cover panel 92 is flush with the surface of the host device panel 80. The thickness of the spacer frame 88 may correspond to the thickness of the sensor assembly 10 or 10'. Alternatively, the depth of the cutout 90 may be greater than the combined thicknesses of the spacer frame 88 and the cover panel 92 so that the top surface of the cover panel 92 is recessed with respect to the top surface of the host device panel 80, or the depth of the cutout 90 may be less than the combined thicknesses of the spacer frame 88 and the cover panel 92 so that the top surface of the cover panel 92 is protrudes above the top surface of the host device panel 80.

The spacer frame 88 may be held within the cutout 90 by an adhesive, such as an epoxy-based adhesive or other adhesive described herein or otherwise having properties described herein. The size of the spacer frame preferably conforms to the size of the cutout 90, although a small gap may be provided between the outer perimeter 89 of the spacer frame 88 and the cutout 90 to accommodate an adhesive bond. In one embodiment, the spacer frame 88 may be slightly smaller than the cutout 90 and then heated during assembly to expand the spacer frame to hold it in place for gluing.

The sensor assembly 10 may be secured to the spacer frame 88 by a liquid adhesive, such as an adhesive described herein, with very low viscosity that flows into a small gap between the spacer frame 88 and the sensor assembly 10 or 10'. Alternatively, the sensor assembly 10 may be secured to the spacer frame 88 by an "interference fit" whereby the sensor assembly, having a glass, ceramic, or other rigid substrate 20, is pushed under controlled pressure into the spacer frame 88. The spacer frame 88 may be made from a material, such as plastic, amenable to some elastic deformation so that the frame mechanically "gives" to allow the sensor assembly to be pressed into the frame.

In various embodiments, a material that is compliant is selected for the spacer frame so that the frame can function as a shock absorber to minimize potential damage to the cover panel and/or the sensor assembly from impact. Exemplary materials include elastomers, such as silicone-based materials, polymer foams, such as Rogers Poron® open or closed cell foams, silicone foams, such as Rogers Bisco® foams, etc.

In various embodiments, the spacer frame is made from a material that is both conductive and compliant, such as, conductive thermoplastic or thermosetting molding compounds, conductive foams, conductive silicones, etc.

Alternatively, the sensor assembly may be secured to the spacer frame by an "interference fit", whereby a spacer frame material is chosen which softens at elevated temperature, such as a polymeric material with a low glass transition temperature or a low melting temperature thermoplastic polymer, such that the insertion may be performed at elevated temperature so that the spacer more easily stretches or "gives" mechanically to allow the sensor assembly to be pressed into the tight fitting spacer frame, then upon cooling providing a tighter and secure fit. Alternatively, a spacer frame material may be chosen that has a differential coefficient of thermal expansion with respect to the sensor assembly and by heating or cooling one or both of the spacer frame and the sensor assembly, a looser fit may be achieved to ease assembly, with a tight and secure fit resulting when the assembly is returned to room temperature.

The cover glass 92 may be secured to the spacer frame 88, and in some embodiments also to the sensor assembly 10, by a suitable adhesive. As described above, suitable adhesives include a pressure sensitive adhesive ("PSA") (available in sheet form, screen printed, or applied via mask deposition potentially less than 10 µm thick and UV curable), B-staged sheet adhesive, or bond ply adhesive. Exemplary suitable adhesives include acrylic-based thermoset adhesives, such as DuPont Pyralux LF or Pyralux FR sheet adhesive or bond ply adhesive. The adhesive securing the cover panel to the sensor surface may comprise high modulus of elasticity/highly cross-linked, epoxy-type thermoset adhesives and/or adhesive with particle fillers, nano-fillers, or other fillers to further increase the modulus of elasticity of the adhesive. Again, in various embodiments, such adhesive fillers can also be used to tailor other properties of the adhesives, such as rigid filler materials with high dielectric constants to reduce negative impact of the adhesive thickness on the signal to noise ratio.

Figure 35:
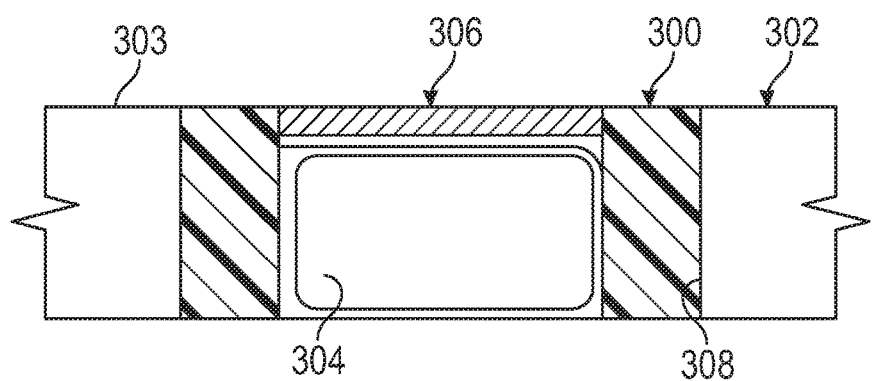
FIG. 35 is a partial transverse cross section of the host device panel with a spacer frame and a cover panel mounted above the sensor assembly and within the spacer frame.

An alternative spacer frame 300 is shown in FIG. 35, which is a partial transverse cross section of the host device panel 302 with the spacer frame 300 disposed within a cutout 308 that extends completely through the host device panel 302, an insert 304 (e.g., a sensor assembly) located within the cutout 308, and a cover panel 306 mounted within the spacer frame 300 (as opposed to on top of the spacer frame as in the embodiment of FIG. 17).

Cover panel 306 and host device panel 302 may be transparent or translucent and may be made from glass. The spacer frame 300 may be formed of any of the materials described herein for forming a spacer frame. The spacer frame may be configured and installed so that the cover panel 306 is flush with a top surface 303 of the host device panel 302 (as shown), recessed with respect to the top surface 303, or protruded above the top surface 303.

The illustrated configuration in FIG. 35 is exemplary; sensor assembly could be disposed in a blind cutout formed partially through the host device panel. The various components, such as the spacer frame 300, the cover panel 306, and the insert 304 may be secured to the host device panel 302 and/or each other by an adhesive, such as an epoxy-based adhesive or other adhesive described herein or otherwise having properties described herein.

Figure 32:
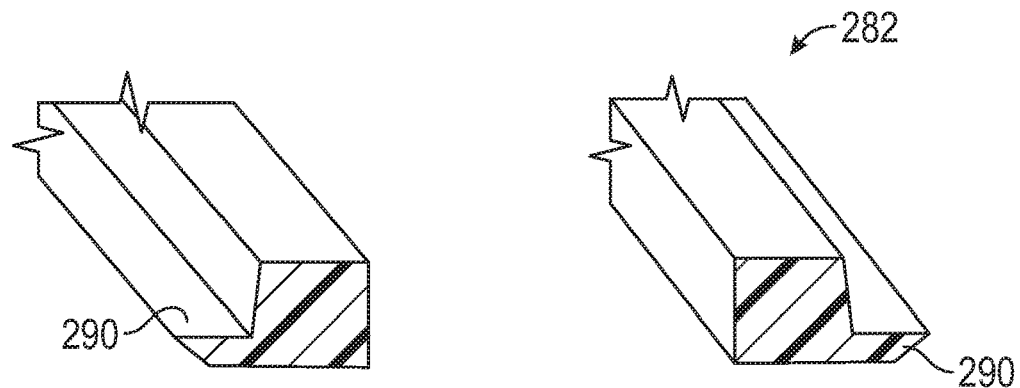
FIG. 32 is partial perspective view in cross-section of an alternate embodiment of a spacer frame.
Figure 33:
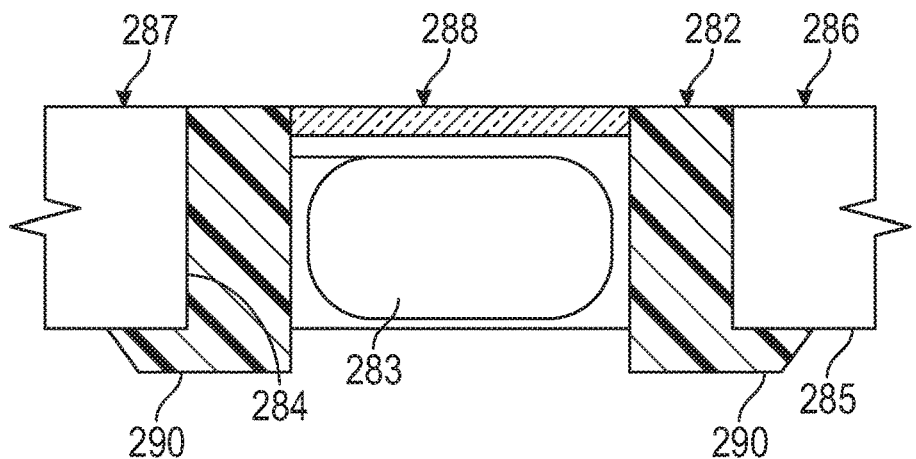
FIG. 33 is a partial transverse cross section of the host device panel with the spacer frame of FIG. 32 and the cover panel mounted within the spacer frame above the sensor assembly.

An alternative spacer frame 282 is shown in FIGS. 32 and 33. A cutout 284 is formed though the host device panel 286, the spacer frame is 282 disposed within the cutout 284, an insert 283 (e.g., a sensor assembly) is located within the cutout 284, and a cover panel 288 is mounted within the spacer frame 282. Cover panel 288 and host device panel 286 may be transparent or translucent and may be made from glass. The spacer frame 282 may be formed of any of the materials described herein for forming a spacer frame.

The spacer frame 282 has a lower peripheral shelf 290 extending laterally outwardly from a lower side of the spacer frame 282 and extends partially or complete around the perimeter of the spacer frame. When installed, the shelf 290 abuts the lower surface 285 of the host device panel 286 around the lower perimeter of the cutout 284. During manufacture of the host device panel and installation of the spacer frame 282 into the cutout 284, the shelf 290 may act as a "hard stop" to ensure that the spacer frame 282 is not inserted too far into the cutout 284. The lower shelf 290 of the spacer frame 282 may also act as a shock absorber to dissipate any impact on the frame and/or cover panel 288.

The height of the spacer frame 282 above the shelf 290 may correspond to the thickness of the host device panel so that the top of the spacer frame is flush with the top surface of the host device panel 290 so that a cover panel 288 disposed within the spacer frame 282 is flush with a top surface 287 of the host device panel 286. Alternatively, the height of the spacer frame above the shelf may be less than the thickness of the host device panel so that the top of the spacer frame and cover panel are recessed with respect to the top surface the host device panel, or the height of the spacer frame above the shelf may be greater than the thickness of the host device panel so that the top of the spacer frame and cover panel extend above the top surface of the host device panel.

The various components, such as the spacer frame 282, the cover panel 288, and the insert 283 may be secured to the host device panel 286 and/or each other by an adhesive, such as an epoxy-based adhesive or other adhesive described herein or otherwise having properties described herein. Further, the configuration illustrated in FIG. 33 is exemplary. In an alternative, the cover panel may be disposed on top of the spacer frame as shown in FIG. 17, disposed within a shelf cut into the spacer frame as shown in FIG. 16, or coupled to the spacer frame in any other manner described herein.

In a further embodiment, in any of the spacer frame embodiments described above, the cover need not be the same size and shape as that of the surface of the sensor or the top surface or inner perimeter of the spacer frame. For example, in FIG. 34, for the spacer frame 310, the cover panel 312 is smaller (in length and/or width) than a top surface of the sensor assembly 314 disposed within the cutout 316 formed in the host device panel 318 and is correspondingly smaller (in length and/or width) than the inner perimeter of the spacer frame 310. In various embodiments, the gap 320 between the edge of the cover panel 312 and the inner perimeter of the spacer frame 310 can be filled with a hardenable, flowable encapsulant material, such as an epoxy or the like.

The various components, such as the spacer frame 310, the cover panel 312, and the sensor assembly 314 may be secured to the host device panel 318 and/or each other by an adhesive, such as an epoxy-based adhesive or other adhesive described herein or otherwise having properties described herein.

Figure 34:
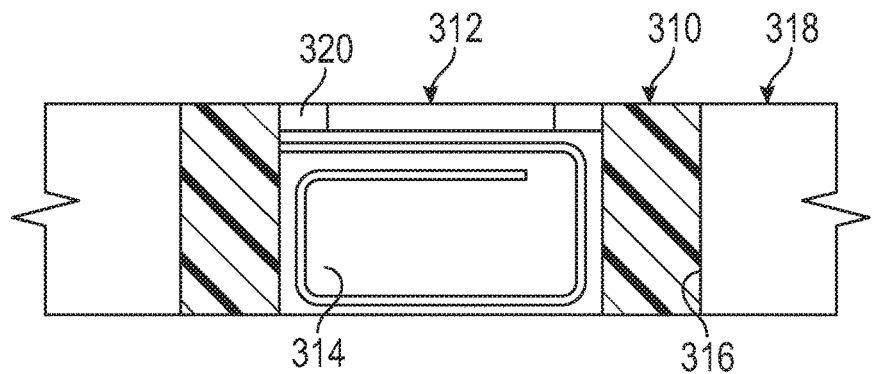
FIG. 34 is a partial transverse cross section of the host device panel with a spacer frame and an under-sized cover panel mounted within the spacer frame above the sensor assembly.

In a variation of the embodiment shown in FIG. 34, the cover panel may be disposed above—as opposed to within—the spacer frame, and the cover panel may not be smaller (in length and/or width) than the top surface of the sensor assembly or the inner perimeter of the spacer frame. In such a configuration the gap between the edge of the cover panel and the inner perimeter of the cutout can be filled with a hardenable, flowable encapsulant material, such as an epoxy or the like.

Figure 13:
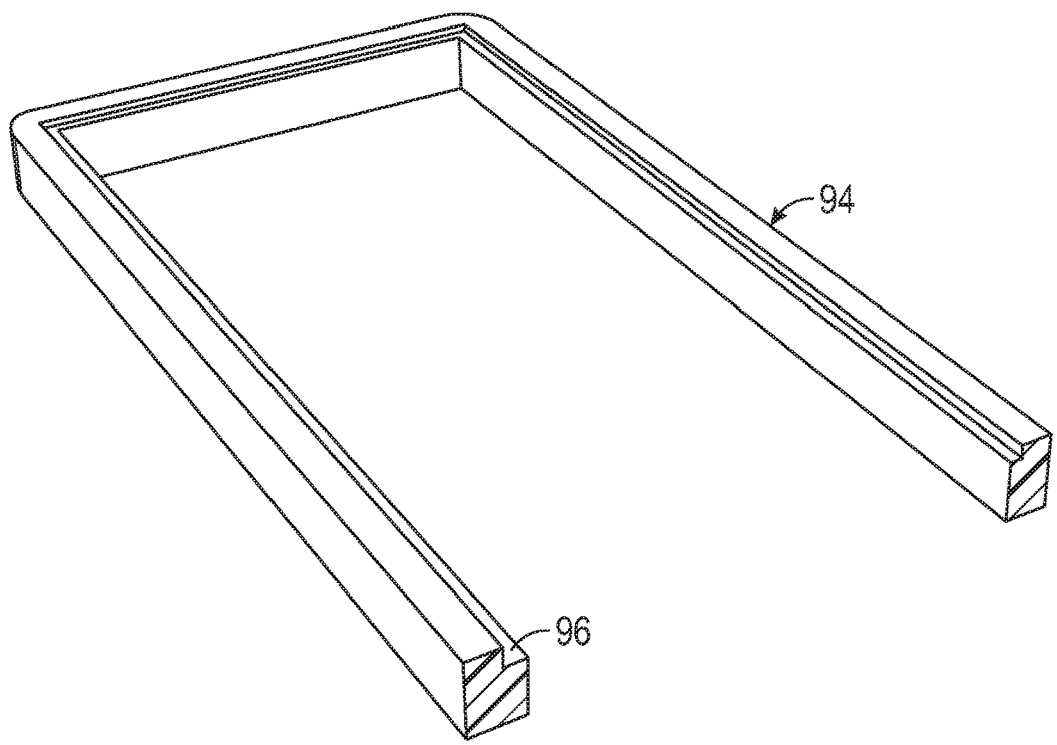
FIG. 13 is a perspective view in cross-section of an alternate embodiment of a spacer frame.
Figure 14:
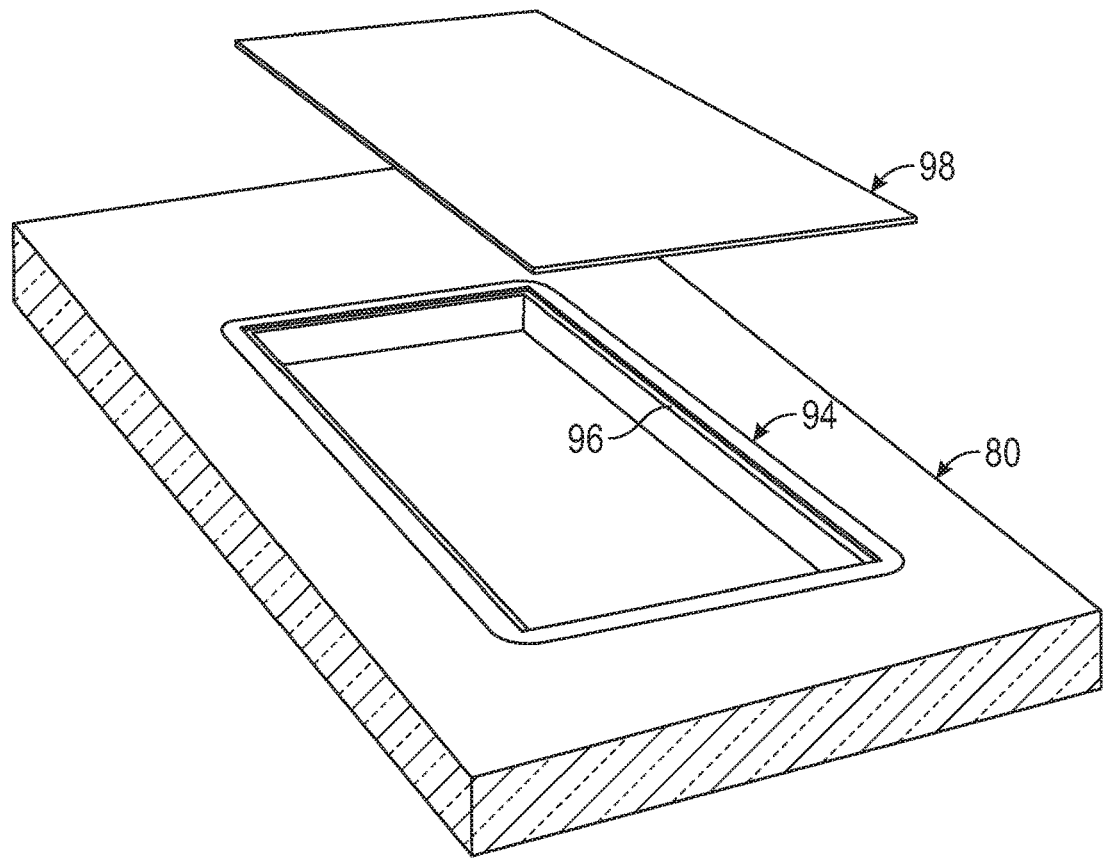
FIG. 14 is an exploded, partial top perspective view of a host device panel with the alternate spacer frame of FIG. 13 disposed within the cutout and a cover panel disposed above the spacer frame.
Figure 18:
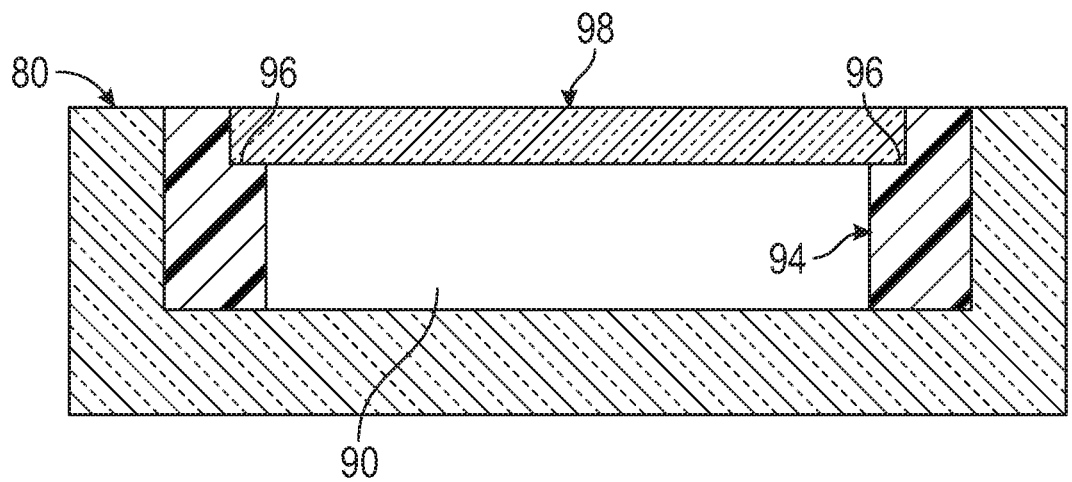
FIG. 18 is a partial transverse cross section of the host device panel with the spacer frame of FIG. 13 disposed within the cutout and the cover panel mounted to the spacer frame.

An alternate spacer frame for installing a sensor assembly 10 (or 10') into a host device is illustrated in FIGS. 13, 14, and 18. FIG. 13 is perspective view in cross-section of a first alternate embodiment of a spacer frame 94. FIG. 14 is an exploded, partial top perspective view of the host device panel 80 with the spacer frame 94 disposed within a cutout formed in the host device panel 80 and a cover panel 98 disposed above the spacer frame 94 (the sensor assembly is omitted in FIG. 14). FIG. 18 is a partial transverse cross section of the host device panel 80 with the first alternate embodiment of the spacer frame 94 disposed within the cutout 90 and the cover panel 98 mounted to the spacer frame 94 (the sensor assembly is omitted from FIG. 18).

Spacer frame 94 differs from spacer frame 88 described above in that it includes a recessed shelf 96 surrounding the inner perimeter to accommodate the cover panel 98. The cover panel 98 has a shape corresponding to the shape of the shelf 96. The depth of the cutout 90 may correspond to the thicknesses of the spacer frame 94, and the depth of the shelf 96 may correspond to the thickness of the cover panel 98 so that the top surface of the cover panel 98 and the top surface of the spacer frame 94 are flush with the top surface of the host device panel 80. Alternatively, the depth of the shelf 96 may be greater than the thickness of the cover panel 98 so that the top surface of the cover panel 98 is recessed with respect to the top surface of the host device panel 80, or the depth of the shelf 96 may be less than the thickness of the cover panel 98 so that the top surface of the cover panel 98 protrudes above the top surface of the host device panel 80.

The cover glass 98 may be secured to the shelf 96 of the spacer frame 94, and in some embodiments also to the sensor assembly, by a suitable adhesive, such as a pressure sensitive adhesive and/or one or more other adhesives described herein or otherwise having properties described herein.

Figure 15:
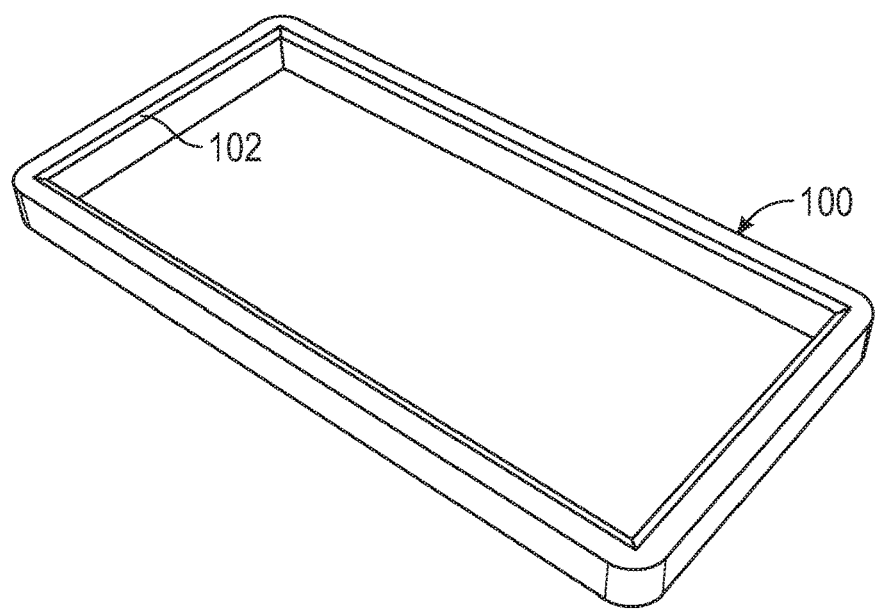
FIG. 15 is a perspective view of an alternate embodiment of a spacer frame.
Figure 19:
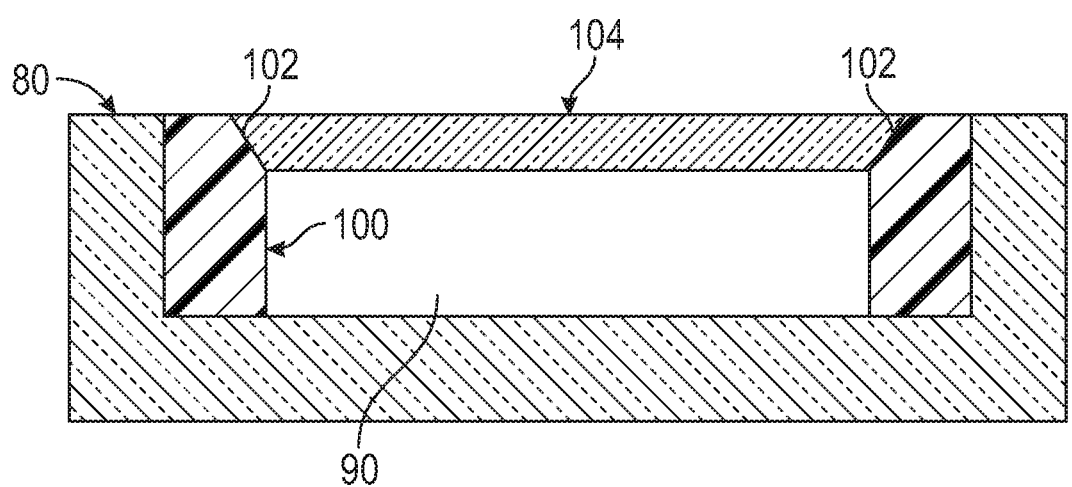
FIG. 19 is a partial transverse cross section of the host device panel with the spacer frame of FIG. 15 disposed within the cutout and the cover panel mounted to the spacer frame.

An alternate spacer frame for installing a sensor assembly 10 (or 10') into a host device is illustrated in FIGS. 15 and 19. FIG. 15 is perspective view of the second alternate embodiment of a spacer frame 100. FIG. 19 is a partial transverse cross section of the host device panel 80 with the spacer frame 100 disposed within the cutout 90 and the cover panel 104 mounted to the spacer frame (the sensor assembly is omitted from FIG. 19).

Spacer frame 100 differs from spacer frames 88 and 94 described above in that it includes a bevel 102 surrounding the inner perimeter. The cover panel 104 is slightly larger than the inner perimeter of the spacer frame 100 and may or may not be beveled about its peripheral edge. The cover panel 104 is pressed into the spacer frame 100, with the bevel 102 causing a wedging of the cover panel 104 into the spacer frame 100.

In an embodiment the thickness of the spacer frame 100 and the cover panel 104, the size of the bevel 102 and the depth of the cutout 90 are such that the sensor assembly is securely held within the cutout 90 and the top surface of the cover panel 104 and the top of the spacer frame 100 are flush with the surface of the host device panel 80. In various embodiments, the cutout is formed through the host device panel. Alternatively, the configuration may be such that the top surface of the cover panel 104 and the top of the spacer frame 100 are recessed below or protrude above the surface of the host device panel 80.

The cover panel 104 may be secured to the bevel 102 of the spacer frame 100, and in some embodiments also to the sensor assembly, by a suitable adhesive, such as a pressure sensitive adhesive and/or one or more other adhesives described herein or otherwise having properties described herein.

In an alternate embodiment, the cover panel may comprise a hardenable polymeric resin coating disposed over a top surface of the sensor assembly disposed in the cutout. The coating may comprises a highly cross-linked polymer with embedded glass nano-particles at high packing density to provide look/feel/hardness of glass. After the sensor assembly is installed in the cutout at a precisely controlled depth below the plane of the host device panel outer surface, the coating may be printed, dispensed, or molded into the cutout and over the sensor assembly to a desired depth (e.g., flush, recessed, or projecting with respect to the plane of the outer surface of the host device panel).

In an alternate embodiment, rather than placing the sensor assembly into a cutout formed in the host device panel and then enclosing the sensor assembly within the cutout with a cover panel, a portion of the host device panel can be thinned in a location where the sensor assembly will be installed. Localized thinning of the host device panel could be accomplished, e.g. by patterned etching. The sensor assembly could be installed in the host device panel "under glass" in the area of thinning.

In an alternate embodiment, the cover panel and/or the spacer frame is molded in place in the host device panel. Such processes may comprise film-assisted over-molding with mold flow channels through the glass, other tooled molding options, or dispensing of a curable material encapsulating the sensor assembly. Mold flow channels are access points to get the molding compound into the area to be molded and allow the molten polymer or composite material to be forced into the area to be molded, using pressure and/or gravity and/or surface tension/capillary action. Alternatively, the material may be introduced by injection molding, the mold is sealed except for these channels for introduction of the molding compound and for evacuation of air during that injection.

Figure 36:
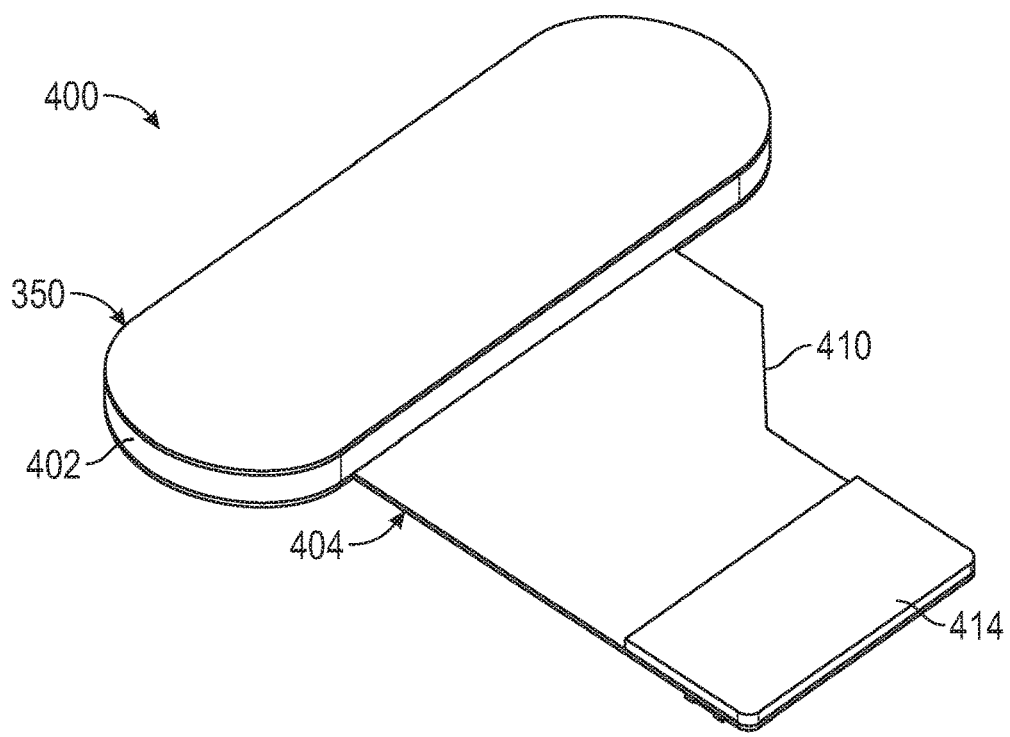
FIG. 36 is a top perspective view of an embodiment of a sensor assembly having a two-panel flexible circuit subassembly that is wrapped over only first and second opposed surfaces of a rigid substrate
Figure 37:
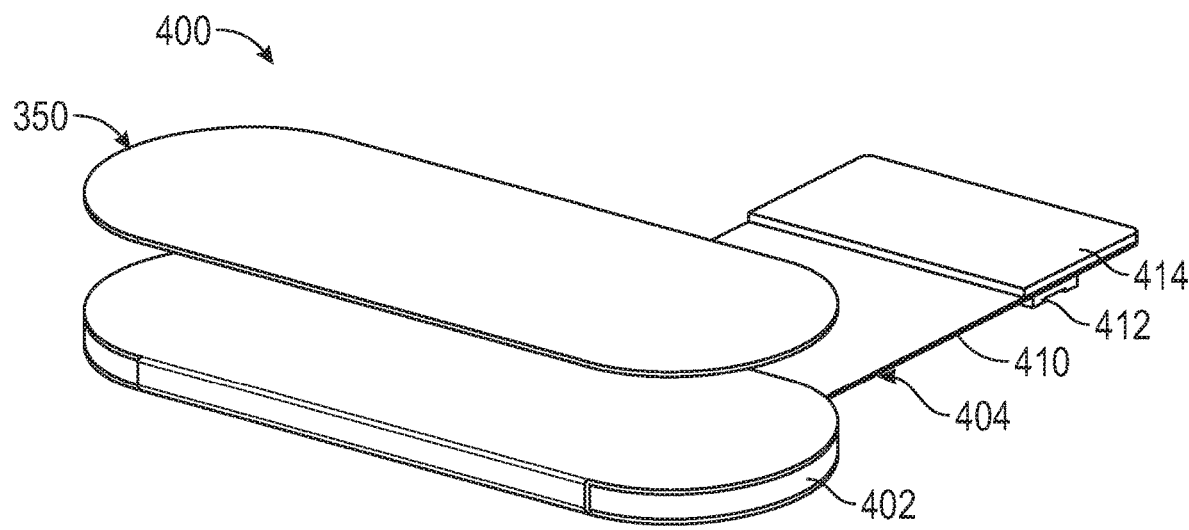
FIG. 37 is a top perspective view of an embodiment of the sensor assembly with the cover panel lifted above the sensor assembly.
Figure 38:
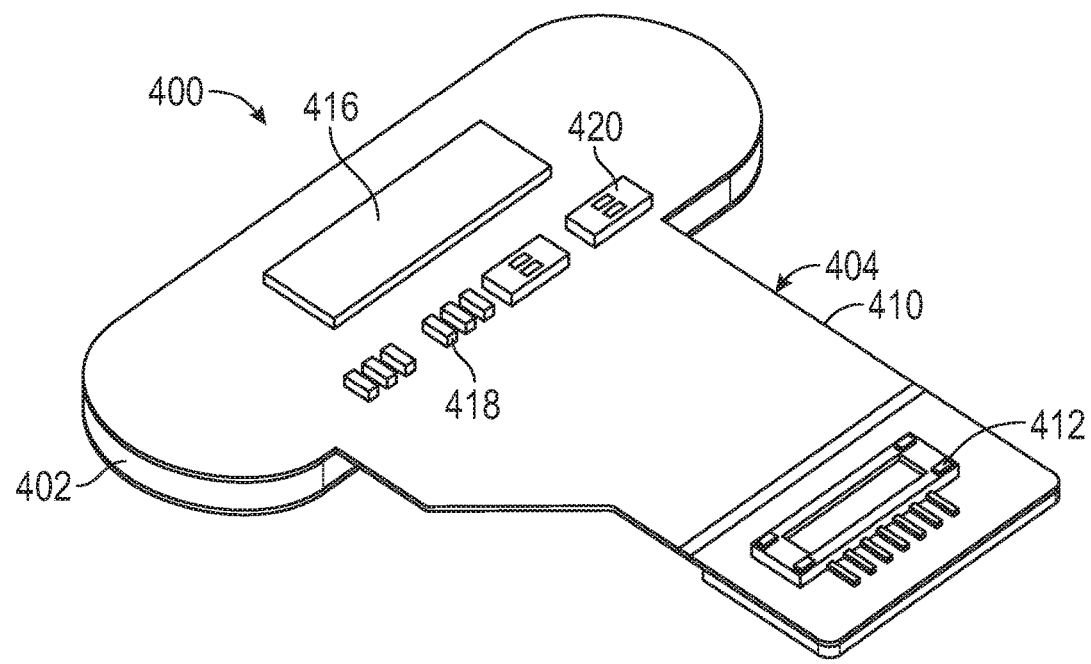
FIG. 38 is a bottom perspective view of the sensor assembly of FIG. 36

FIGS. 36-38 are a top and bottom perspective view, respectively, of an embodiment of a sensor assembly 400 in which a two-panel flexible circuit subassembly is wrapped over only first and second, opposed surfaces of a rigid substrate, similar to the embodiment shown in FIG. 25 and described above.

The sensor assembly 400 includes a flexible circuit subassembly 404 wrapped around upper and lower opposed planer surfaces of a rigid substrate 402. As with the embodiment of FIG. 25, the flexible circuit subassembly 404 of the sensor assembly 400 is not wrapped completely around the rigid substrate 402, but is only wrapped over the upper and lower surfaces and one edge of the rigid substrate 402. The rigid substrate 402 of sensor assembly 400 has a shape as shown in FIG. 27 with a first surface (e.g., a top surface), second surface (e.g., a bottom surface opposite the top surface and optionally parallel thereto), opposed first and second edges that are optionally parallel to each other, and rounded first and second ends and a flexible circuit subassembly 404 with panels having shapes corresponding to the shapes of the top and bottom surfaces of the rigid substrate. Alternatively, the rigid substrate may have a rectangular shape or any other shape such as those described elsewhere herein. The rigid substrate may be made of any materials and have any characteristics, e.g., flatness, described herein. The flexible circuit subassembly may be secured to the rigid substrate in any manner described herein by which a flexible circuit subassembly or flexible substrate is secured to a rigid substrate.

The flexible circuit subassembly 404 includes a flexible substrate material with conductive traces formed or disposed thereon, as described above and as will be further described below, and may include a host connector tab 410 extended away from the rigid substrate 402. Connector tab 410 may include a connector 412 (such as a plug) disposed on one side of an end of the connector tab 410 (e.g., on the bottom side) that is configured to provide an electrical connection between the sensor assembly 400 and the host device. A stiffener 414 (comprising, e.g., a polyimide card or plate) may be connected on the flexible substrate on a side opposite the connector 412. In the illustrated embodiment, as shown in FIG. 38, the connector 412 is disposed on a bottom surface of the connector tab 410 and the stiffener 414 is disposed on a top surface of the connector tab 410. In an alternate embodiment, the connector 412 is disposed on the top surface of the connector tab 410 and the stiffener 414 is disposed on the bottom surface.

In an alternate embodiment, the host connector tab does not form part of the sensor assembly. Instead, a two-lobed flexible substrate could be provided and the tab could be attached later to the assembled sensor assembly using, for example, a ball-grid array arrangement.

The flexible circuit subassembly 404 may further include a circuit element (such as an integrated circuit or ASIC) 416 as well as various other components such as inductors 418 and capacitors 420 secured to an outer surface of the flexible circuit subassembly 404. In an alternate embodiment, circuit element (integrated circuit) and/or other circuit components may be disposed on an inner surface of the flexible circuit subassembly and disposed in one or more recesses formed in the rigid substrate.

As described above, the sensor assembly 400 may be installed within an opening formed in a host device panel (not shown in FIGS. 36-38) and may be covered with a cover panel 350 that is installed so as to be flush with, recessed below, or protruding above the surface of the host device panel as described in various embodiments above. Cover panel 350 may comprise any cover panel made of materials and having any characteristics described herein and may be mounted and secured in any manner described herein.

Figure 39:
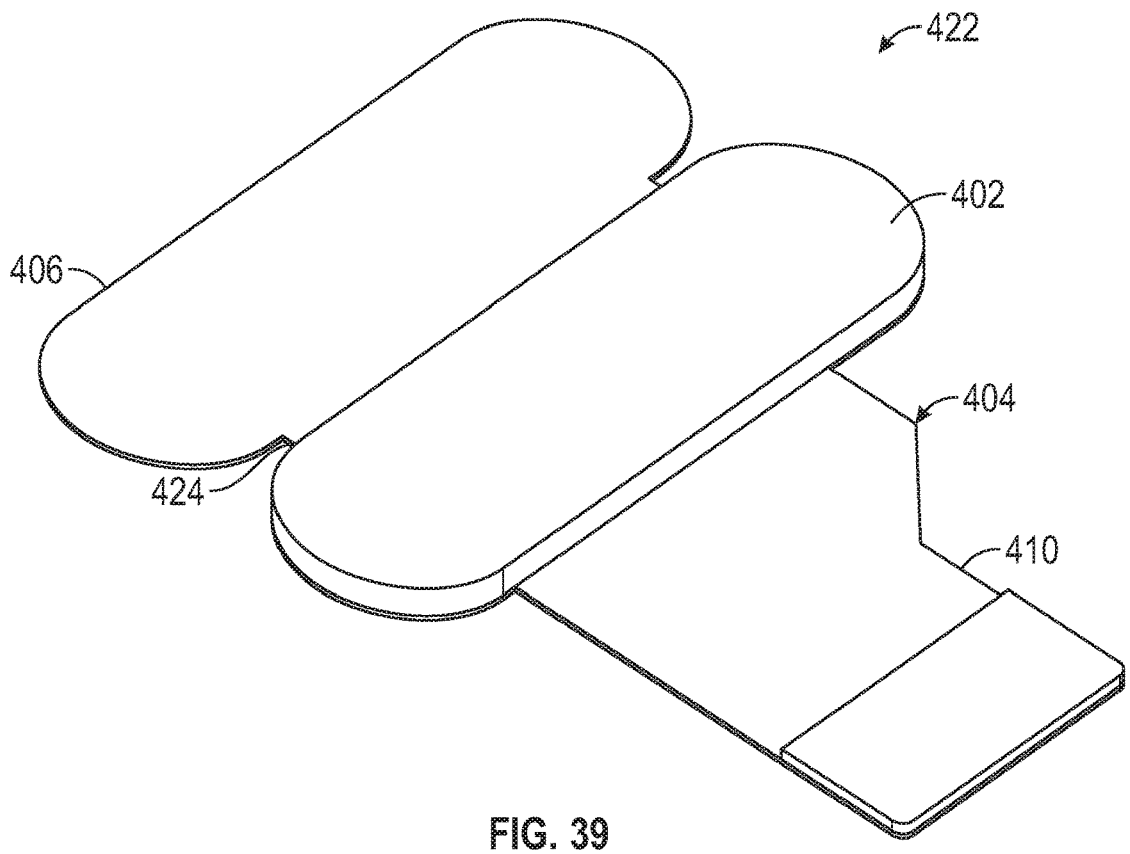
FIG. 39 is a top perspective view of an intermediate assembly of the sensor assembly of FIGS. 36-38
Figure 40:
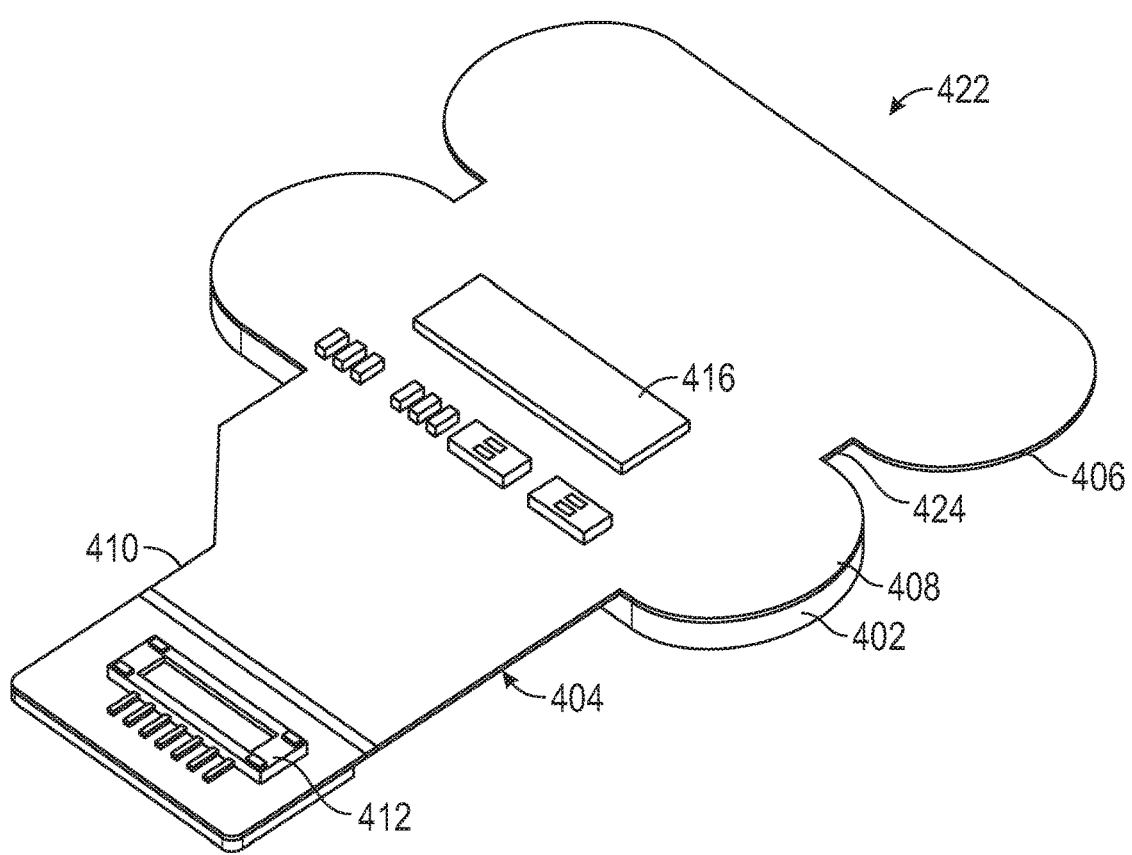
FIG. 40 is a bottom perspective view of the intermediate assembly FIG. 39.
Figure 41:
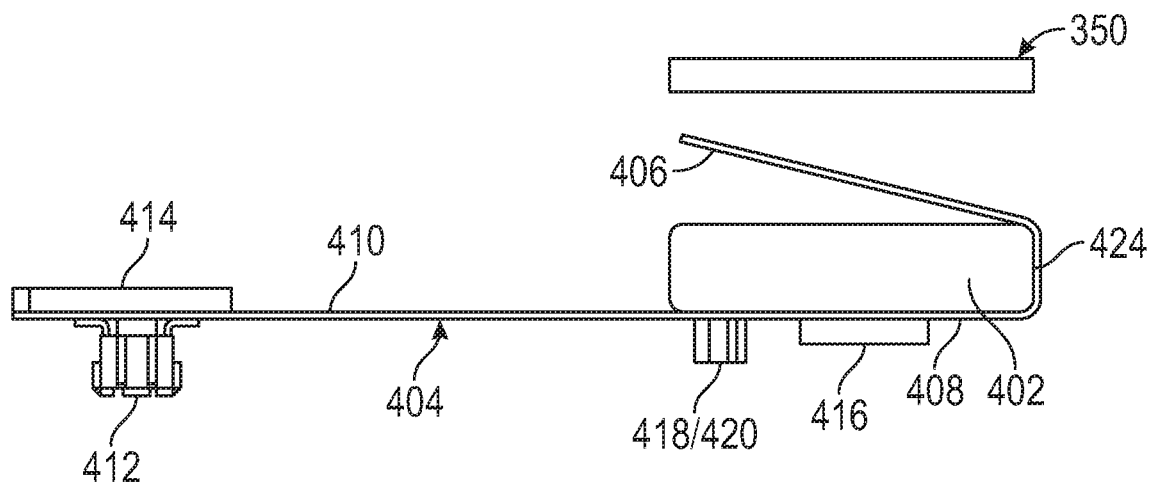
FIG. 41 is a side view of the intermediate assembly of FIG. 39.

FIGS. 39 and 40 show top and bottom perspective views, respectively, of an intermediate assembly 422 of the sensor assembly 400. FIG. 41 is a side view of the intermediate assembly 422. As shown in FIGS. 39-41, the flexible circuit subassembly 404 includes a sensor lobe 406 and a circuit lobe 408 with a connector portion 424 therebetween. FIG. 41 is a side view of the sensor assembly 400 showing the sensor lobe 406 partially folded over a top surface of the rigid substrate 402 and the cover panel 350 disposed above the intermediate assembly 422. The sensor lobe 406 and the circuit lobe 408 are secured to the top surface and bottom surface, respectively, of the rigid substrate 402. The flexible circuit subassembly 404 may be secured to the rigid substrate 402 by any of the means described herein. In the illustrated embodiment, the host connector tab 410 extends from the circuit lobe 408 transversely to one edge of the rigid substrate 402.

Figure 42:
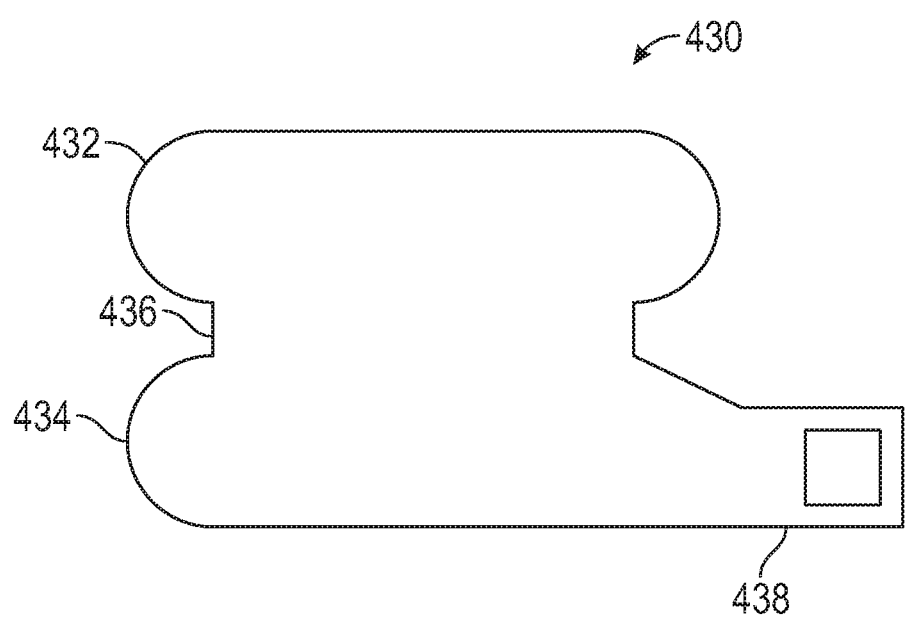
FIG. 42 is a top plan view of an alternate embodiment of a two-panel flexible substrate subassembly.

In an alternate embodiment of a flexible circuit subassembly 430 shown in FIG. 42, the flexible circuit subassembly 430 includes a sensor lobe 432, a circuit lobe 434, a connecting portion 436, and a host connector tab 438 extending longitudinally from one end of the circuit lobe 434. The position of the host connector tab is chosen to best fit the location of the connectors on the device in which the fingerprint sensor assembly is installed. Further, the length and shape of the host connector tab can vary as required.

Figure 43:
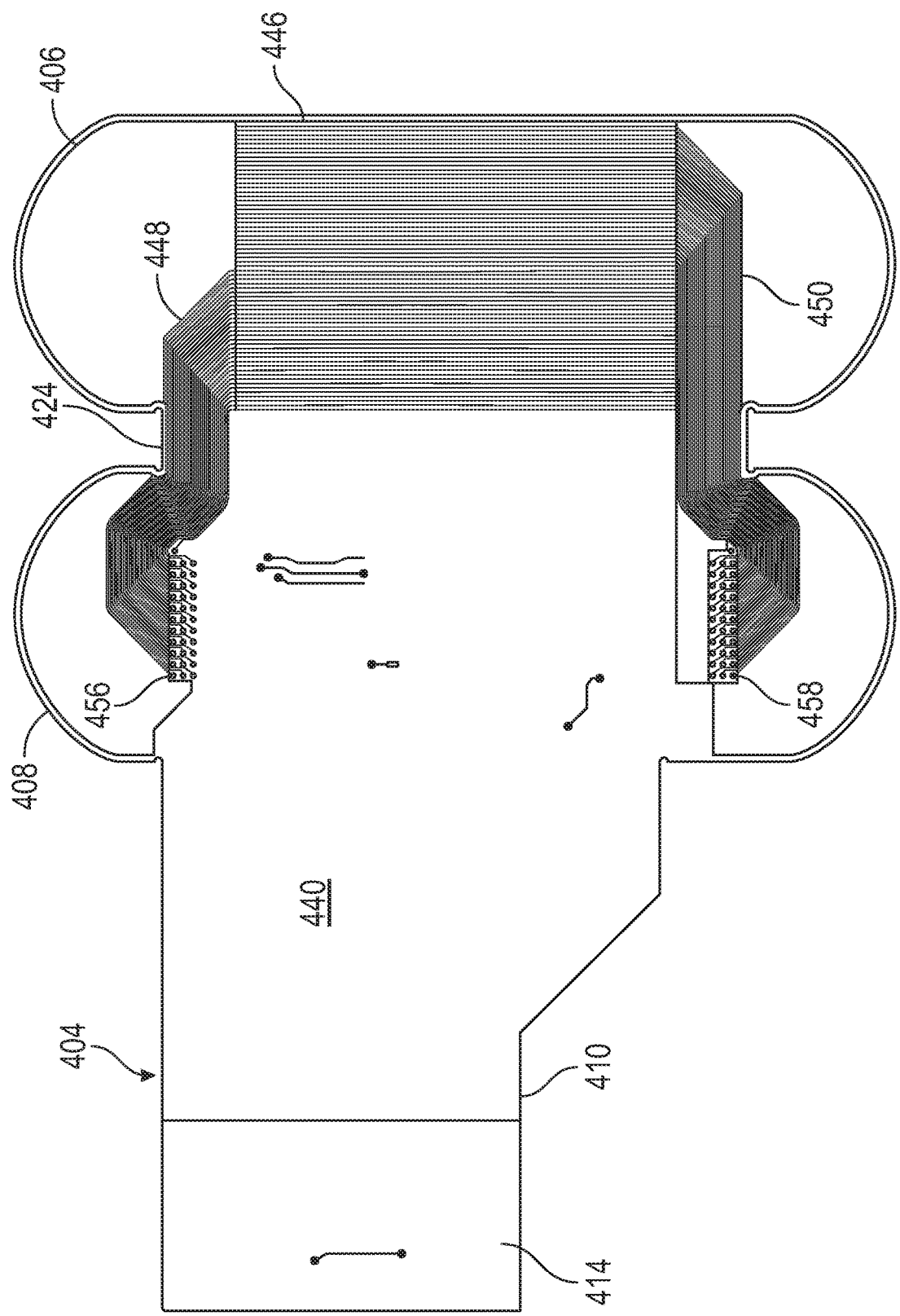
FIG. 43 is a top plan view of a flexible circuit subassembly of the sensor assembly shown in FIG. 36.
Figure 44:
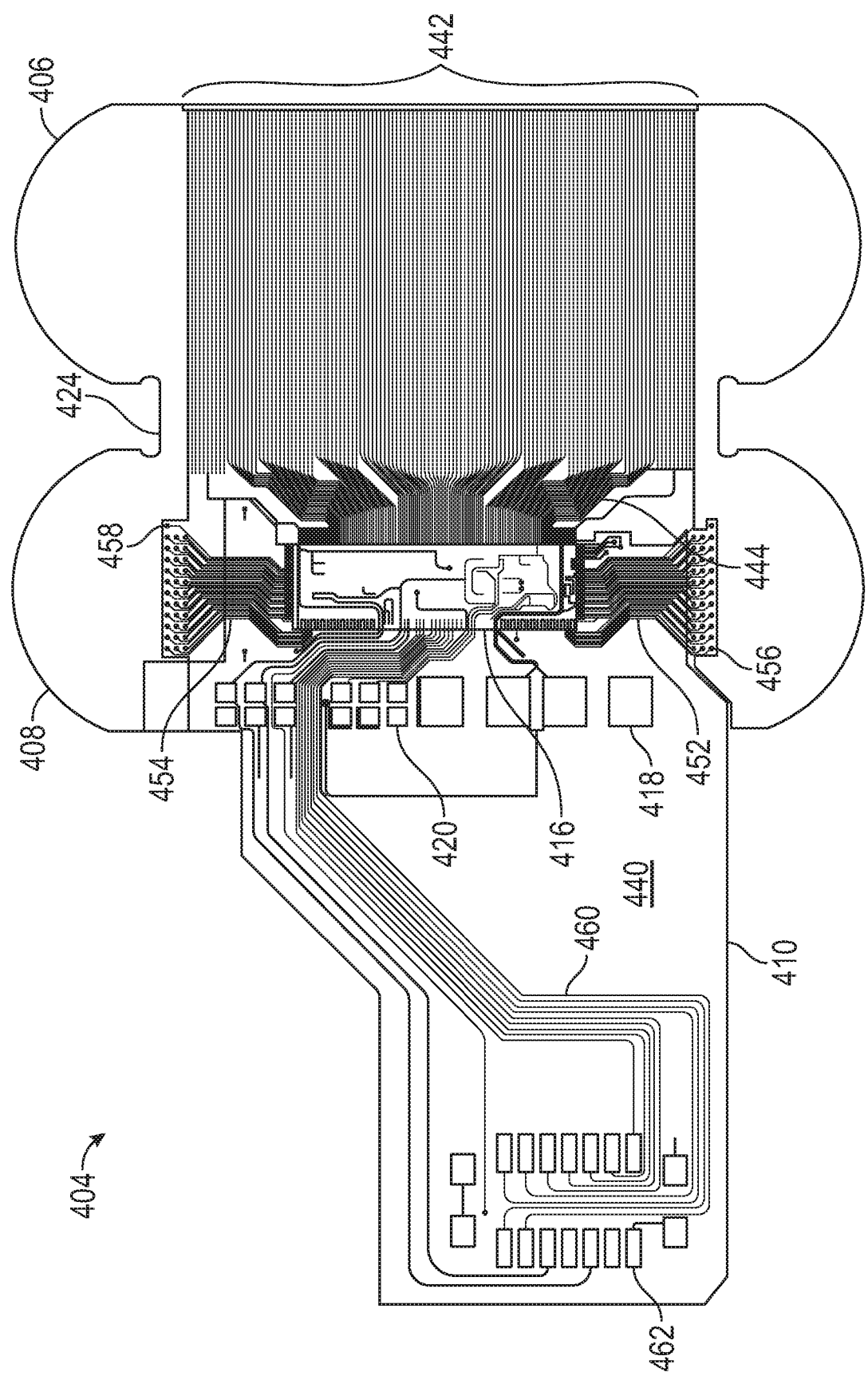
FIG. 44 is a bottom plan view of the flexible circuit subassembly a FIG. 43.

As shown in FIGS. 43 and 44, the flexible circuit subassembly 404 includes a flexible substrate 440 on which a number of conductive traces and circuit elements are disposed.

FIG. 44 is a bottom plan view of the flexible circuit subassembly 404. This side of the flexible circuit subassembly 404 is considered the outer surface as it faces outwardly from the rigid substrate 402 when wrapped around the rigid substrate 402 in the sensor assembly 400. A plurality of outer conductive traces or sensor elements 442 are formed on the outer surface of the sensor lobe 406. In the illustrated embodiment, the outer conductive traces 442 extend across the outer surface of the sensor lobe 406 and across the outer surface of the connecting portion 424. The outer conductive traces 442 are electrically connected to the circuit element 416 by conductive interconnects. A plurality of interconnects 444 extend from the ends of the outer conductive traces 442 to the circuit element 416, which is also disposed on the outer surface of the flexible circuit subassembly 404. Each interconnect 444 is associated with one of the outer conductive traces 442. Thus, each of the outer conductive traces 442 is connected, via an interconnect 444, to the circuit element 416.

FIG. 43 is a top plan view of the flexible circuit subassembly 404 showing the sensor lobe 406 and the circuit lobe 408. This side of the flexible circuit subassembly 404 is considered an inner surface of the of the flexible circuit subassembly 404 as the surface faces inwardly and contacts the surfaces of the rigid substrate 402 in the sensor assembly 400.

The flexible circuit subassembly 404 includes a plurality of inner conductive traces or sensor elements 446 formed on the inner surface of the sensor lobe 406. The inner conductive traces 446 are electrically connected to the circuit element 416 by conductive interconnects. In the illustrated embodiment, a first set of inner surface interconnects 448 extends from a portion (e.g., half) of the second conductive traces 446 (each interconnect 448 being associated with one of the conductive traces 446) and a second set of inner surface interconnects 450 extends from the remaining second conductive traces 446 (each interconnect 450 being associated with one of the conductive traces 446). The inner surface interconnects 448 extend to a set of vias 456 extending through the flexible substrate 440 to outer surface interconnects 452 formed on the outer surface of the flexible circuit subassembly 404 (see FIG. 44) and extending from the vias 456 to the circuit element 416. Each via 456 is associated with one of the inner surface interconnects 448 and one of the outer surface interconnects 452. Similarly, the inner surface interconnects 450 extend to a set of vias 458 extending through the flexible substrate 440 to outer surface interconnects 454 formed on the outer surface of the flexible circuit subassembly 404 (see FIG. 44) and extending from the vias 458 to the circuit element 416. Thus, each of the inner conductive traces 446 is connected, via an inner surface interconnect 448 or 450 and an outer surface interconnect 452 or 454, to the circuit element 416.

A plurality of connector tab interconnects 460 extend from the circuit element 416 across the connector tab 410 portion of the flexible substrate 440 to a plurality of connector pads 462. Connector pads 462 may be connected to a connector, such as connector plug 412.

As with embodiments described above, the flexible substrate 440 may comprise a flexible dielectric substrate, which may be a polymer-based substrate, such as Kapton® or Upilex®, and the inner and outer conductive traces 446, 442 may comprise a plurality of conductive traces made of a suitable conductive material, such as copper, tin, silver, nickel, aluminum, or gold that are formed, etched, deposited, plated, printed, or otherwise applied to or embedded into the flexible substrate 440. In the flexible substrate subassembly 404, sensor elements include the plurality of inner conductive traces 446 disposed on or embedded on the inner surface of the sensor lobe 406 of the flexible substrate 440 and the plurality of outer conductive traces 442 disposed on or embedded in the outer surface of the sensor lobe 406 of the flexible substrate 440. The outer conductive traces 442 are arranged side-by-side preferably without contacting one another and may be generally parallel with each other. Similarly, the inner conductive traces 446 are arranged side-by-side preferably without contacting one another and may be generally parallel to one another. The inner conductive traces 446 are oriented transversely to the outer conductive traces 442 and may be generally perpendicular thereto. Each inner conductive trace 446 may comprise a drive line or a pickup line, and conversely each outer conductive trace 442 may comprise a pickup line or a drive line. Each location where a drive line and a pickup line overlap, separated by a layer of the flexible substrate 440, may form an impedance-sensitive electrode pair whereby the overlapping portions of the drive and pickup lines form opposed plates of a capacitor separated by a dielectric layer or layers.

Figure 45:
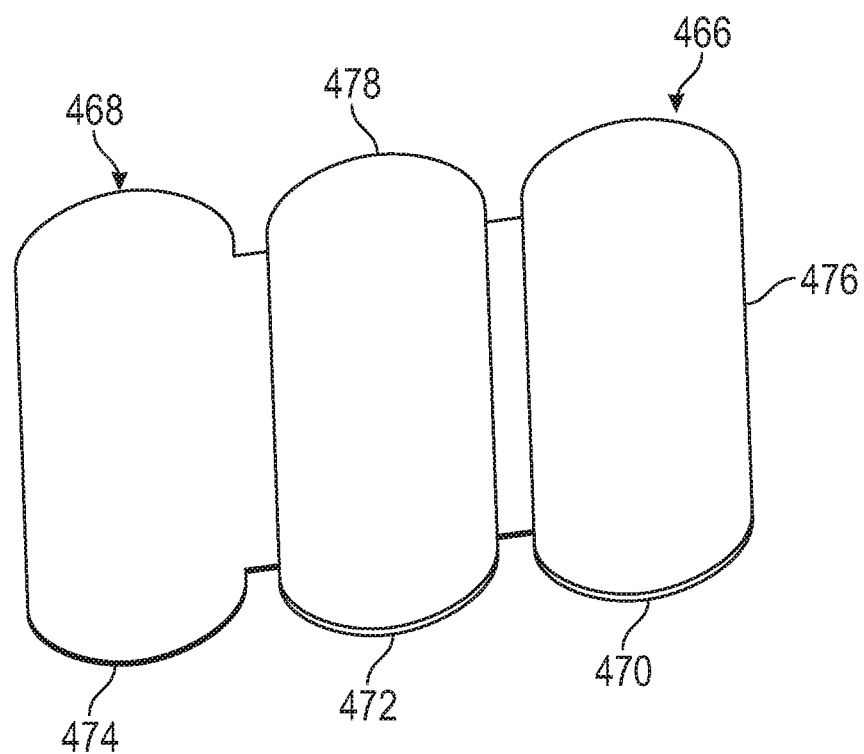
FIG. 45 as a top perspective view of an alternate embodiment of a three panel flexible substrate constructed with a two-piece rigid substrate.

In some embodiments, construction of the sensor assembly may be facilitated or simplified by providing a rigid substrate comprised of two pieces that may be connected to one another after securing each piece to an associated portion of a flexible substrate subassembly. An example of such a sensor assembly is shown in FIG. 45 illustrating an intermediate assembly 466 of a sensor assembly including a three-panel flexible circuit subassembly 468 having a first lobe 470, a second lobe 472, and a third lobe 474 with connecting portions between the adjacent lobes. A first rigid substrate portion 476 is secured to the first lobe 470, and a second rigid substrate portion 478 is secured to the second lobe 472. Assembly of the sensor assembly can be completed by folding the first rigid substrate portion 476 and the first lobe 470 over the second rigid substrate portion 478 and second lobe 472 and securing the first rigid substrate portion 476 to the second rigid substrate portion 478. Next, the third lobe 474 of the flexible circuit subassembly 468 is folded over the first lobe 470 and the first rigid substrate portion 476.

Figure 46:
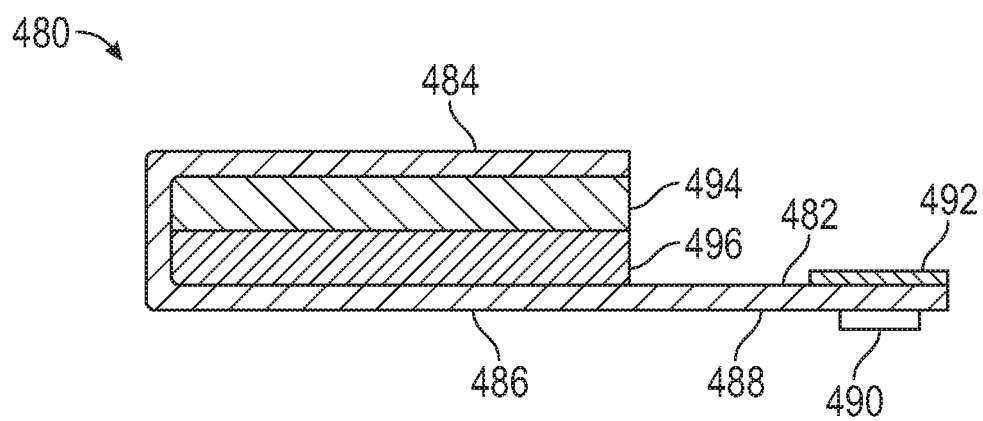
FIG. 46 as a transverse cross-sectional view of an alternate embodiment of a two panel flexible substrate constructed with a two-piece rigid substrate.

Another example of a sensor assembly formed from a two-piece rigid substrate is shown in FIG. 46 illustrating a sensor assembly 480 including a two-panel flexible circuit subassembly 482 having a sensor lobe 484 (with conductive traces formed on opposed surfaces as described above), a circuit lobe 486, and a host connector tab 488 with connecting portions between the adjacent lobes. Sensor assembly 480 may further include a connector plug 490 and a stiffener 492 as described above. A first rigid substrate portion 494 is secured to the sensor lobe 484, and a second rigid substrate portion 496 is secured to the circuit lobe 486. Assembly of the sensor assembly can be completed by folding the first rigid substrate portion 494 and the sensor lobe 484 over the second rigid substrate portion 496 and circuit lobe 486 and securing the first rigid substrate portion 494 to the second rigid substrate portion 496.

In certain circumstances, it may be desirable that the sensor assembly, when installed in a host device panel, be no thicker than (or about the same thickness as) the host device panel in the vicinity of the sensor assembly. In such cases, it may be necessary to position the circuit element (integrated circuit, ASIC) and other components (such as capacitors and inductors) at an offset position with respect to the footprint of the main sensor assembly. That is, the circuit element and other components are not mounted to the flexible circuit subassembly below the rigid substrate on which the flexible circuit assembly is mounted.

Figure 47:
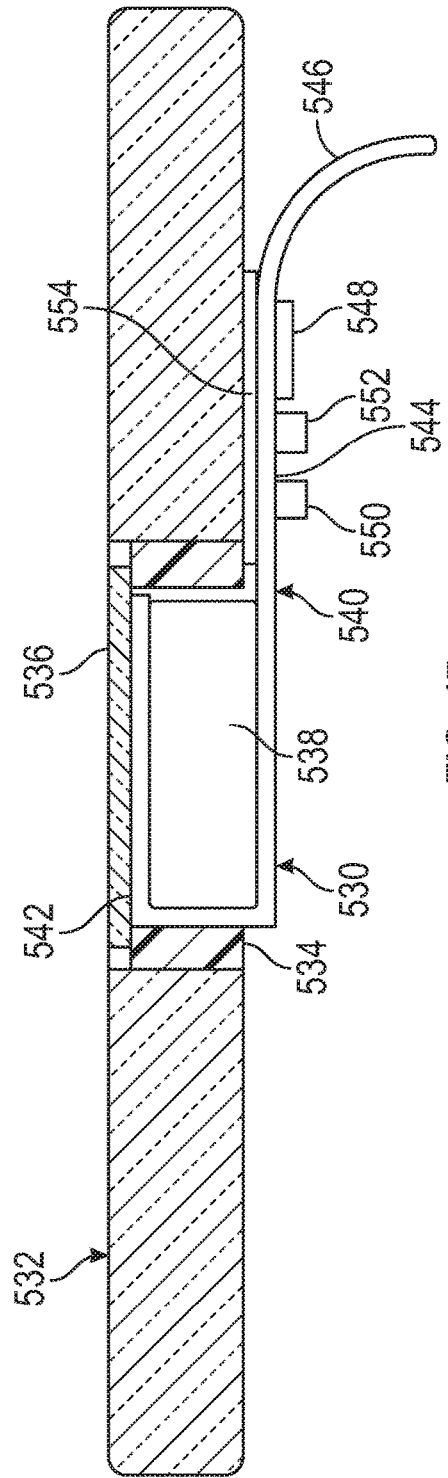
FIG. 47 is a cross-section of an alternate embodiment of a sensor assembly installed in a host device panel.

Such a configuration is shown in FIG. 47, which is a cross-section of an alternate embodiment of a sensor assembly installed in a host device panel. A sensor assembly 530 is disposed within a recess formed in a host device panel 532. Sensor assembly 530 may be mounted within the host device panel 532 by a spacer frame 534 in any manner described herein. Sensor assembly 530 may be covered with a cover panel 536 that is installed so as to be flush with, recessed below, or protruding above the surface of the host device panel 532 as described in various embodiments above. Cover panel 536 may comprise any cover panel made of materials and having any characteristics described herein and may be mounted and secured in any manner described herein.

The sensor assembly 530 includes a rigid substrate 538 on which is wrapped a flexible circuit subassembly 540. Rigid substrate 538 may have any shape or configuration and may be made of any material and have any characteristic, e.g., flatness, described herein. The flexible circuit subassembly 540 may be secured to the rigid substrate 538 in any manner described herein by which a flexible circuit subassembly or flexible substrate is secured to a rigid substrate.

A sensor portion 542 of the flexible circuit subassembly 540 is disposed on a top surface of the rigid substrate 538. Sensor portion 542 includes conductive traces formed on opposite surfaces of a flexible substrate and oriented transversely to each other as described above in the context of FIGS. 43 and 44.

The flexible circuit subassembly 540 starts on the upper surface of the rigid substrate 538 (i.e. on the surface facing the cover panel 536) then extends around one edge (the left edge in FIG. 47) and around the bottom surface of the rigid substrate 538. A jumper extension 544 of the flexible circuit subassembly 540 extends beyond the wrapped portion of the flexible circuit subassembly 540. A circuit element (such as an integrated circuit or ASIC) 548 and other electrical components 550, 552 (e.g. inductors and capacitors) are mounted on a bottom or outer surface of the flexible circuit subassembly 540, and a stiffener 554 (comprising, e.g., a polyimide card or plate) may be secured to the portion of the flexible circuit subassembly opposite the circuit element 548 and components 550, 552. A host connector tab 546 extends from the jumper extension 544 for connecting the sensor assembly 530 to a host device via a connector (e.g., a plug, not shown).

Figure 48:
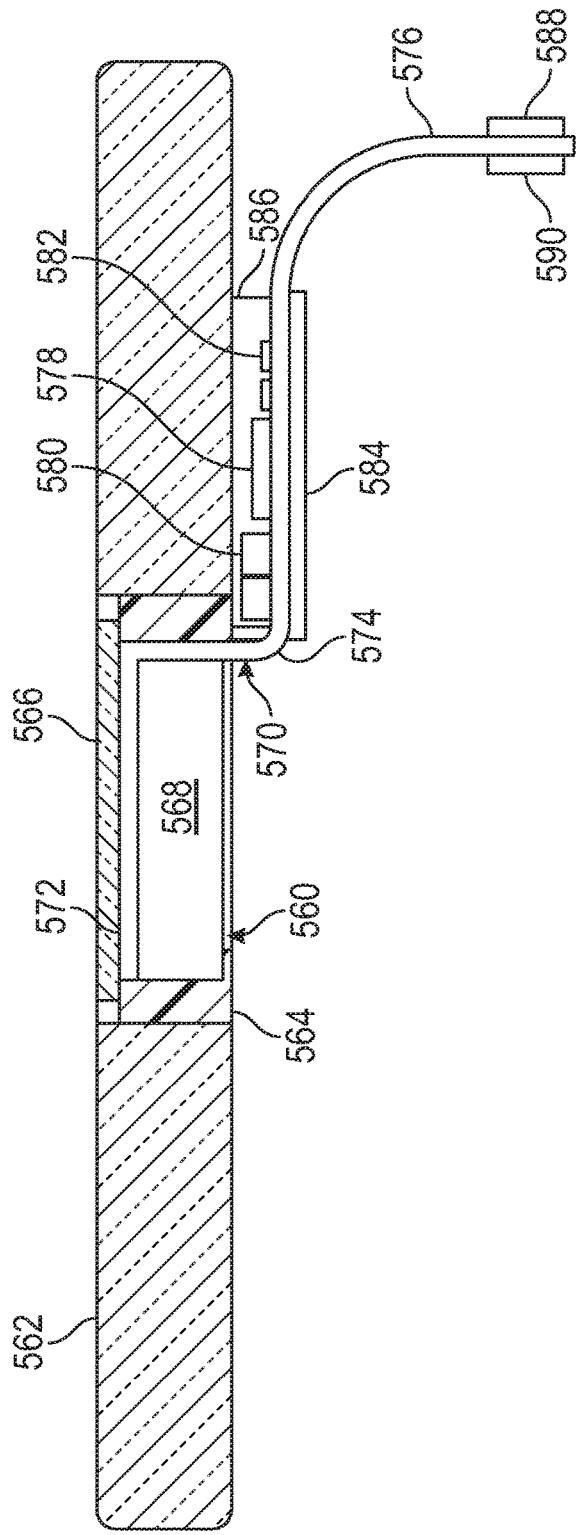
FIG. 48 is a cross-section of an alternate embodiment of a sensor assembly installed in a host device panel.

FIG. 48 is a cross-section of an alternate embodiment of a sensor assembly installed in a host device panel. A sensor assembly 560 is disposed within a recess formed in a host device panel 562. Sensor assembly 560 may be mounted within the host device panel 562 by a spacer frame 564 in any manner described herein. Sensor assembly 560 may be covered with a cover panel 566 that is installed so as to be flush with, recessed below, or protruding above the surface of the host device panel 562 as described in various embodiments above. Cover panel 566 may comprise any cover panel made of materials and having any characteristics described herein and may be mounted and secured in any manner described herein.

The sensor assembly 560 includes a rigid substrate 568 on which is wrapped a flexible circuit subassembly 570. Rigid substrate 568 may have any shape or configuration and may be made of any material and have any characteristic, e.g., flatness, described herein. The flexible circuit subassembly 570 may be secured to the rigid substrate 568 in any manner described herein by which a flexible circuit subassembly or flexible substrate is secured to a rigid substrate.

A sensor portion 572 of the flexible circuit subassembly 570 is disposed on a top surface of the rigid substrate 568. Sensor portion 572 includes conductive traces formed on opposite surfaces of a flexible substrate and oriented transversely to each other as described above in the context of FIGS. 43 and 44.

The flexible circuit subassembly 570 is wrapped around an edge of the rigid substrate 568 (the right edge in FIG. 48) but is not wrapped across the bottom surface as with the installation shown in FIG. 47. A jumper extension 574 of the flexible circuit subassembly 570 extends beyond the wrapped portion of the flexible circuit subassembly 570. A circuit element (such as an integrated circuit or ASIC) 578 and other electrical components 580, 582 (e.g. inductors and capacitors) are mounted on a top surface of the flexible circuit subassembly 570, and a stiffener 584 (comprising, e.g., a polyimide card or plate) may be secured to the portion of the flexible circuit subassembly opposite the circuit element 578 and components 580, 582. The circuit element 578 and components 580, 582 may be encased in an encapsulant material 586, such as an epoxy or the like.

A host connector tab 576 extends from the jumper extension 574 for connecting the sensor assembly 560 to a host device via a connector (e.g., a plug 588). A stiffener 590 (comprising, e.g., a polyimide card or plate) may be secured to the portion of the flexible circuit subassembly 570 opposite the circuit element connector 588.

Figure 49:
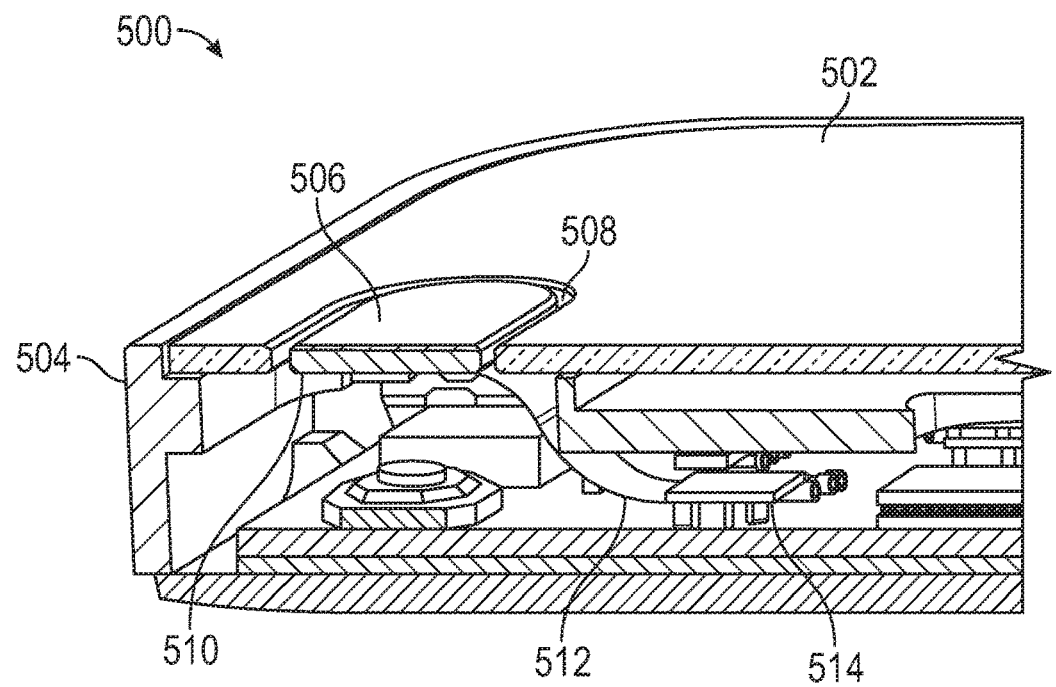
FIG. 49 is a partial perspective view in cross-section showing a sensor assembly operatively disposed of in an electronic device.

FIG. 49 is a partial perspective view in cross-section showing a sensor assembly 510 operatively disposed of in an electronic device 500. Sensor assembly 510 may comprise any of the sensor assembly embodiments described herein. Electronic device 500 may be any device in which a fingerprint sensor may advantageously be incorporated, for example, for providing secure access to the device or for permitting performance of secure operations with the device. Device 500 may comprise a mobile phone, a smart phone, a desktop computer, a laptop/notebook computer, a tablet computer, a thin client device, etc. Sensor assembly 510 is disposed within a recess 508 formed in a host device panel 502. Host device panel 502 may comprise a display and/or touch screen (interface) panel. Host a device panel 502 may be supported in a frame 504, and frame 504 may define at least part of a housing of the device 500. A host connector tab 512 extending from the sensor assembly 510 connects the sensor assembly 510, e.g. via a connector 514, with power, logic, and/or data transmission elements within the device 500. A cover panel 506 may be disposed above the sensor assembly 510 so as to be flush with, recessed below, or protruding above the host device panel 502.

Figure 50:
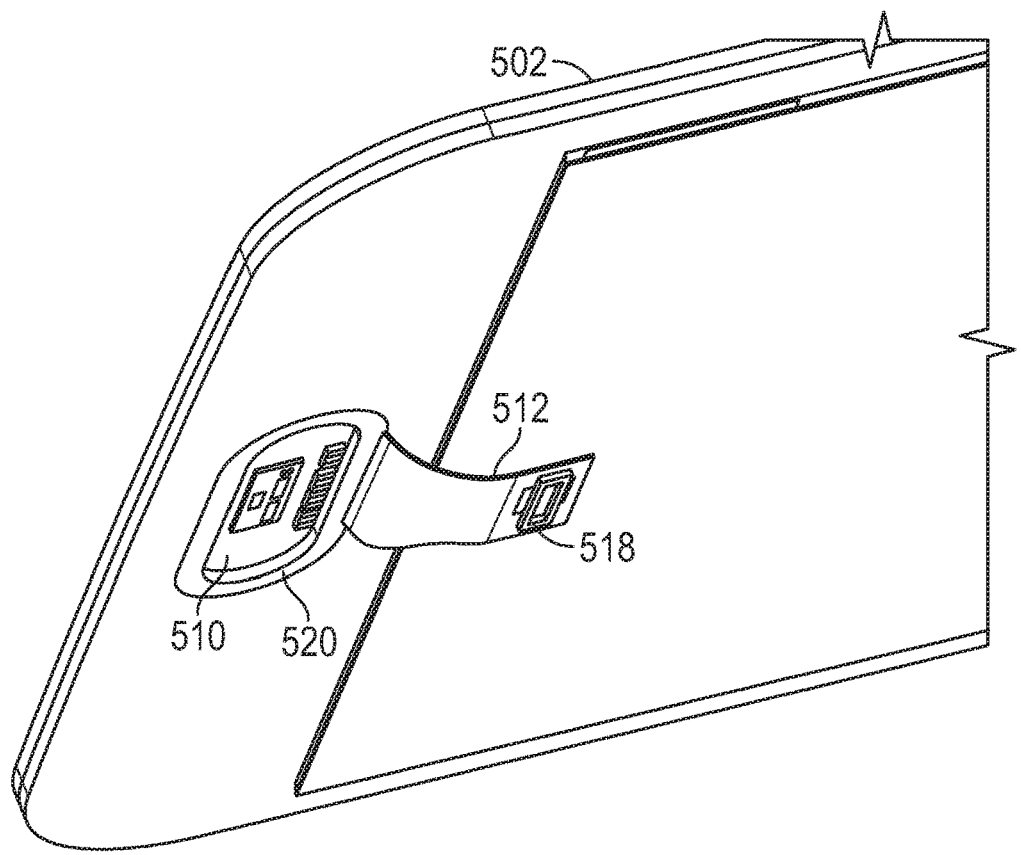
FIG. 50 is a bottom perspective view showing a sensor assembly mounted within a host device panel.
Figure 51:
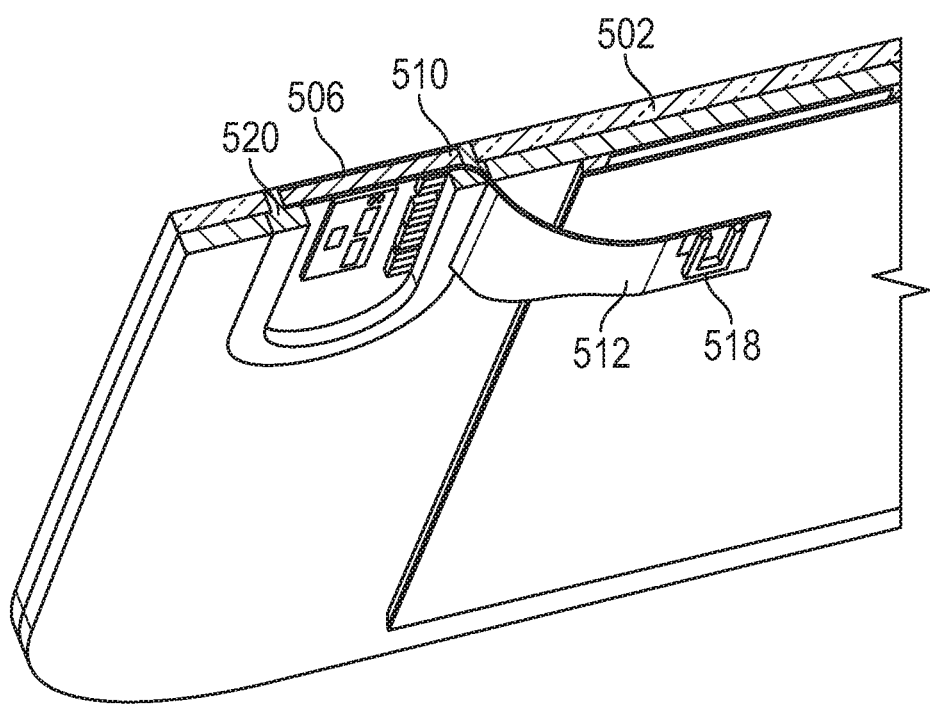
FIG. 51 is a bottom perspective view in cross-section showing the sensor assembly disposed within the host device panel.

FIG. 50 is a bottom perspective view showing the sensor assembly mounted within a host device panel. FIG. 51 is a bottom perspective view in cross-section showing the sensor assembly disposed within the host device panel. As shown in FIGS. 50 and 51, the sensor assembly 510 is disposed within a spacer/mounting frame 520 fitted within a recess formed in the host device panel 502. Frame 520 may comprise elements of one or more of the spacer frames described above. The frame 520 may comprise a "mold-in-place" high durometer conductive adhesive. The viscosity of the adhesive is preferably free flowing prior to cure. The hose connector tab 512 extends below the Sensor assembly 510 and includes a plug 518 for connecting the sensor assembly to an internal component within the host device.

EXEMPLARY EMBODIMENTS

Embodiment 1

A sensor assembly comprising: a rigid substrate having opposed first and second surfaces; a flexible substrate; first conductive traces disposed on a first part of the flexible substrate, wherein the first conductive traces are generally parallel to one another; second conductive traces disposed on a second part of the flexible substrate, wherein the second conductive traces are generally parallel to one another, and the first conductive traces are oriented transversely to the second conductive traces; first interconnects disposed on the flexible substrate, each first interconnect being connected to an associated one of the first conductive traces; and second interconnects disposed on the flexible substrate, each second interconnect being connected to an associated one of the second conductive traces; wherein the first conductive traces and the first part of the flexible substrate overlie the first surface of the rigid substrate, and the second conductive traces and the second part of the flexible substrate overlie the first conductive traces and the first surface of the rigid substrate, and, wherein the first interconnects and a part of the flexible substrate on which the first interconnects are disposed extend around a first edge of the rigid substrate and overlie a portion of the second surface of the rigid substrate and wherein the second interconnects and a part of the flexible substrate on which the second interconnects are disposed extend around a second edge of the rigid substrate and overlie a portion of the second surface of the rigid substrate.

Embodiment 2

The sensor assembly of embodiment 1, wherein the conductive traces and the conductive interconnects comprise conductive material formed, etched, deposited, or printed onto or embedded into the flexible substrate.

Embodiment 3

The sensor assembly of embodiment 2, wherein the conductive material comprises a material selected from the group of materials consisting of copper, tin, silver, or gold.

Embodiment 4

The sensor assembly of any one of embodiments 1 to 3, wherein the rigid substrate has the shape of a rectangular block, a square block, or a cubic block.

Embodiment 5

The sensor assembly of any one of embodiments 1 to 3, wherein the opposed first and second surfaces of the rigid substrate are flat, and wherein the rigid substrate further includes rounded first and second ends.

Embodiment 6

The sensor assembly of any one of embodiments 1 to 5, wherein the flexible substrate is configured to conform in size and shape to the rigid substrate when the flexible substrate is wrapped around the rigid substrate.

Embodiment 7

The sensor assembly of any one of embodiments 1 to 6, wherein the first conductive traces overlying the first surface of the rigid substrate and the second conductive traces overlying the first conductive traces and the first surface of the rigid substrate form a sensor surface, and wherein the sensor surface has a flatness of 5 µm or less.

Embodiment 8

The sensor assembly of any one of embodiments 1 to 7, wherein the opposed first and second surfaces of the rigid substrate are flat and the first and second edges of the rigid substrate are rounded.

Embodiment 9

The sensor assembly of any one of embodiments 1 to 8, wherein the parts of the flexible substrate extending around the first and second edges of the rigid substrate are in contact with the first and second edges of the rigid substrate.

Embodiment 10

The sensor assembly of any one of embodiments 1 to 8, wherein the parts of the flexible substrate extending around the first and second edges of the rigid substrate form service loops that are not in contact with the first and second edges of the rigid substrate.

Embodiment 11

The sensor assembly of any one of embodiments 1 to 10, wherein the rigid substrate is made from glass or ceramic.

Embodiment 12

The sensor assembly of any one of embodiments 1 to 11, wherein the rigid substrate comprises two separate pieces bonded together.

Embodiment 13

The sensor assembly of any one of embodiments 1 to 12, wherein the flexible substrate is made from a dielectric material.

Embodiment 14

The sensor assembly of any one of embodiments 1 to 13, wherein the flexible substrate is a polymer-based material.

Embodiment 15

The sensor assembly of any one of embodiments 1 to 14, wherein the flexible substrate has a modulus of elasticity of between 2 and 9 GPa.

Embodiment 16

The sensor assembly of any one of embodiments 1 to 15, further comprising a circuit element disposed on the flexible substrate between the first and second parts of the flexible substrate, wherein the first interconnects are configured to connect the first conductive traces to the circuit element, the second interconnects are configured to connect the second conductive traces to the circuit element, and wherein the circuit element and the part of the flexible substrate on which the circuit element is disposed overlie the second surface of the rigid substrate.

Embodiment 17

The sensor assembly of any one of embodiments 1 to 16, further comprising host connector tabs for connecting the sensor assembly to a host device.

Embodiment 18

The sensor assembly of embodiment 17, where the connector tabs comprise conductive connector pads formed on a part of the flexible substrate and conductive host connector interconnects connected to the connector pads.

Embodiment 19

The sensor assembly of any one of embodiments 1 to 18, wherein the flexible substrate is secured to the rigid substrate by an adhesive and the second part of the flexible substrate is secured to the first part of the flexible substrate by an adhesive.

Embodiment 20

The sensor assembly of embodiment 19, wherein the adhesive comprises one or more materials selected from the group consisting of: pressure sensitive adhesive, B-staged sheet adhesive, bond ply adhesive, acrylic-based thermoset adhesives, high modulus of elasticity/highly cross-linked, epoxy-type thermoset adhesives, adhesive with particle fillers to increase the modulus of elasticity of the adhesive, and adhesives with filler materials having high dielectric constants.

Embodiment 21

A sensor assembly comprising: a rigid substrate having opposed first and second surfaces; and a sensor subassembly comprising: a flexible substrate; a circuit element disposed on the flexible substrate; a plurality of first conductive first traces disposed on a first part of the flexible substrate; a plurality of second conductive traces disposed on a second part of the flexible substrate; a plurality of conductive first interconnects disposed on the flexible substrate and connecting the first traces to the circuit element; and a plurality of conductive second interconnects disposed on the flexible substrate and connecting the second traces to the circuit element; wherein the sensor subassembly is wrapped around the rigid substrate so that the first conductive traces and the first part of the flexible substrate overlie the first surface of the rigid substrate, the second conductive traces and the second part of the flexible substrate overlie the first conductive traces and the first surface of the rigid substrate, the first interconnects and a part of the flexible substrate on which the first interconnects are disposed extend around a first edge of the rigid substrate and overlie a portion of the second surface of the rigid substrate, the second interconnects and a part of the flexible substrate on which the second interconnects are disposed extend around a second edge of the rigid substrate and overlie a portion of the second surface of the rigid substrate; and the circuit element and a portion of the flexible substrate on which the circuit element is disposed overlies a portion of the second surface of the rigid substrate.

Embodiment 22

The sensor assembly of embodiment 21, wherein the first and second conductive traces and the first and second interconnects comprise conductive material formed, etched, deposited, or printed onto or embedded into the flexible substrate.

Embodiment 23

The sensor assembly of embodiment 22, wherein the conductive material comprises a material selected from the group of materials consisting of copper, tin, silver, or gold.

Embodiment 24

The sensor assembly of any one of embodiments 21 to 23, wherein the rigid substrate has the shape of a rectangular block, a square block, or a cubic block.

Embodiment 25

The sensor assembly of any one of embodiments 21 to 23, wherein the opposed first and second surfaces of the rigid substrate are flat and the first and second edges of the rigid substrate are rounded.

Embodiment 26

The sensor assembly of any one of embodiments 21 to 25, wherein the parts of the flexible substrate extending around the first and second edges of the rigid substrate are in contact with the first and second edges of the rigid substrate.

Embodiment 27

The sensor assembly of any one of embodiments 21 to 25, wherein the parts of the flexible substrate extending around the first and second edges of the rigid substrate form service loops that are not in contact with the first and second edges of the rigid substrate.

Embodiment 28

The sensor assembly of any one of embodiments 21 to 27, wherein the rigid substrate is made from glass or ceramic.

Embodiment 29

The sensor assembly of any one of embodiments 21 to 28, wherein the rigid substrate comprises two separate pieces bonded together.

Embodiment 30

The sensor assembly of any one of embodiments 21 to 29, wherein the flexible substrate is made from a dielectric material.

Embodiment 31

The sensor assembly of any one of embodiments 21 to 30, wherein the flexible substrate is a polymer-based material.

Embodiment 32

The sensor assembly of any one of embodiments 21 to 31, wherein the first conductive traces are generally parallel to one another, the second conductive traces are generally parallel to one another, and the first conductive traces are oriented transversely to the second conductive traces.

Embodiment 33

The sensor assembly of any one of embodiments 21 to 32, wherein the first interconnects are configured to connect the first conductive traces to the circuit element, the second interconnects are configured to connect the second conductive traces to the circuit element, and the circuit element and the part of the flexible substrate on which the circuit element is disposed overlie the second surface of the rigid substrate.

Embodiment 34

The sensor assembly of any one of embodiments 21 to 33, further comprising host connector tabs for connecting the sensor assembly to a host device.

Embodiment 35

The sensor assembly of embodiment 34, where the connector tabs comprise conductive connector pads formed on a part of the flexible substrate and conductive host connector interconnects connected to the connector pads.

Embodiment 36

An assembly comprising: a host device panel; a sensor assembly comprising a rigid substrate with opposed first and second surfaces and sensor elements disposed at the first surface thereof, wherein the sensor assembly is disposed within a cutout formed in the host device panel; and a cover panel disposed over the cutout and the sensor assembly so as to enclose the sensor assembly within the cutout.

Embodiment 37

The assembly of embodiment 36, wherein the cutout is formed partially through the host device panel.

Embodiment 38

The assembly of embodiment 36, wherein the cutout is formed completely through the host device panel.

Embodiment 39

The assembly of any one of embodiment 36-38, wherein a top surface of the cover panel is flush with a top surface of the host device panel.

Embodiment 40

The assembly of any one of embodiment 36-38, wherein a top surface of the cover panel is recessed with respect to a top surface of the host device panel.

Embodiment 41

The assembly of any one of embodiment 36-38, wherein a top surface of the cover panel protrudes above a top surface of the host device panel.

Embodiment 42

The assembly of any one of embodiments 36 to 41, wherein the host device panel and the cover panel are made from glass.

Embodiment 43

The assembly of any one of embodiments 36 to 42, wherein the sensor assembly further comprises a flexible substrate and the sensor elements comprise electrically conductive traces disposed on the flexible substrate and wherein the sensor assembly further comprises electrically conductive interconnects connected to the conductive traces, and wherein the conductive traces and a part of the flexible substrate on which the conductive traces are disposed overlie at least a portion of the first surface of the rigid substrate, and the interconnects and a part of the flexible substrate on which the interconnects are disposed extend around an edge of the rigid substrate and overlie at least a portion of the second surface of the rigid substrate.

Embodiment 44

The assembly of any one of embodiments 36 to 43, further comprising a recessed shelf formed in the host device panel around the perimeter of the cutout, wherein the cover panel is seated in the shelf, the shape of the shelf corresponds to the shape of the cover panel, and the depth of the shelf corresponds to the thickness of the cover panel.

Embodiment 45

The assembly of any one of embodiments 36 to 44, wherein the cutout has a shape conforming to a shape of the sensor assembly.

Embodiment 46

The assembly of any one of embodiments 36 to 45, further comprising a spacer frame with an outer perimeter having a shape corresponding to a shape of the cutout and an inner perimeter having a shape corresponding to a shape of the sensor assembly, wherein the spacer frame is disposed within the cutout and the sensor assembly is disposed within the spacer frame.

Embodiment 47

The assembly of embodiment 46, further comprising a recessed shelf formed in the spacer frame around the inner perimeter thereof, wherein the cover panel is seated on the shelf of the spacer frame, the shape of the shelf corresponds to the shape of the cover panel, and the depth of the shelf corresponds to the thickness of the cover panel.

Embodiment 48

The assembly of embodiment 46, wherein the cover panel is disposed on top of the spacer frame.

Embodiment 49

The assembly of embodiment 46, further comprising a bevel formed in the spacer frame around the inner perimeter thereof.

Embodiment 50

The assembly of embodiment 49, wherein the cover panel is beveled about an outer perimeter thereof.

Embodiment 51

The assembly of any one of embodiment 46 to 50, wherein the cutout is formed completely through the host device panel and wherein the spacer frame comprises a lower peripheral shelf extending laterally outwardly from a lower side of the spacer frame, wherein the lower peripheral shelf abuts a lower surface of the host device panel.

Embodiment 52

The assembly of any one of embodiments 46 to 51, wherein the spacer frame is made from one or more materials selected from the group consisting of: a machinable or moldable plastic, liquid crystal polymers, Polybutylene Terephthalate (PBT), conductive polymers, polymers with carbon or graphite filler, silicone-based materials, polymer foams, silicone foams, conductive thermoplastic or thermosetting molding compounds, conductive foams, and conductive silicones.

Embodiment 53

The assembly of any one of embodiments 43 to 52, wherein the conductive traces and the conductive interconnects comprise conductive material formed, etched, deposited, or printed onto or embedded into the flexible substrate.

Embodiment 54

The assembly of embodiment 53, wherein the conductive material comprises a material selected from the group of materials consisting of copper, tin, silver, or gold.

Embodiment 55

The assembly of any one of embodiments 36 to 54, wherein the rigid substrate has the shape of a rectangular block, a square block, or a cubic block.

Embodiment 56

The assembly of any one of embodiments 36 to 54, wherein the opposed first and second surfaces of the rigid substrate are flat and opposed edges of the rigid substrate are rounded.

Embodiment 57

The assembly of any one of embodiments 36 to 56, wherein the rigid substrate is made from glass or ceramic.

Embodiment 58

The assembly of any one of embodiments 36 to 57, wherein the rigid substrate comprises two separate pieces bonded together.

Embodiment 59

The assembly of any one of embodiments 36 to 58, wherein the flexible substrate is made from a dielectric material.

Embodiment 60

The assembly of any one of embodiments 36 to 59, wherein the flexible substrate is a polymer-based material.

Embodiment 61

The assembly of any one of embodiments 43 to 60, wherein the conductive traces comprise first conductive traces disposed on a first part of the flexible substrate and second conductive traces disposed on a second part of the flexible substrate.

Embodiment 62

The assembly of embodiment 61, wherein the first conductive traces are generally parallel to one another, the second conductive traces are generally parallel to one another, and the first conductive traces are oriented transversely to the second conductive traces.

Embodiment 63

The assembly of embodiment 61 or embodiment 62, wherein the first conductive traces and the first part of the flexible substrate overlie the first surface of the rigid substrate, and the second conductive traces and the second part of the flexible substrate overlie the first conductive traces and the first surface of the rigid substrate.

Embodiment 64

The assembly of any one of embodiments 61 to 63, wherein the interconnects comprise first interconnects associated with the first conductive traces and second interconnects associated with the second conductive traces, wherein the first interconnects and a part of the flexible substrate on which the first interconnects are disposed extend around a first edge of the rigid substrate and overlie a portion of the second surface of the rigid substrate and wherein the second interconnects and a part of the flexible substrate on which the second interconnects are disposed extend around a second edge of the rigid substrate and overlie a portion of the second surface of the rigid substrate.

Embodiment 65

The assembly of embodiment 64, wherein the part of the flexible substrate extending around the first edge of the rigid substrate is in contact with the first edge, and the part of the flexible substrate extending around the second edge of the rigid substrate is in contact with the second edge.

Embodiment 66

The assembly of any one of embodiments 43 to 65, further comprising a circuit element disposed on the flexible substrate, wherein the interconnects are configured to connect the conductive traces to the circuit element, and wherein the circuit element and the part of the flexible substrate on which the circuit element is disposed overlie the second surface of the rigid substrate.

Embodiment 67

The assembly of any one of embodiments 36 to 66, wherein the sensor assembly further comprises host connector tabs for connecting the sensor assembly to a host device.

Embodiment 68

The assembly of embodiment 67, where the connector tabs comprise conductive connector pads formed on a part of the flexible substrate and conductive host connector interconnects connected to the connector pads.

Embodiment 69

A sensor assembly comprising: a rigid substrate having opposed first and second surfaces; a flexible substrate; a circuit element located generally in the center of the flexible substrate; electrically conductive traces, including a first set and a second set of conductive traces disposed on opposite ends of the flexible substrate with respect to the circuit element; and a first and a second set of electrically conductive interconnects disposed on the flexible substrate, the first set of interconnects connecting the first set of conductive traces to the circuit element and the second set of interconnects connecting the second set of conductive traces to the circuit element, wherein the flexible substrate is wrapped around the rigid substrate so that the circuit element is disposed on the second surface of the rigid substrate, and the first and second sets of interconnects extend from the second surface of the rigid substrate around opposite edges of the rigid substrate onto the first surface of the rigid substrate where the first and second sets of conductive traces overlap to form a sensing array above the first surface of the rigid substrate.

Embodiment 70

The sensor assembly of embodiment 69, wherein the first and second sets of conductive traces and the first and second sets of interconnects comprise conductive material formed, etched, deposited, or printed onto or embedded into the flexible substrate.

Embodiment 71

The sensor assembly of embodiment 70, wherein the conductive material comprises a material selected from the group of materials consisting of copper, tin, silver, or gold.

Embodiment 72

The sensor assembly of any one of embodiments 69 to 71, wherein the rigid substrate has the shape of a rectangular block, a square block, or a cubic block.

Embodiment 73

The sensor assembly of any one of embodiments 69 to 71, wherein the opposed first and second surfaces of the rigid substrate are flat and the opposite edges of the rigid substrate are rounded.

Embodiment 74

The sensor assembly of any one of embodiments 69 to 73, wherein parts of the flexible substrate one which the first and second sets of interconnects are disposed extend around the opposite edges of the rigid substrate in contact with the opposite edges of the rigid substrate.

Embodiment 75

The sensor assembly of any one of embodiments 69 to 73, wherein parts of the flexible substrate one which the first and second sets of interconnects are disposed extend around the opposite edges of the rigid substrate in service loops that are not in contact with the opposite edges of the rigid substrate.

Embodiment 76

The sensor assembly of any one of embodiments 69 to 75, wherein the rigid substrate is made from glass or ceramic.

Embodiment 77

The sensor assembly of any one of embodiments 69 to 76, wherein the rigid substrate comprises two separate pieces bonded together.

Embodiment 78

The sensor assembly of any one of embodiments 69 to 77, wherein the flexible substrate is made from a dielectric material.

Embodiment 79

The sensor assembly of any one of embodiments 69 to 78, wherein the flexible substrate is a polymer-based material.

Embodiment 80

The sensor assembly of any one of embodiments 69 to 79, wherein the conductive traces of the first set of conductive traces are generally parallel to one another, the conductive traces of the second set of conductive traces are generally parallel to one another, and the first conductive traces are oriented transversely to the second conductive traces so that the sensing array comprises overlapping first and second conductive traces.

Embodiment 81

The sensor assembly of any one of embodiments 1 to 14, wherein the flexible substrate has a modulus of elasticity of between 0.2 and 20 GPa.

Embodiment 82

The assembly of any one of embodiments 36 to 68, wherein the cover panel is secured to the sensor assembly by an adhesive.

Embodiment 83

The assembly of embodiment 82, wherein the adhesive comprises one or more materials selected from the group consisting of: pressure sensitive adhesive, B-staged sheet adhesive, bond ply adhesive, acrylic-based thermoset adhesives, high modulus of elasticity/highly cross-linked, epoxy-type thermoset adhesives, adhesive with particle fillers to increase the modulus of elasticity of the adhesive, and adhesives with filler materials having high dielectric constants.

Embodiment 84

The assembly of embodiment 46, wherein the cover panel is disposed within the inner perimeter of the spacer frame.

Embodiment 85

A sensor assembly comprising: a rigid substrate having opposed first and second surfaces; a flexible substrate having opposed first and second surfaces; first conductive traces disposed on a first part of the flexible substrate, wherein the first conductive traces are generally parallel to one another and are formed on the first surface of the first part of the flexible substrate; second conductive traces disposed on the first part of the flexible substrate, wherein the second conductive traces are generally parallel to one another and are formed on the second surface of first part of the flexible substrate, and wherein the second conductive traces are oriented transversely to the first conductive traces; and a circuit element disposed on a second part of the flexible substrate, wherein the circuit element is disposed on the first surface of the second part of the flexible substrate, and wherein the first and second conductive traces are electrically connected to the circuit element; wherein the flexible substrate is wrapped around the rigid substrate with the second surface of the first and second parts of the flexible substrate facing the first and second surfaces, respectively, of the rigid substrate, and wherein the first part of the flexible substrate and the first and second conductive traces disposed thereon overlie the first surface of the rigid substrate, and the second part of the flexible substrate and the circuit element disposed thereon overlie the second surface of the rigid substrate.

Embodiment 86

The sensor assembly of embodiment 85, further comprising a conductive interconnect associated with each of the first and second conductive traces and connecting each of the first and second conductive traces to the circuit element.

Embodiment 87

The sensor assembly of embodiment 86, further comprising vias extending through the flexible substrate between the first and second surfaces thereof, wherein at least a portion of the conductive interconnects associated with the second conductive traces extend through the vias from the second surface of the flexible substrate to the first surface of the flexible substrate.

Embodiment 88

The sensor assembly of any one of embodiments 85 to 87, wherein the conductive traces and the conductive interconnects comprise conductive material formed, etched, deposited, or printed onto or embedded into the flexible substrate.

Embodiment 89

The sensor assembly of embodiment 88, wherein the conductive material comprises a material selected from the group of materials consisting of copper, tin, silver, or gold.

Embodiment 90

The sensor assembly of any one of embodiments 85 to 89, wherein the rigid substrate has the shape of a rectangular block, a square block, or a cubic block.

Embodiment 91

The sensor assembly of any one of embodiments 85 to 90, wherein the opposed first and second surfaces of the rigid substrate are flat, and wherein the rigid substrate further includes rounded first and second ends.

Embodiment 92

The sensor assembly of any one of embodiments 85 to 91, wherein the flexible substrate is configured to conform in size and shape to the rigid substrate when the flexible substrate is wrapped around the rigid substrate.

Embodiment 93

The sensor assembly of any one of embodiments 85 to 92, wherein the opposed first and second surfaces of the rigid substrate are flat and the first and second edges of the rigid substrate are rounded.

Embodiment 94

The sensor assembly of any one of embodiments 81 to 89, wherein the rigid substrate is made from glass or ceramic.

Embodiment 95

The sensor assembly of any one of embodiments 85 to 94, wherein the rigid substrate comprises two separate pieces bonded together.

Embodiment 96

The sensor assembly of any one of embodiments 85 to 95, wherein the flexible substrate is made from a dielectric material.

Embodiment 97

The sensor assembly of any one of embodiments 85 to 96, wherein the flexible substrate is a polymer-based material.

Embodiment 98

The sensor assembly of any one of embodiments 85 to 97, wherein the flexible substrate has a modulus of elasticity of between 2 and 9 GPa.

Embodiment 99

The sensor assembly of any one of embodiments 85 to 98, wherein the flexible substrate has a modulus of elasticity of between 0.2 and 20 GPa.

Embodiment 100

The sensor assembly of any one of embodiments 85 to 99, further comprising a host connector tab for connecting the sensor assembly to a host device.

Embodiment 101

The sensor assembly of embodiment 100, where the host connector tab comprises: a portion of the flexible substrate extending from the rigid substrate; conductive interconnects disposed on the extending portion of the flexible substrate; and a connector plug disposed on one side of the extending portion of the flexible substrate, wherein the conductive interconnects extend from the circuit element to the connector plug.

Embodiment 102

The sensor assembly of embodiment 101, further comprising a stiffener disposed on a surface of the extending portion of the flexible substrate opposite the connector plug.

Embodiment 103

The sensor assembly of any one of embodiments 85 to 102, wherein the flexible substrate is secured to the rigid substrate by an adhesive.

Embodiment 104

The sensor assembly of embodiment 103, wherein the adhesive comprises one or more materials selected from the group consisting of: pressure sensitive adhesive, B-staged sheet adhesive, bond ply adhesive, acrylic-based thermoset adhesives, high modulus of elasticity/highly cross-linked, epoxy-type thermoset adhesives, adhesive with particle fillers to increase the modulus of elasticity of the adhesive, and adhesives with filler materials having high dielectric constants.

Embodiment 105

A sensor assembly comprising: a rigid substrate having opposed first and second surfaces; a flexible substrate having opposed first and second surfaces; first conductive traces disposed on a first part of the flexible substrate, wherein the first conductive traces are generally parallel to one another and are formed on the first surface of the first part of the flexible substrate; second conductive traces disposed on the first part of the flexible substrate, wherein the second conductive traces are generally parallel to one another and are formed on the second surface of first part of the flexible substrate, and wherein the second conductive traces are oriented transversely to the first conductive traces; and a circuit element disposed on a second part of the flexible substrate, wherein the first and second conductive traces are electrically connected to the circuit element; wherein the flexible substrate is at least partially wrapped around the rigid substrate with the second surface of the first part of the flexible substrate facing the first surface of the rigid substrate, and wherein the first part of the flexible substrate and the first and second conductive traces disposed thereon overlie the first surface of the rigid substrate, and the second part of the flexible substrate with the circuit element disposed thereon extends from the rigid substrate.

Embodiment 106

The sensor assembly of embodiment 105, wherein a part of the flexible substrate between the first and second parts of the flexible substrate overlies an edge of the rigid substrate connecting the first and second surfaces of the rigid substrate.

Embodiment 107

The sensor assembly of embodiment 106, wherein the part of the flexible substrate between the first and second parts of the flexible substrate also overlies the second surface of the rigid substrate.

Embodiment 108

The sensor assembly of any one of embodiments 105 to 107, further comprising a stiffener attached to a surface of the flexible substrate opposite the surface of the flexible substrate on which the circuit element is disposed.

Embodiment 109

The assembly of embodiment 36, wherein the sensor assembly comprises the sensor assembly of any one of embodiments 1 to 35.

Embodiment 110

The assembly of embodiment 36, wherein the sensor assembly comprises the sensor assembly of any one of embodiments 85 to 108.

Embodiment 111

An electronic device comprising: a host device panel configured to provide interface and/or display functionality; a fingerprint sensor disposed within a recess or opening formed in the host device panel and comprising: rigid substrate having opposed first and second surfaces; and flexible circuit subassembly at least partially wrapped around the rigid substrate so as to overlie the first and second surfaces and comprising: a flexible substrate having opposed first and second surfaces; and first and second conductive traces formed on one or both of the first and second surfaces of the flexible substrate, wherein the first and second conductive traces are configured so that when the flexible circuit subassembly is wrapped around the rigid substrate, the first and second conductive traces are oriented transversely to each other and are separated from each other by a layer of the flexible substrate; and a cover panel disposed over the fingerprint sensor.

Embodiment 112

The electronic device of embodiment 111, wherein the fingerprint sensor comprises the sensor assembly of any one of embodiments 1 to 20 or 81.

Embodiment 113

The electronic device of embodiment 111, wherein the fingerprint sensor comprises the sensor assembly of any one of embodiments 21 to 35.

Embodiment 114

The electronic device of embodiment 111, wherein the host device panel and the fingerprint sensor comprises the assembly of any one of embodiments 36 to 68, 82, 83, 84, 109 or 110.

Embodiment 115

The electronic device of embodiment 111, wherein the fingerprint sensor comprises the sensor assembly of any one of embodiments 69 to 80.

Embodiment 116

The electronic device of embodiment 111, wherein the finger print sensor comprises a sensor assembly according to any one of embodiments 85 to 108.

Embodiment 117

The electronic device of any one of embodiments 111 to 116, wherein the electronic device comprises a mobile phone, a smart phone, a desktop computer, a laptop/notebook computer, a tablet computer, or a thin client device.

Embodiment 118

The sensor assembly of any one of embodiments 85 to 104, wherein the first part of the flexible substrate and the first and second conductive traces disposed thereon overlying the first surface of the rigid substrate form a sensor surface, and wherein the sensor surface has a flatness of 5 µm or less.

Embodiment 119

The sensor assembly of any one of embodiments 86 to 88, wherein a part of the flexible substrate on which at least a portion of the interconnects is disposed extends around an edge of the rigid substrate between the first and second surfaces in a service loop that is not in contact with the edge.

While certain exemplary embodiments have been described and shown in the accompanying drawings, it is to be understood that such embodiments are merely illustrative of and not restrictive on the disclosure, and that the invention disclosed herein is not limited to the specific constructions and arrangements shown and described, since various other modifications may occur to those ordinarily skilled in the art. Accordingly, the specification and drawings are to be regarded in an illustrative rather than a restrictive sense, and alternative arrangements and/or configurations can occur without departing from the spirit and scope of the disclosure. Similarly, components not explicitly mentioned in this specification can be included in various embodiments of this disclosure without departing from the spirit and scope of the disclosure. Accordingly, the specification and drawings are to be regarded in an illustrative rather than a restrictive sense.

The invention claimed is:

1. An assembly comprising:
a host device panel having a cutout formed therein; and
a sensor assembly comprising:
 a rigid substrate;
 a flexible substrate disposed on a first surface of the rigid substrate and defining a sensor surface; and
 electrically conductive traces comprising first conductive traces disposed on a first part of the flexible substrate and second conductive traces disposed on a second part of the flexible substrate, wherein the first conductive traces and the first part of the flexible substrate overlie the first surface of the rigid substrate, and the second conductive traces and the second part of the flexible substrate overlie the first conductive traces and the first surface of the rigid substrate,
wherein the rigid substrate is disposed within the cutout formed in the host device panel, and wherein a portion of the flexible substrate extends from an edge of the cutout and includes one or more circuit elements and a connector connecting the flexible circuit assembly to the host device.

2. The assembly of claim 1, wherein the cutout is formed partially through the host device panel or completely through the host device panel.

3. The assembly of claim 1, further comprising a cover panel disposed over the cutout and the rigid substrate.

4. The assembly of claim 3, wherein a top surface of the cover panel is flush with a top surface of the host device panel, is recessed with respect to a top surface of the host device panel, or protrudes above a top surface of the host device panel.

5. The assembly of claim 3, further comprising a recessed shelf formed in the host device panel around the perimeter of the cutout, wherein the cover panel is seated in the shelf, the shape of the shelf corresponds to the shape of the cover panel, and the depth of the shelf corresponds to the thickness of the cover panel.

6. The assembly of claim 1, further comprising a spacer frame surrounding the rigid substrate and disposed within the cutout between the perimeter of the cutout and the perimeter of the rigid substrate.

7. The assembly of claim 6, further comprising a cover panel disposed over the cutout and the rigid substrate, wherein the cover panel is seated in a recessed shelf formed in the spacer frame around the inner perimeter thereof.

8. The assembly of claim 6, further comprising a cover panel disposed over the cutout and the rigid substrate, wherein the cover panel is disposed on top of the spacer frame.

9. The assembly of claim 6, further comprising a cover panel disposed over the cutout and the rigid substrate, wherein the cover panel is disposed within the inner perimeter of the spacer frame.

10. The assembly of claim 1, wherein the one or more circuit elements disposed on the portion of the flexible substrate extending from an edge of the cutout comprises an integrated circuit for controlling the sensor assembly.

11. The assembly of claim 1, further comprising a stiffener disposed on part of the portion of the flexible substrate extending from an edge of the cutout, the stiffener being disposed on a side of the flexible substrate opposite the side on which the one or more circuit elements are disposed.

12. The assembly of claim 1, further comprising an encapsulant encapsulating the one or more circuit elements disposed on the portion of the flexible substrate extending from an edge of the cutout.

13. The assembly of claim 1, wherein the cutout is formed completely through the host device panel and the assembly further comprises a spacer frame surrounding the rigid substrate and disposed within the cutout between the perimeter of the cutout and the perimeter of the rigid substrate, wherein the spacer frame comprises a lower peripheral shelf extending laterally outwardly from a lower side of the spacer frame, wherein the lower peripheral shelf abuts a lower surface of the host device panel.

14. The assembly of claim 1, wherein the rigid substrate is made from glass or ceramic.

15. The assembly of claim 10, wherein the sensor assembly further comprises electrically conductive interconnects connecting the conductive traces to the integrated circuit.

16. The assembly of claim 15, wherein the conductive traces and the conductive interconnects comprise conductive material formed, etched, deposited, or printed onto or embedded into the flexible substrate.

17. The assembly of claim 1, wherein the flexible substrate is made from a dielectric material.

18. The assembly of claim 1, wherein the first conductive traces are generally parallel to one another and the second conductive traces are generally parallel to one another, and wherein the first conductive traces are oriented transversely to the second conductive traces.

19. The assembly of claim 1, wherein the host device panel comprises a display screen or interface screen of the host device.

20. The assembly of claim 1, wherein the host device panel comprises an outer surface of the host device.

* * * * *